US012772476B2

(12) United States Patent
Yoo et al.

(10) Patent No.: US 12,772,476 B2
(45) Date of Patent: Oct. 20, 2026

(54) METHOD OF MANUFACTURING INTEGRATED CIRCUIT DEVICE

(71) Applicant: Samsung Electronics Co., Ltd., Suwon-si (KR)

(72) Inventors: Jiho Yoo, Suwon-si (KR); Kihyung Ko, Suwon-si (KR); Jihoon Cha, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 444 days.

(21) Appl. No.: 18/497,446

(22) Filed: Oct. 30, 2023

(65) Prior Publication Data

US 2024/0322004 A1 Sep. 26, 2024

(30) Foreign Application Priority Data

Mar. 24, 2023 (KR) ........................ 10-2023-0039217
May 17, 2023 (KR) ........................ 10-2023-0063804

(51) Int. Cl.

| | |
|---|---|
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |

(52) U.S. Cl.

CPC ........... *H10D 30/014* (2025.01); *H10D 30/43* (2025.01); *H10D 30/6729* (2025.01); *H10D 30/6735* (2025.01); *H10D 62/121* (2025.01); *H10D 64/01* (2025.01); *H10D 64/017* (2025.01)

(58) Field of Classification Search

CPC .... H10D 30/014; H10D 30/43; H10D 30/435; H10D 30/6735; H10D 30/6757

See application file for complete search history.

(56) References Cited

U.S. PATENT DOCUMENTS

| | | | | |
|---|---|---|---|---|
| 10,103,238 | B1 | 10/2018 | Zang et al. | |
| 10,263,100 | B1 * | 4/2019 | Bi | H10D 30/024 |
| 10,515,859 | B2 | 12/2019 | Doris et al. | |
| 10,741,639 | B2 | 8/2020 | Loubet et al. | |
| 11,062,937 | B2 | 7/2021 | Cheng et al. | |
| 11,222,979 | B2 | 1/2022 | Miao et al. | |

(Continued)

*Primary Examiner* — Eric A. Ward

(74) *Attorney, Agent, or Firm* — Harness, Dickey & Pierce, P.L.C.

(57) ABSTRACT

A method of manufacturing an integrated circuit device includes forming, on a substrate, a fin-type active region and a stack structure in which sacrificial semiconductor layers and nanosheet semiconductor layers are alternately stacked one-by-one, forming a first local liner on a sidewall of the stack structure to cover a sidewall of a bottom sacrificial semiconductor layer, which is closest to the fin-type active region and expose sidewalls of other sacrificial semiconductor layers, forming a second local liner on the sidewall of the stack structure to cover the sidewalls of the other sacrificial semiconductor layers except for the bottom sacrificial semiconductor layer, exposing the bottom sacrificial semiconductor layer by removing the first local liner, forming a bottom insulating space exposing a fin top surface of the fin-type active region by removing the bottom sacrificial semiconductor layer, and forming a bottom insulating structure in the bottom insulating space.

20 Claims, 48 Drawing Sheets

(56) References Cited

U.S. PATENT DOCUMENTS

| | | | | |
|---|---|---|---|---|
| 11,387,319 | B2 | 7/2022 | Xie et al. | |
| 2021/0074809 | A1* | 3/2021 | Xie | H10D 62/118 |
| 2021/0305420 | A1* | 9/2021 | Frougier | H10D 30/43 |
| 2022/0181259 | A1 | 6/2022 | Chiang et al. | |
| 2023/0197831 | A1* | 6/2023 | Chan | H10D 62/121<br>438/284 |

* cited by examiner

METHOD OF MANUFACTURING INTEGRATED CIRCUIT DEVICE

CROSS-REFERENCE TO RELATED APPLICATION

This application is based on and claims priority under 35 U.S.C. § 119 to Korean Patent Application No. 10-2023-0039217, filed on Mar. 24, 2023, and Korean Patent Application No. 10-2023-0063804, filed on May 17, 2023, in the Korean Intellectual Property Office, the disclosures of which are incorporated by reference herein in their entirety.

BACKGROUND

The inventive concepts relate to methods of manufacturing an integrated circuit device, and more particularly, to methods of manufacturing an integrated circuit device including a horizontal nanosheet field-effect transistor.

Along with the decreasing sizes of integrated circuit devices, there is a need to increase the degrees of integration of field-effect transistors on substrates. Thus, horizontal nanosheet field-effect transistors (hNSFETs) including a plurality of horizontal nanosheets, which are stacked on the same layout regions, have been developed. However, as the integration of semiconductor devices increases and the sizes thereof decreases, electrical characteristics of nanosheet field-effect transistors may deteriorate due to unintended leakage current in nanosheet field-effect transistors. Therefore, there is a need to develop a novel structure capable of suppressing leakage current in nanosheet field-effect transistors and improving electrical characteristics thereof.

SUMMARY

Some example embodiments of the inventive concepts provide methods of manufacturing an integrated circuit device, which has a structure capable of suppressing the generation of unintended leakage current therein and improving the electrical characteristics thereof.

According to an aspect of the inventive concepts, a method of manufacturing an integrated circuit device may include forming a fin-type active region on a substrate and forming, on the fin-type active region, a stack structure in which a plurality of sacrificial semiconductor layers and a plurality of nanosheet semiconductor layers are alternately stacked one-by-one, forming a first local liner on a sidewall of the stack structure to cover a sidewall of a bottom sacrificial semiconductor layer, the bottom sacrificial semiconductor layer being a sacrificial semiconductor layer closest to the fin-type active region, from among the plurality of sacrificial semiconductor layers and expose sidewalls of other sacrificial semiconductor layers, the other sacrificial semiconductor layers being sacrificial semiconductor layers except for the bottom sacrificial semiconductor layer from among the plurality of sacrificial semiconductor layers, forming a second local liner on the sidewall of the stack structure to cover the sidewalls of the other sacrificial semiconductor layers, exposing the bottom sacrificial semiconductor layer by removing the first local liner, forming a bottom insulating space to expose a fin top surface of the fin-type active region by removing the bottom sacrificial semiconductor layer, and forming a bottom insulating structure to fill the bottom insulating space.

According to another aspect of the inventive concepts, a method of manufacturing an integrated circuit device may include forming a frontside structure comprising a substrate, a fin-type active region protruding from the substrate, a nanosheet stack including a plurality of nanosheets that are arranged over a fin top surface of the fin-type active region and apart from each other in a vertical direction, a bottom insulating structure between the fin top surface of the fin-type active region and the nanosheet stack, a source/drain region arranged on the fin-type active region and contacting the plurality of nanosheets and the bottom insulating structure, and a gate line surrounding the plurality of nanosheets, removing the substrate from a backside surface of the substrate, exposing the bottom insulating structure by removing the fin-type active region by using the bottom insulating structure as an etch stop film, and forming a backside structure on the bottom insulating structure, wherein the forming of the frontside structure includes forming, on the fin-type active region, a stack structure in which a plurality of sacrificial semiconductor layers and a plurality of nanosheet semiconductor layers are alternately stacked one-by-one, forming a first local liner on a sidewall of the stack structure to cover a sidewall of a bottom sacrificial semiconductor layer, which is closest to the fin-type active region, from among the plurality of sacrificial semiconductor layers, forming a second local liner on the sidewall of the stack structure to cover sidewalls of other sacrificial semiconductor layers except for the bottom sacrificial semiconductor layer from among the plurality of sacrificial semiconductor layers, exposing the bottom sacrificial semiconductor layer by removing the first local liner, and replacing the bottom sacrificial semiconductor layer with the bottom insulating structure.

According to another aspect of the inventive concepts, a method of manufacturing an integrated circuit device may include alternately stacking a plurality of sacrificial semiconductor layers and a plurality of nanosheet semiconductor layers one-by-one on a substrate, each of the plurality of sacrificial semiconductor layers including a SiGe layer having a same Ge content, and each of the plurality of nanosheet semiconductor layers including a Si layer, forming a stack structure and a fin-type active region, which has a fin top surface covered by the stack structure, by partially etching each of the plurality of sacrificial semiconductor layers, the plurality of nanosheet semiconductor layers, and the substrate, the stack structure including a portion of each of the plurality of sacrificial semiconductor layers and the plurality of nanosheet semiconductor layers, forming a device isolation film to cover sidewalls of the fin-type active region, forming a first local liner on a sidewall of the stack structure to cover a sidewall of a bottom sacrificial semiconductor layer, the bottom sacrificial semiconductor layer being a sacrificial semiconductor layer closest to the fin-type active region, from among the plurality of sacrificial semiconductor layers and expose sidewalls of the other sacrificial semiconductor layers, the other sacrificial semiconductor layers being sacrificial semiconductor layers except for the bottom sacrificial semiconductor layer, from among the plurality of sacrificial semiconductor layers, forming a second local liner on the sidewall of the stack structure to cover the sidewalls of the other sacrificial semiconductor layers, exposing the bottom sacrificial semiconductor layer by removing the first local liner, forming a bottom insulating space to expose the fin top surface of the fin-type active region by removing the bottom sacrificial semiconductor layer, and forming a bottom insulating structure to fill the bottom insulating space.

BRIEF DESCRIPTION OF THE DRAWINGS

Example embodiments will be more clearly understood from the following detailed description taken in conjunction with the accompanying drawings in which:

FIGS. 6A to 22B are diagrams respectively illustrating a sequence of processes of a method of manufacturing an integrated circuit device, according to an example embodiment, and in particular, FIGS. 6A, 7A, 8A, 14A, 15A, 16A, 20A, 21A, and 22A are cross-sectional views each illustrating an example of a cross-sectional structure of a portion of the integrated circuit device, which corresponds to the cross-section taken along the line X1-X1' of FIG. 2, according to the sequence of processes, FIGS. 6B, 7B, 8B, 9 to 13, 14B, 15B, 16B, 17 to 19, 20B. 21B, and 22B are cross-sectional views each illustrating an example of a cross-sectional structure of a portion of the integrated circuit device, which corresponds to the cross-section taken along the line Y1-Y1' of FIG. 2, according to the sequence of processes, FIGS. 23 to 31 are diagrams respectively illustrating a sequence of processes of a method of manufacturing an integrated circuit device, according to an example embodiment, and in particular, FIGS. 23 to 25, 26A, 27, 28A, 29A, 30, and 31 are cross-sectional views each illustrating an example of a cross-sectional structure of a portion of the integrated circuit device, which corresponds to the cross-section taken along the line X1-X1' of FIG. 4, according to the sequence of processes.

DETAILED DESCRIPTION

Figure 1:
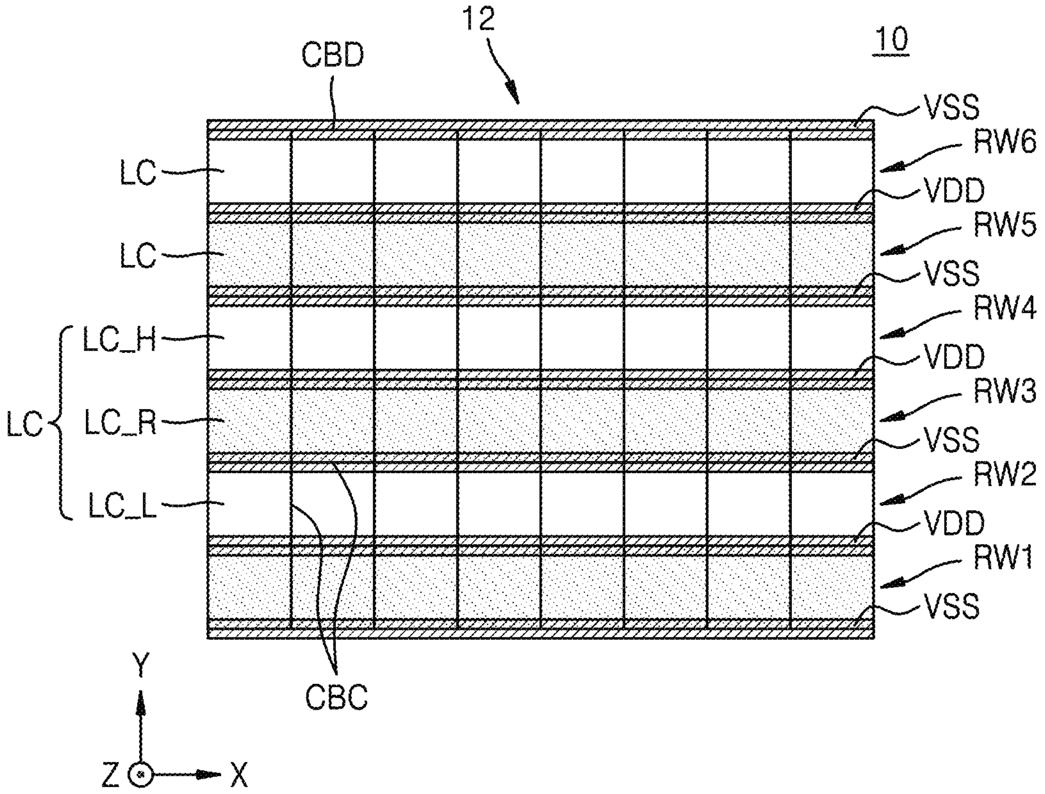
FIG. 1 is a schematic plan view of an example of a cell block of an integrated circuit device according to an example embodiment.

Hereinafter, some example embodiments of the inventive concepts will be described in detail with reference to the accompanying drawings. Like components are denoted by like reference numerals throughout the specification, and repeated descriptions thereof are omitted.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially." it will be understood that these values and shapes should be construed as including a manufacturing or operational tolerance (e.g., ±10%) around the stated numerical values or shapes.

FIG. 1 is a schematic plan view of an example of a cell block 12 of an integrated circuit device 10 according to an example embodiment.

Referring to FIG. 1, the cell block 12 of the integrated circuit device 10 may include a plurality of cells LC including circuit patterns for constituting various circuits. The plurality of cells LC may be arranged in a matrix in the width direction (X direction in FIG. 1) and the height direction (Y direction in FIG. 1) in the cell block 12.

The plurality of cells LC may include a circuit pattern having a layout designed by a Place and Route (PnR) technique to perform at least one logical function. The plurality of cells LC may perform various logical functions. In some example embodiments, the plurality of cells LC may include a plurality of standard cells. In some example embodiments, at least some of the plurality of cells LC may perform the same logical function. In some example embodiments, at least some of the plurality of cells LC may perform different logical functions from each other.

The plurality of cells LC may include various types of logic cells including a plurality of circuit elements. For example, each of the plurality of cells LC may include, but is not limited to, an AND, a NAND, an OR, NOR, an exclusive OR (XOR), an exclusive NOR (XNOR), an inverter (INV), an adder (ADD), a buffer (BUF), a delay (DLY), a filter (FIL), a multiplexer (MXT/MXIT), an OR/AND/INVERTER (OAI), an AND/OR (AO), an AND/OR/INVERTER (AOI), a D flip-flop, a reset flip-flop, a master-slave flip-flop, a latch, and/or a combination thereof.

In the cell block 12, at least some of the plurality of cells LC constituting one row (that is, RW1, RW2, RW3, RW4, RW5, or RW6) in the width direction (X direction in FIG. 1) may have the same width. In addition, at least some of the plurality of cells LC constituting one row (that is, RW1, RW2, RW3, RW4, RW5, or RW6) may have the same height in the height direction (Y direction in FIG. 1). However, the inventive concepts are not limited to the example shown in FIG. 1, and at least some of the plurality of cells LC constituting one row (that is, RW1, RW2, RW3, RW4, RW5, or RW6) may have different widths and/or heights from each other.

The area of each of the plurality of cells LC in the cell block 12 of the integrated circuit device 10 may be defined by a cell boundary CBD. A cell interface portion CBC, at which respective cell boundaries CBD meet each other, may be arranged between two adjacent cells LC in the width direction (X direction in FIG. 1) or the height direction (Y direction in FIG. 1) from among the plurality of cells LC.

In some example embodiments, two adjacent cells LC in the width direction from among the plurality of cells LC constituting one row (that is, RW1, RW2, RW3, RW4, RW5, or RW6) may be in contact with each other at the cell interface portion CBC without a separation distance therebetween. In some example embodiments, two adjacent cells LC in the width direction from among the plurality of cells LC constituting one row (that is, RW1, RW2, RW3, RW4, RW5, or RW6) may be apart from each other with a certain separation distance therebetween.

In some example embodiments, in the plurality of cells LC constituting one row (that is, RW1, RW2, RW3, RW4, RW5, or RW6), two adjacent cells LC may perform the same function. In this case, the two adjacent cells LC may have the same structure. In some example embodiments, in the plurality of cells LC constituting one row (that is, RW1, RW2, RW3, RW4, RW5, or RW6), two adjacent cells LC may perform different functions from each other.

In some example embodiments, one cell LC selected from the plurality of cells LC, which are included in the cell block 12 of the integrated circuit device 10, and another cell LC adjacent to the selected cell LC in the height direction (Y direction in FIG. 1) may have symmetric structures to each other about the cell interface portion CBC therebetween. For example, a reference logic cell LC_R in the third row RW3 and a lower logic cell LC_L in the second row RW2 may have symmetric structures to each other about the cell interface portion CBC therebetween. In addition, the reference logic cell LC_R in the third row RW3 and an upper logic cell LC_H in the fourth row RW4 may have symmetric structures to each other about the cell interface portion CBC therebetween.

Although FIG. 1 illustrates the cell block 12 including six rows (that is, RW1, RW2, RW3, RW4, RW5, and RW6), this is only an example, and the cell block 12 may include rows in various numbers selected as needed, and one row may include logic cells in various numbers selected as needed.

One selected from among a plurality of ground lines VSS and a plurality of power lines VDD may be arranged between a plurality of rows (that is, RW1, RW2, RW3, RW4, RW5, and RW6), each of which includes the plurality of cells LC arranged in a line in the width direction (X direction in FIG. 1). The plurality of ground lines VSS and the plurality of power lines VDD may each extend in a first horizontal direction (X direction) and may be alternately arranged apart from each other in a second horizontal direction (Y direction). Therefore, each of the plurality of ground lines VSS and the plurality of power lines VDD may be arranged to overlap the cell boundary CBD of a cell LC that extends in the first horizontal direction (X direction).

Figure 2:
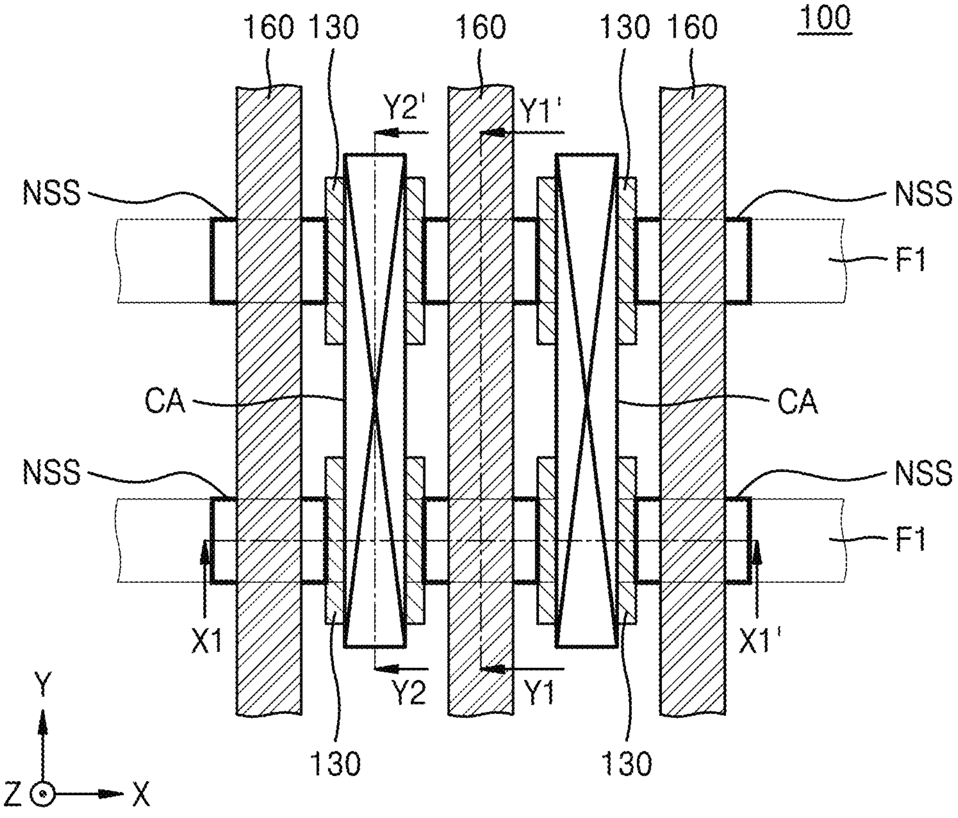
FIG. 2 is a planar layout diagram illustrating an integrated circuit device according to an example embodiment.
Figure 3A:
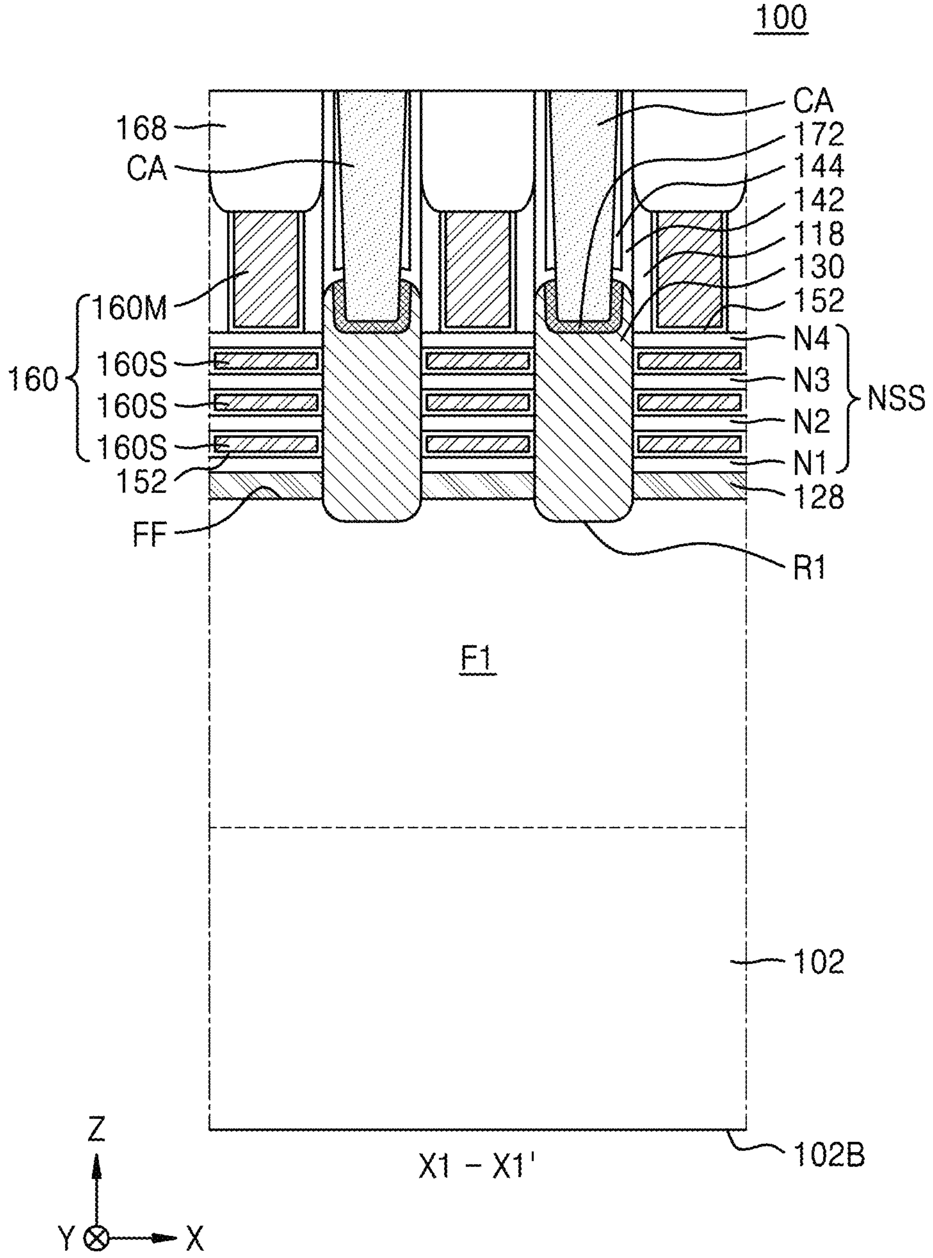
FIG. 3A is a cross-sectional view of the integrated circuit device of FIG. 2, taken along line X1-X1' of FIG. 2.
Figure 3B:
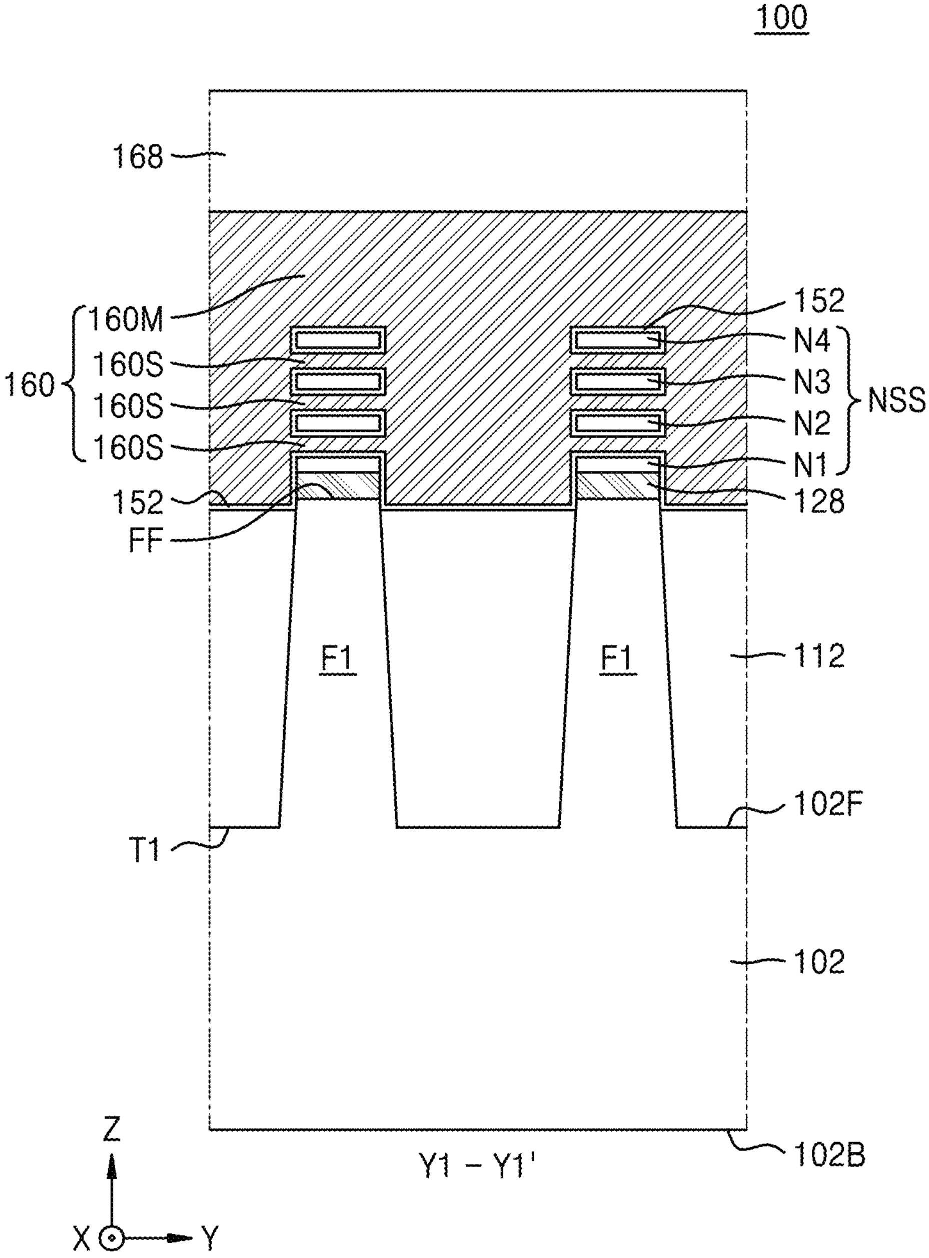
FIG. 3B is a cross-sectional view of the integrated circuit device of FIG. 2, taken along line Y1-Y1' of FIG. 2.
Figure 3C:
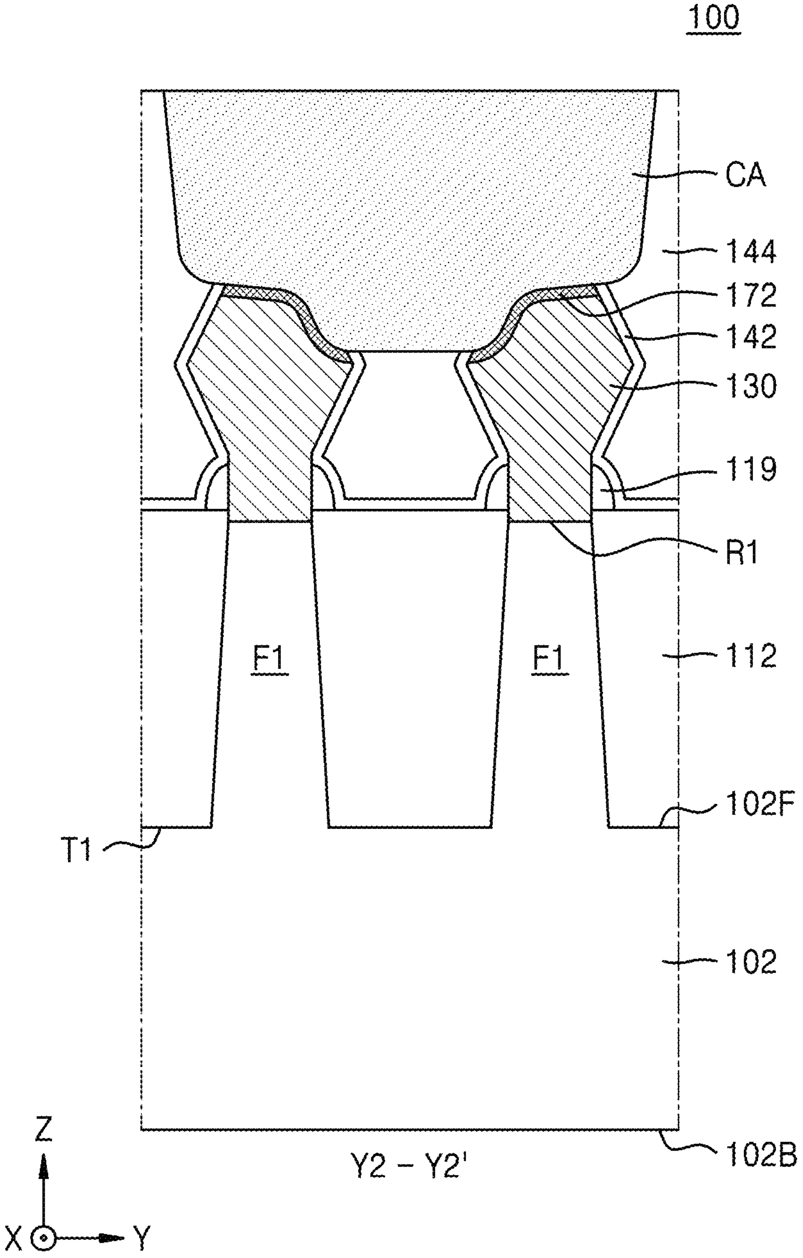
FIG. 3C is a cross-sectional view of the integrated circuit device of FIG. 2, taken along line Y2-Y2' of FIG. 2.

FIG. 2 is a planar layout diagram illustrating an integrated circuit device 100 according to an example embodiment. FIG. 3A is a cross-sectional view of the integrated circuit device 100, taken along the line X1-X1' of FIG. 2. FIG. 3B is a cross-sectional view of the integrated circuit device 100, taken along the line Y1-Y1' of FIG. 2. FIG. 3C is a cross-sectional view of the integrated circuit device 100, taken along the line Y2-Y2' of FIG. 2. The integrated circuit device 100 including a field-effect transistor, which has a gate-all-around (GAA) structure including a nanowire or nanosheet-shaped active region and a gate surrounding the active region, is described with reference to FIGS. 2 and 3A to 3C. Components of the integrated circuit device 100, which are shown in FIGS. 2 and 3A to 3C, may constitute a portion of the plurality of cells LC shown in FIG. 1.

Referring to FIGS. 2 and 3A to 3C, the integrated circuit device 100 may include a substrate 102 having a frontside surface 102F and a backside surface 102B, which are opposite to each other. The substrate 102 and a plurality of fin-type active regions F1 may each include a semiconductor (e.g., Si or Ge) or a compound semiconductor (e.g., SiGe, SiC. GaAs, InAs, InGaAs, or InP). The substrate 102 may include a conductive region, for example, an impurity-doped well or an impurity-doped structure.

The plurality of fin-type active regions F1 may protrude in the vertical direction (Z direction) from the frontside surface 102F of the substrate 102. The plurality of fin-type active regions F1 may be arranged on the frontside surface 102F of the substrate 102 to extend lengthwise in the first horizontal direction (X direction) and to be apart from each other in the second horizontal direction (Y direction) that is perpendicular to the first horizontal direction (X direction). A plurality of trench regions T1 may be defined on the frontside surface 102F of the substrate 102 by the plurality of fin-type active regions F1.

As shown in FIGS. 3B and 3C, a device isolation film 112 may be arranged between the plurality of fin-type active regions F1. The device isolation film 112 may fill the plurality of trench regions T1 and cover a sidewall of each of the plurality of fin-type active regions F1. The device isolation film 112 may include, but is not limited to, a silicon oxide film.

As shown in FIGS. 3A and 3B, a plurality of gate lines 160 may be arranged over the plurality of fin-type active regions F1 and the device isolation film 112. Each of the plurality of gate lines 160 may extend lengthwise in the second horizontal direction (Y direction) to intersect with the plurality of fin-type active regions F1. In intersection areas between the plurality of fin-type active regions F1 and the plurality of gate lines 160, a plurality of nanosheet stacks NSS may be arranged over a fin top surface FF of each of the plurality of fin-type active regions F1. Each of the plurality of nanosheet stacks NSS may include at least one nanosheet arranged apart from the fin top surface FF of a fin-type active region F1 in the vertical direction (Z direction) to face the fin top surface FF of the fin-type active region F1. As used herein, the term "nanosheet" refers to a conductive structure having a cross-section that is substantially perpendicular to a current-flowing direction. The nanosheet may also be understood as including a nanowire.

Each of the plurality of nanosheet stacks NSS may include a first nanosheet N1, a second nanosheet N2, a third nanosheet N3, and a fourth nanosheet N4, which overlap each other in the vertical direction (Z direction), over the fin-type active region F1. The first to fourth nanosheets N1, N2, N3, and N4 may have different vertical distances (Z-direction distances) from the fin top surface FF of the fin-type active region F1, respectively. Each of the first to fourth nanosheets N1, N2, N3, and N4, which are included in a nanosheet stack NSS, may function as a channel region. In some example embodiments, each of the first to fourth nanosheets N1, N2, N3, and N4 of the nanosheet stack NSS may include a Si layer, a SiGe layer, or a combination thereof.

The present example illustrates a configuration in which the plurality of nanosheet stacks NSS and the plurality of gate lines 160 are formed over one fin-type active region F1 and the plurality of nanosheet stacks NSS are arranged in a line in the first horizontal direction (X direction) over one fin-type active region F1. However, according to the inventive concepts, the number of nanosheet stacks NSS arranged over one fin-type active region F1 is not particularly limited. For example, one nanosheet stack NSS may be formed over one fin-type active region F1. Although the present example illustrates that each of the plurality of nanosheet stacks NSS includes four nanosheets, that is, the first to fourth nanosheets N1, N2, N3, and N4, the inventive concepts are not limited thereto. For example, each of the plurality of nanosheet stacks NSS may include at least two nanosheets, and the number of nanosheets constituting each nanosheet stack NSS is not particularly limited.

Each of the first to fourth nanosheets N1, N2, N3, and N4 may have a channel region. In the second to fourth nanosheets N2, N3, and N4 except for the first nanosheet N1 from among the first to fourth nanosheets N1, N2, N3, and N4, a channel may be formed in the vicinity of an upper surface and a lower surface of each thereof. Although a channel may be formed in the vicinity of the upper surface of the first nanosheet N1, a channel is not formed in the vicinity of the lower surface of the first nanosheet N1, which faces the fin-type active region F1.

In some example embodiments, each of the first to fourth nanosheets N1, N2, N3, and N4 may have a vertical-direction thickness selected from a range of about 4 nm to about 6 nm. In some example embodiments, the first to fourth nanosheets N1, N2, N3, and N4 may have substantially the same thickness. The first to fourth nanosheets N1, N2, N3, and N4 may include the same material. In some example embodiments, each of the first to fourth nanosheets N1, N2, N3, and N4 may include the same material as a constituent material of the substrate 102.

As shown in FIGS. 3A and 3B, the plurality of gate lines 160 may be arranged over the fin-type active region F1 to cover the plurality of nanosheet stacks NSS, respectively, and each surround at least portions of the first to fourth nanosheets N1, N2, N3, and N4. Each of the plurality of gate lines 160 may include a main gate portion 160M, which covers the upper surface of the nanosheet stack NSS and extends in the second horizontal direction (Y direction), and a plurality of sub-gate portions 160S, which are integrally connected to the main gate portion 160M and arranged in separation spaces between the first to fourth nanosheets N1, N2, N3, and N4, respectively. In the vertical direction (Z direction), the thickness of each of the plurality of sub-gate portions 160S may be less than the thickness of the main gate portion 160M. Each of the plurality of gate lines 160 does not extend to a space between the fin-type active region F1 and the first nanosheet N1. Thus, each of the plurality of gate lines 160 does not include a sub-gate portion between the fin-type active region F1 and the first nanosheet N1. Therefore, as shown in FIGS. 3A and 3B, the second to fourth nanosheets N2, N3, and N4 except for the first nanosheet N1 from among the first to fourth nanosheets N1, N2, N3, and N4 may each have a gate-all-around (GAA) structure in which each of the second to fourth nanosheets N2, N3, and N4 is completely surrounded by a gate line 160. On the other hand, the first nanosheet N1 may not have a GAA structure. In more detail, the lower surface of the first nanosheet N1, which faces the fin-type active region F1, may not be covered by the gate line 160 and only the upper surface thereof facing the second nanosheet N2 and both sidewalls thereof in the second horizontal direction (Y direction) may be covered by the gate line 160. Therefore, although a portion of the first nanosheet N1 in the vicinity of the upper surface thereof facing the second nanosheet N2 and portions of the first nanosheet N1 in the vicinity of both sidewalls thereof in the second horizontal direction (Y direction) may be used as a channel region, a portion of the first nanosheet N1 in the vicinity of the lower surface thereof facing the fin-type active region F1 may not be used as a channel region.

The space between the first nanosheet N1 and the fin-type active region F1 may be filled with a bottom insulating structure 128. Therefore, the first nanosheet N1 may constitute a fully depleted device.

The bottom insulating structure 128 may include silicon oxide, SiOC, SiOCN, SiCN, SiBN, SiON, SiBCN, SiOF, SiOCH, or a combination thereof. The bottom insulating structure 128 may include a single film including one material film selected from the materials listed above or may include a multi-film including a plurality of material films selected from the materials listed above. As used herein, each of the terms "SiOC", "SiOCN", "SiCN", "SiBN", "SiON", "SiBCN", "SiOF", and "SiOCH" refers to a material including elements contained in each term and is not a chemical formula representing a stoichiometric relationship.

As shown in FIGS. 3A and 3B, a plurality of recesses R1 may be formed in the fin-type active region F1. A vertical level of the lowermost end of each of the plurality of recesses R1 may be lower than a vertical level of the fin top surface FF (e.g., a topmost level of the fin top surface FF) of the fin-type active region F1. As used herein, the term "vertical level" refers to a distance in the vertical direction (Z direction or −Z direction) from the frontside surface 102F of the substrate 102.

A plurality of source/drain regions 130 may be respectively arranged in the plurality of recesses R1. Each of the plurality of source/drain regions 130 may be arranged on the fin-type active region F1 and may be apart from the frontside surface 102F of the substrate 102 in the vertical direction (Z direction) with the fin-type active region F1 therebetween. Each of the plurality of source/drain regions 130 may be arranged adjacent to at least one gate line 160 selected from the plurality of gate lines 160. Each of the plurality of source/drain regions 130 may have surfaces contacting the first to fourth nanosheets N1, N2, N3, and N4, which are included in the nanosheet stack NSS adjacent thereto.

Each of the plurality of source/drain regions 130 may include an epitaxially grown semiconductor layer. In some example embodiments, each of the plurality of source/drain regions 130 may include an epitaxially grown Si layer, an epitaxially grown SiC layer, or a plurality of epitaxially grown SiGe layers. When a source/drain region 130 constitutes an NMOS transistor, the source/drain region 130 may include a Si layer doped with an n-type dopant or a SiC layer doped with an n-type dopant. The n-type dopant may be selected from phosphorus (P), arsenic (As), and antimony (Sb). When the source/drain region 130 constitutes a PMOS transistor, the source/drain region 130 may include a SiGe layer doped with a p-type dopant. The p-type dopant may be selected from boron (B) and gallium (Ga).

Each of the plurality of gate lines 160 may include metal, metal nitride, metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may include TiAlC. However, a material constituting each of the plurality of gate lines 160 is not limited to the examples set forth above.

A gate dielectric film 152 may be arranged between the nanosheet stack NSS and the gate line 160. The gate dielectric film 152 may include a stack structure of an interface dielectric film and a high-K film. The interface dielectric film may include a low-K material film having a dielectric constant of 9 or less, for example, a silicon oxide film, a silicon oxynitride film, or a combination thereof. In some example embodiments, the interface dielectric film may be omitted. The high-K film may include a material having a dielectric constant that is greater than that of a silicon oxide film. For example, the high-K film may have a dielectric constant of about 10 to about 25. The high-K film may include, but is not limited to, hafnium oxide.

Either sidewall of each of the plurality of sub-gate portions 160S, which are included in each of the plurality of gate lines 160, may be apart from the source/drain region 130 with the gate dielectric film 152 therebetween. The gate dielectric film 152 may be arranged between a sub-gate portion 160S of the gate line 160 and each of the first to fourth nanosheets N1, N2, N3, and N4 and between the sub-gate portion 160S of the gate line 160 and the source/drain region 130. The gate dielectric film 152 may include portions contacting the bottom insulating structure 128.

A plurality of nanosheet transistors may be formed in the intersection areas between the plurality of fin-type active regions F1 and the plurality of gate lines 160, respectively. Each of the plurality of nanosheet transistors may include an NMOS transistor, a PMOS transistor, or a combination thereof.

As shown in FIG. 3A, both sidewalls of the gate line 160 may be respectively covered by a plurality of insulating spacers 118. Each of the plurality of insulating spacers 118 may be arranged on the upper surface of the nanosheet stack NSS to cover a sidewall of the main gate portion 160M. Each of the plurality of insulating spacers 118 may be apart from the gate line 160 with the gate dielectric film 152 therebetween.

As shown in FIG. 3C, a plurality of recess-side insulating spacers 119 may be arranged on the device isolation film 112. At least a portion of each of the plurality of recess-side insulating spacers 119 may cover a sidewall of the source/drain region 130. In some example embodiments, each of the plurality of recess-side insulating spacers 119 may be integrally connected with an insulating spacer 118 adjacent thereto.

Each of the plurality of insulating spacers 118 and the plurality of recess-side insulating spacers 119 may include silicon nitride, silicon oxide, SiOC, SiOCN, SiCN, SiBN, SION, SiBCN, SiOF, SiOCH, or a combination thereof. Each of the plurality of insulating spacers 118 and the plurality of recess-side insulating spacers 119 may include a single film including one material film selected from the materials listed above or may include a multi-film including a plurality of material films selected from the materials listed above.

As shown in FIGS. 3A and 3B, the upper surface of each of the gate line 160, the gate dielectric film 152, and the insulating spacer 118 may be covered by a capping insulating pattern 168. Each capping insulating pattern 168 may include a silicon nitride film.

The plurality of source/drain regions 130, the device isolation film 112, the plurality of insulating spacers 118, and the plurality of recess-side insulating spacers 119 may be covered by an insulating liner 142. An inter-gate dielectric 144 may be arranged on the insulating liner 142. The inter-gate dielectric 144 may be arranged between a pair of gate lines 160, which are adjacent to each other in the first horizontal direction (X direction), and between a pair of source/drain regions 130 adjacent to each other. In some example embodiments, the insulating liner 142 may include, but is not limited to, silicon nitride, SiCN, SiBN, SION, SiOCN, SiBCN, or a combination thereof. The inter-gate dielectric 144 may include, but is not limited to, a silicon oxide film.

As shown in FIGS. 3A and 3C, a plurality of source/drain contacts CA may be arranged over the frontside surface 102F of the substrate 102. Each of the plurality of source/drain contacts CA may be configured to be electrically connected to at least one source/drain region 130 selected from the plurality of source/drain regions 130. For example, as shown in FIG. 3C, one source/drain contact CA may be connected to two adjacent source/drain regions 130, but the inventive concepts are not limited thereto. As shown in FIG. 2, the source/drain contact CA may extend lengthwise in the second horizontal direction (Y direction) between a pair of gate lines 160 that are adjacent to each other in the first horizontal direction (X direction). As shown in FIG. 3A, the source/drain contact CA may be apart from the main gate portion 160M of the gate line 160, which is adjacent thereto, in the first horizontal direction (X direction) with the insulating spacer 118 therebetween. Each of the plurality of source/drain contacts CA may be apart from the frontside surface 102F of the substrate 102 in the vertical direction (Z direction) with the fin-type active region F1 and the source/drain region 130 therebetween.

A metal silicide film 172 may be arranged between the source/drain region 130 and the source/drain contact CA. The metal silicide film 172 may be in contact with the source/drain region 130. The source/drain contact CA may pass through the inter-gate dielectric 144 and the insulating liner 142 in the vertical direction (Z direction) to be in contact with the metal silicide film 172. The source/drain contact CA may be configured to be connected to the source/drain region 130 via the metal silicide film 172. The source/drain contact CA may pass through a portion of the source/drain region 130 in the vertical direction (Z direction). The insulating liner 142 and the inter-gate dielectric 144 may surround a sidewall of the source/drain contact CA.

In some example embodiments, the metal silicide film 172 may include Ti, W, Ru, Nb, Mo, Hf, Ni, Co, Pt, Yb, Tb, Dy, Er, or Pd. For example, the metal silicide film 172 may include titanium silicide. In some example embodiments, the source/drain contact CA may include only a metal plug including a single metal. In some example embodiments, the source/drain contact CA may include a metal plug and a conductive barrier film surrounding the metal plug. The metal plug may include, but is not limited to, molybdenum (Mo), tungsten (W), cobalt (Co), ruthenium (Ru), manganese (Mn), titanium (Ti), tantalum (Ta), aluminum (Al), copper (Cu), a combination thereof, or an alloy thereof. The conductive barrier film may include metal or conductive metal nitride. For example, the conductive barrier film may include, but is not limited to, Ti, Ta, W, TiN, TaN, WN, WCN, TiSiN, TaSiN, WSiN, or a combination thereof.

Upper insulating structures and upper wiring structures at least partially surrounded by the upper insulating structures may be arranged on the respective upper surfaces of the source/drain contact CA, the plurality of capping insulating patterns 168, and the inter-gate insulating film 144. The upper insulating structures and the upper wiring structures may include a frontside wiring structure (not shown). The frontside wiring structure may include a plurality of wiring layers, a plurality of via contacts, and an interlayer dielectric covering the plurality of wiring layers and the plurality of via contacts.

In the integrated circuit device 100 described with reference to FIGS. 2 and 3A to 3C, the space between the fin-type active region F1 and the first nanosheet N1, which is closest to the fin-type active region F1 from among the first to fourth nanosheets N1, N2, N3, and N4, is filled with the bottom insulating structure 128, and no sub-gate portion is arranged between the fin-type active region F1 and the first nanosheet N1. Therefore, an unintended channel may be suppressed from being formed in the vicinity of the fin top surface FF of the fin-type active region F1, which faces the lower surface of the first nanosheet N1, and there is no concern that an unintended parasitic transistor is formed in the vicinity of the fin top surface FF of the fin-type active region F1. Therefore, the deterioration of electrical characteristics, such as an increase in parasitic capacitance, an increase in leakage current, and/or an increase in subthreshold swing, which may result from a parasitic transistor, may be mitigated or prevented. Therefore, even when the integrated circuit device 100 has a device region having a reduced area due to down-scaling, reliability of the integrated circuit device 100 may improve.

Figure 4:
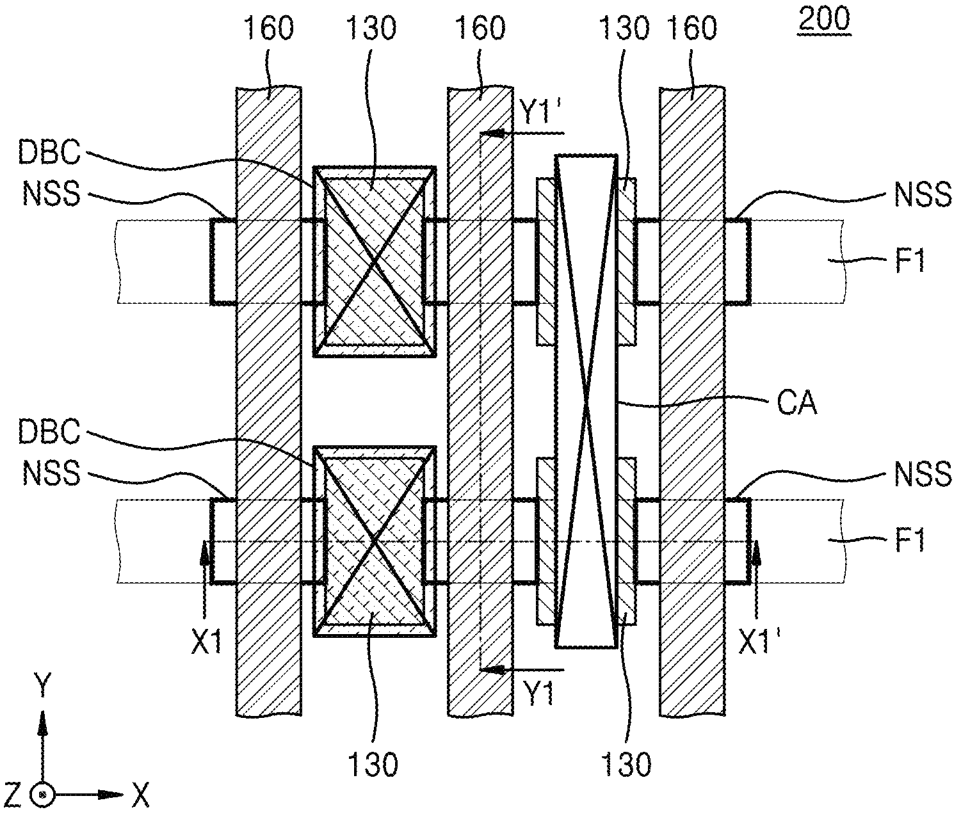
FIG. 4 is a planar layout diagram illustrating an integrated circuit device according to an example embodiment.
Figure 5A:
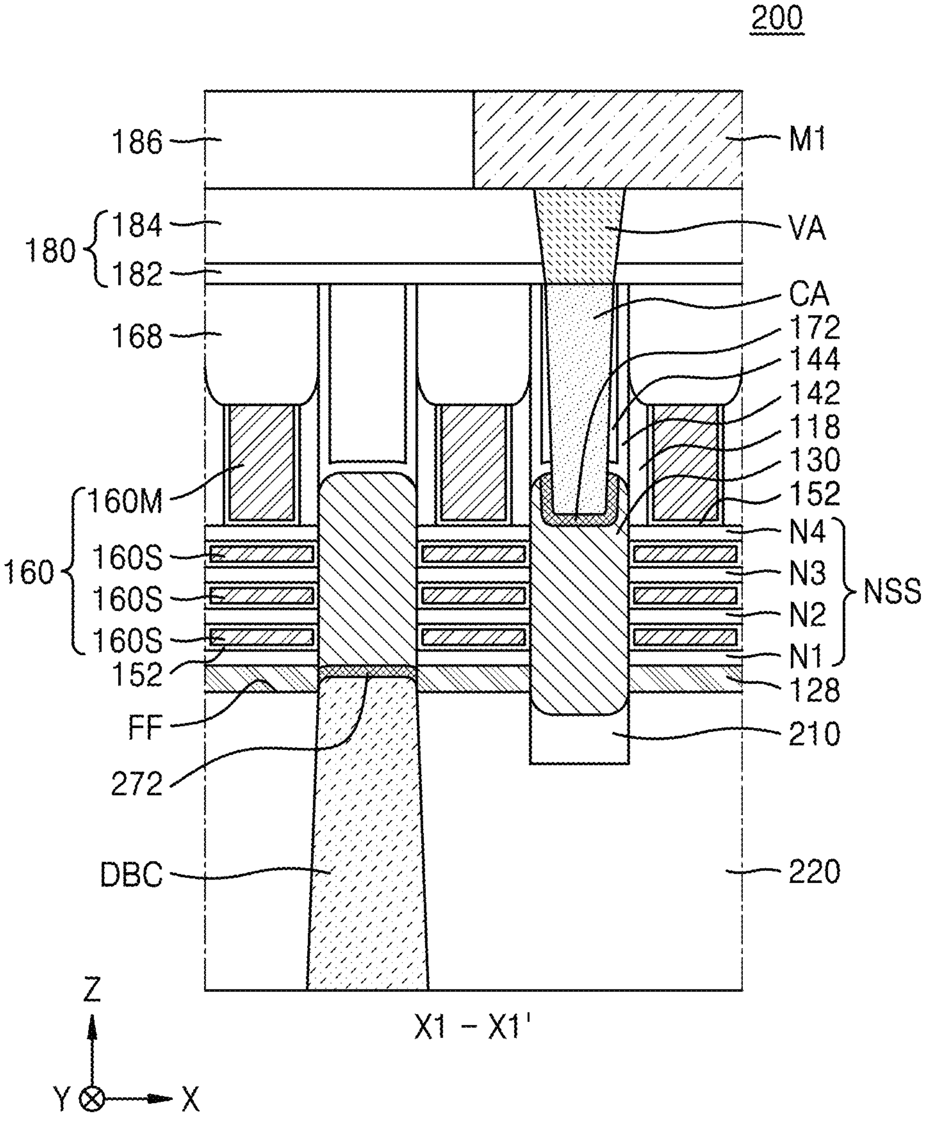
FIG. 5A is a cross-sectional view of the integrated circuit device of FIG. 4, taken along line X1-X1' of FIG. 4.
Figure 5B:
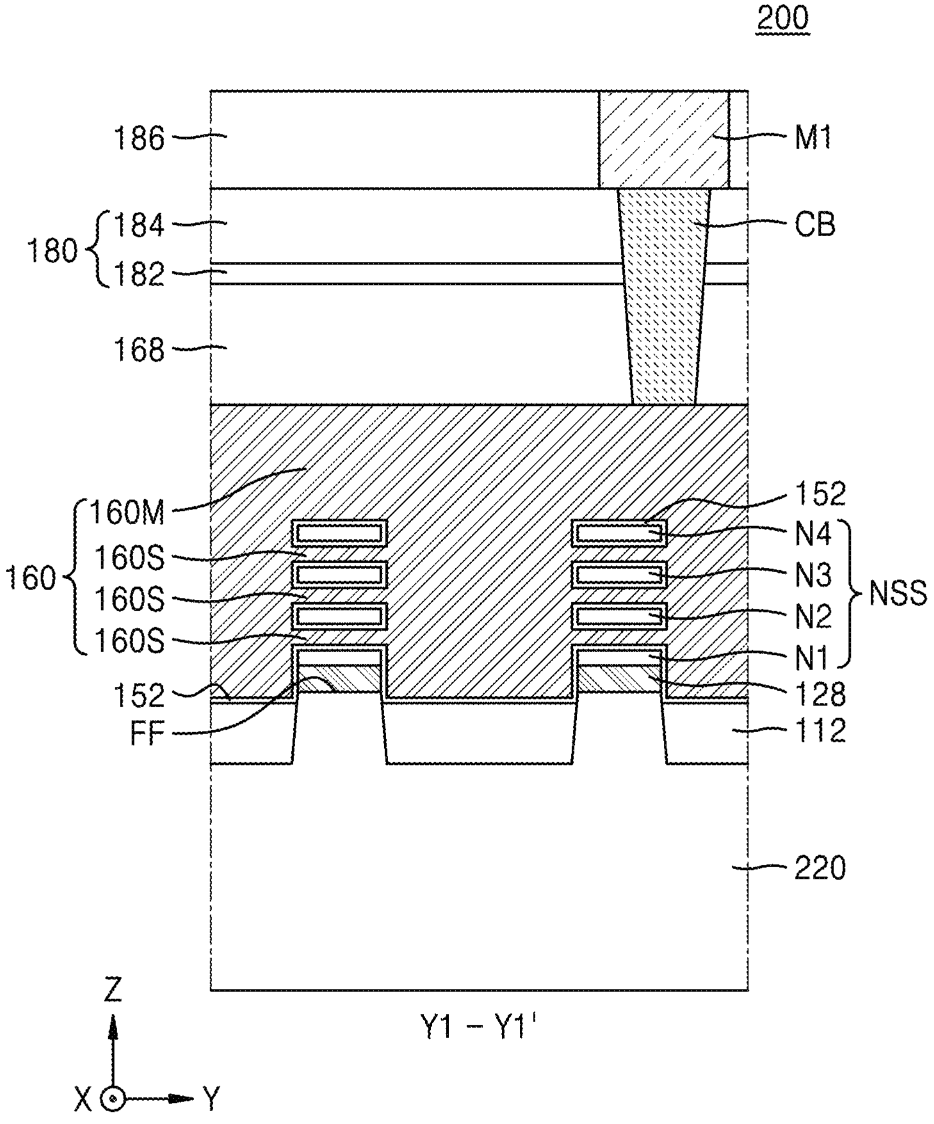
FIG. 5B is a cross-sectional view of the integrated circuit device of FIG. 4, taken along line Y1-Y1' of FIG. 4.

FIG. 4 is a planar layout diagram illustrating an integrated circuit device 200 according to an example embodiment. FIG. 5A is a cross-sectional view of the integrated circuit device 200, taken along the line X1-X1' of FIG. 4. FIG. 5B is a cross-sectional view of the integrated circuit device 200, taken along the line Y1-Y1' of FIG. 4. The integrated circuit device 200 including a field-effect transistor having a GAA structure, which includes a nanowire or nanosheet-shaped active region and a gate surrounding the active region, is described with reference to FIGS. 4, 5A, and 5B. Components of the integrated circuit device 200, which are shown in FIGS. 4, 5A, and 5B, may constitute a portion of the plurality of cells LC shown in FIG. 1. In FIGS. 4, 5A, and 5B, the same reference numerals as in FIGS. 2 and 3A to 3C denote the same members, respectively, and here, repeated descriptions thereof are omitted.

Referring to FIGS. 4, 5A, and 5B, a portion of the integrated circuit device 200 may have substantially the same configuration as the integrated circuit device 100 described with reference to FIGS. 2 and 3A to 3C. However, the integrated circuit device 200 does not include the substrate 102 and the fin-type active region F1.

As shown in FIGS. 5A and 5B, the integrated circuit device 200 may include a backside interlayer dielectric 220, which covers the lower surface of the bottom insulating structure 128. In some example embodiments, the backside interlayer dielectric 220 may include a silicon oxide film, a silicon nitride film, a silicon carbide film, a low-K film, or a combination thereof. The low-K film may include, but is not limited to, fluorine-doped silicon oxide, organosilicate glass, carbon-doped oxide, porous silicon oxide, porous organosilicate glass, a spin-on organic polymeric dielectric, a spin-on silicon-based polymeric dielectric, or a combination thereof.

Some source/drain regions 130 selected from the plurality of source/drain regions 130 may each be configured to be connected to a backside source/drain contact DBC, which passes through the backside interlayer dielectric 220 in the vertical direction (Z direction). A metal silicide film 272 may be arranged between the source/drain region 130 and the backside source/drain contact DBC. The metal silicide film 272 may be in contact with the source/drain region 130. The backside source/drain contact DBC may be in contact with the metal silicide film 272. The backside source/drain contact DBC may be configured to be connected to the source/drain region 130 via the metal silicide film 272. The backside interlayer dielectric 220 may surround a sidewall of the backside source/drain contact DBC. In some example embodiments, an end portion of the backside source/drain contact DBC, which is farthest from the source/drain region 130, may be configured to be connected to a backside power rail (not shown). Respective constituent materials of the backside source/drain contact DBC and the metal silicide film 272 are the same as those of the source/drain contact CA and the metal silicide film 172, which are described with reference to FIGS. 2, 3A, and 3C.

Some other source/drain regions 130 selected from the plurality of source/drain regions 130 may be covered by the backside interlayer dielectric 220. A stopper insulating layer 210 may be arranged between the other source/drain regions 130 and the backside interlayer dielectric 220. The stopper insulating layer 210 may include, but is not limited to, an aluminum oxide film.

As shown in FIG. 5B, the device isolation film 112 may be arranged between a portion of the gate line 160 and the backside interlayer dielectric 220. A detailed configuration of the device isolation film 112 is substantially the same as that of the device isolation film 112 of the integrated circuit device 100, which is described with reference to FIGS. 3B and 3C. However, in the integrated circuit device 200, the upper surface of the device isolation film 112 may be in contact with the gate dielectric film 152, and the lower surface and the sidewall of the device isolation film 112 may be in contact with the backside interlayer dielectric 220.

As shown in FIG. 5A, the lower surface of the source/drain region 130, which is connected to the source/drain contact CA, from among the plurality of source/drain regions 130 may be in contact with the stopper insulating layer 210. In some example embodiments, unlike the example shown in FIG. 5A, the lower surface of the source/drain region 130 connected to the source/drain contact CA may be configured to be in contact with the backside interlayer dielectric 220 or be connected to the backside source/drain contact DBC.

As shown in FIG. 5A, the respective upper surfaces of the source/drain contact CA, the plurality of capping insulating patterns 168, and the inter-gate insulating film 144 may be covered by an upper insulating structure 180. The upper insulating structure 180 may include an etch stop film 182 and an upper insulating film 184, which are stacked in the stated order on each of the source/drain contact CA, the plurality of capping insulating patterns 168, and the inter-gate dielectric 144. The etch stop film 182 may include silicon carbide (SiC), SiN, SiCN, SiOC, AlN, AlON, AlO, AlOC, or a combination thereof. The upper insulating film 184 may include an oxide film, a nitride film, an ultra-low-K (ULK) film having an ultra-low dielectric constant (that is, K) of about 2.2 to about 2.4, or a combination thereof. For example, the upper insulating film 184 may include, but is not limited to, a tetraethylorthosilicate (TEOS) film, a high density plasma (HDP) oxide film, a boro-phospho-silicate glass (BPSG) film, a flowable chemical vapor deposition (FCVD) oxide film, a SiON film, a SiN film, a SiOC film, a SiCOH film, or a combination thereof.

A source/drain via contact VA may be arranged on the source/drain contact CA. A plurality of source/drain via contacts VA may each pass through the upper insulating structure 180 to contact the source/drain contact CA. The source/drain region 130 connected to the source/drain contact CA, from among the plurality of source/drain regions 130, may be configured to be electrically connected to the source/drain via contact VA via the metal silicide film 172 and the source/drain contact CA. Each of the plurality of source/drain via contacts VA may include, but is not limited to, molybdenum (Mo) or tungsten (W).

As shown in FIG. 5B, a gate contact CB may be arranged on the gate line 160. The gate contact CB may be configured to pass through the upper insulating structure 180 and the capping insulating pattern 168 in the vertical direction (Z direction) to be connected to the gate line 160. A lower surface of the gate contact CB may be in contact with the upper surface of the gate line 160. The gate contact CB may include a contact plug including molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof, but a constituent material of the contact plug is not limited to the examples set forth above. In some example embodiments, the gate contact CB may further include a conductive barrier pattern surrounding a portion of the contact plug. The conductive barrier pattern of the gate contact CB may include metal or metal nitride. For example, the conductive barrier pattern may include, but is not limited to, Ti, Ta, W, TiN, TaN, WN, WCN, TiSiN, TaSiN, WSiN, or a combination thereof.

An upper surface of the upper insulating structure 180 may be covered by a frontside interlayer dielectric 186. A constituent material of the frontside interlayer dielectric 186 is substantially the same as that of the upper insulating film 184 described above. A plurality of upper wiring layers M1 may be arranged through the frontside interlayer dielectric 186. Each of the plurality of upper wiring layers M1 may be connected to the source/drain via contact VA or the gate contact CB. In some example embodiments, an upper wiring layer M1 connected to the source/drain contact CA via the source/drain via contact VA, from among the plurality of upper wiring layers M1, may be used as a signal line SL. Each of the plurality of upper wiring layers M1 may include, but is not limited to, molybdenum (Mo), copper (Cu), tungsten (W), cobalt (Co), ruthenium (Ru), manganese (Mn), titanium (Ti), tantalum (Ta), aluminum (Al), a combination thereof, or an alloy thereof.

As described with reference to FIGS. 4, 5A, and 5B, in the integrated circuit device 200, some source/drain regions 130 from among the plurality of source/drain regions 130 may each be configured to be connected to the backside source/drain contact DBC, and some other source/drain regions 130 from among the plurality of source/drain regions 130 may each be configured to be connected to the source/drain contact CA. Therefore, parasitic capacitance in the integrated circuit device 200 may be suppressed by securing a sufficient insulating distance between a plurality of backside source/drain contacts DBC and between the plurality of source/drain contacts CA, and the resistance in wiring lines for supplying power and/or signals to the source/drain region 130 may be reduced.

In addition, when processes of forming a backside structure including the plurality of backside source/drain contacts DBC are performed during the process of manufacturing the integrated circuit device 200 according to some example embodiments of the inventive concepts, a self-aligned type etching process using the device isolation film 112 may be performed, and here, the bottom insulating structure 128 may be used as an etch stop film. Therefore, in the integrated circuit device 200, when processes of forming the backside structure including the backside source/drain contact DBC are performed, the processes may be easily performed even without applying a strict design rule. As such, the integrated circuit device 200 according to some example embodiments of the inventive concepts may provide a stable and optimized wiring structure even in a reduced area due to down-scaling, and the degree of integration and reliability of the integrated circuit device 200 may improve.

Hereinafter, some methods of manufacturing an integrated circuit device, according to some example embodiments, is described in detail.

FIGS. 6A to 22B are diagrams respectively illustrating a sequence of processes of a method of manufacturing an integrated circuit device, according to an example embodiment. More specifically, FIGS. 6A, 7A, 8A, 14A, 15A, 16A, 20A, 21A, and 22A are cross-sectional views each illustrating an example of a cross-sectional structure of a portion of the integrated circuit device, which corresponds to the cross-section taken along the line X1-X1' of FIG. 2, according to the sequence of processes. FIGS. 6B, 7B, 8B, 9 to 13, 14B, 15B, 16B, 17 to 19, 20B, 21B, and 22B are cross-sectional views each illustrating an example of a cross-sectional structure of a portion of the integrated circuit device, which corresponds to the cross-section taken along the line Y1-Y1' of FIG. 2, according to the sequence of processes. FIGS. 14C and 15C are cross-sectional views each illustrating an example of a cross-sectional structure of a portion of the integrated circuit device, which corresponds to the cross-section taken along the line Y2-Y2' of FIG. 2, according to the sequence of processes.

An example of a method of fabricating the integrated circuit device 100 described with reference to FIGS. 2 and 3A to 3C is described with reference to FIGS. 6A to 22B. In FIGS. 6A to 22B, the same reference numerals as in FIGS. 2 and 3A to 3C denote the same members, respectively, and here, repeated descriptions thereof are omitted.

Figure 6A:
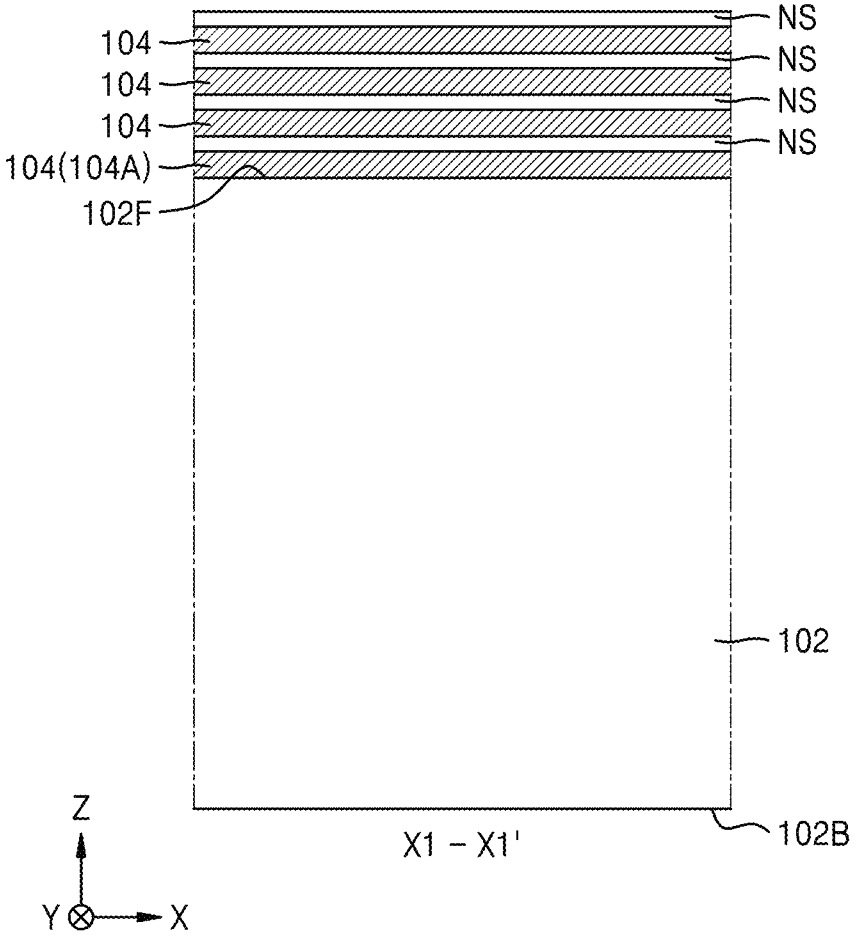
Figure 6B:
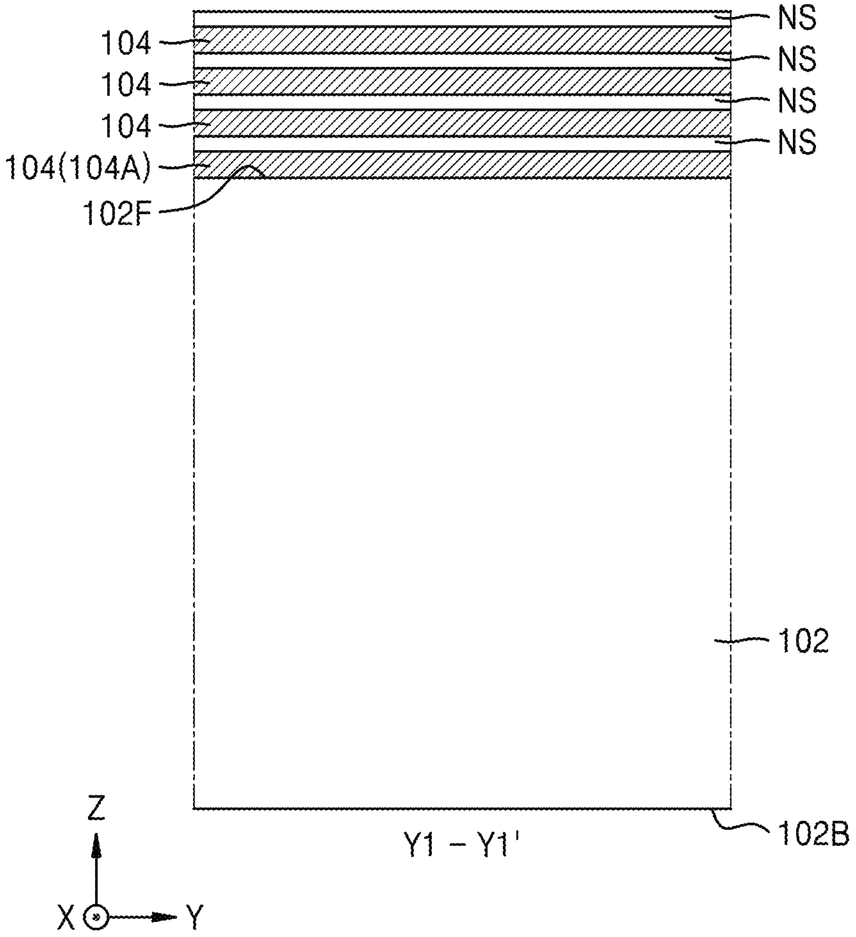

Referring to FIGS. 6A and 6B, the substrate 102 having the frontside surface 102F and the backside surface 102B, which are opposite to each other, may be prepared, and a stack structure, in which a plurality of sacrificial semiconductor layers 104 and a plurality of nanosheet semiconductor layers NS are alternately stacked one-by-one, may be formed on the frontside surface 102F of the substrate 102. A sacrificial semiconductor layer 104, which is closest to the substrate 102, from among the plurality of sacrificial semiconductor layers 104 may be referred to as a bottom sacrificial semiconductor layer 104A.

In the stack structure, each of the plurality of sacrificial semiconductor layers 104 and each of the plurality of nanosheet semiconductor layers NS may include semiconductor materials having different etch selectivities from each other, respectively. In some example embodiments, each of the plurality of nanosheet semiconductor layers NS may include a Si layer and each of the plurality of sacrificial semiconductor layers 104 may include a SiGe layer. The SiGe layer constituting the sacrificial semiconductor layer 104 may have a constant Ge content selected from a range of about 5 at % to about 50 at %, for example, about 10 at % to about 40 at %. In some example embodiments, each of the plurality of sacrificial semiconductor layers 104 may include a SiGe layer and the respective Ge contents of the plurality of sacrificial semiconductor layers 104 may be equal to each other.

Figure 7A:
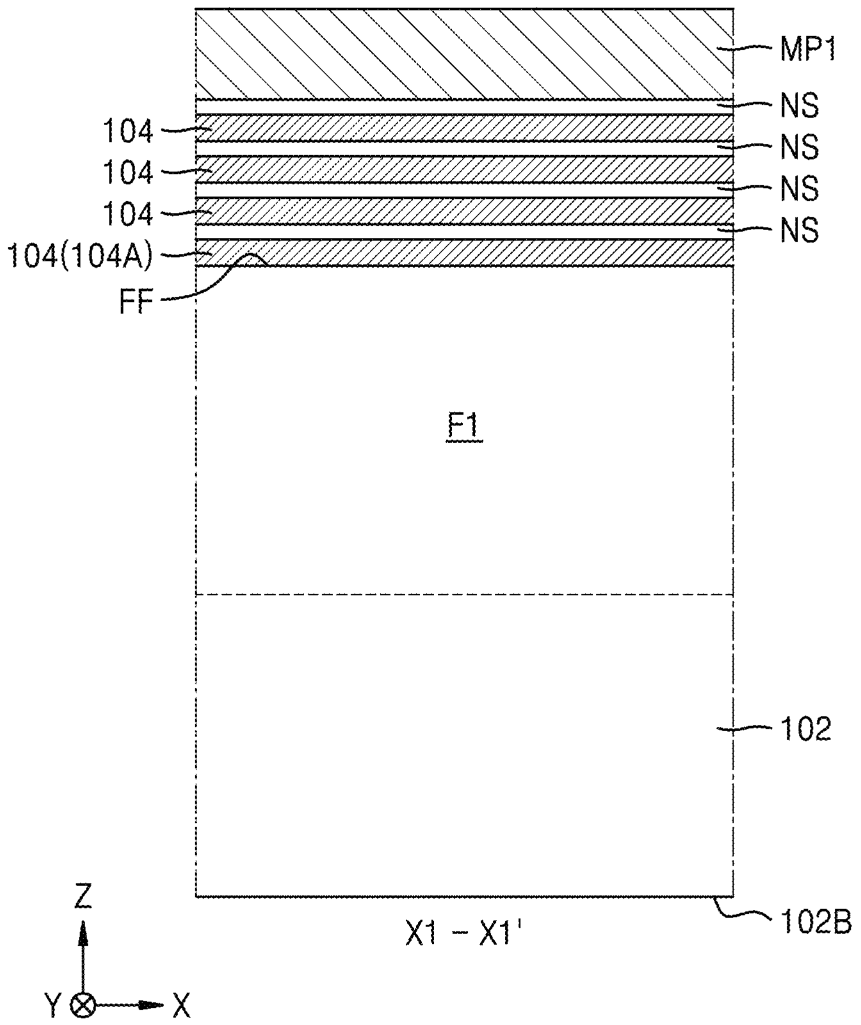
Figure 7B:
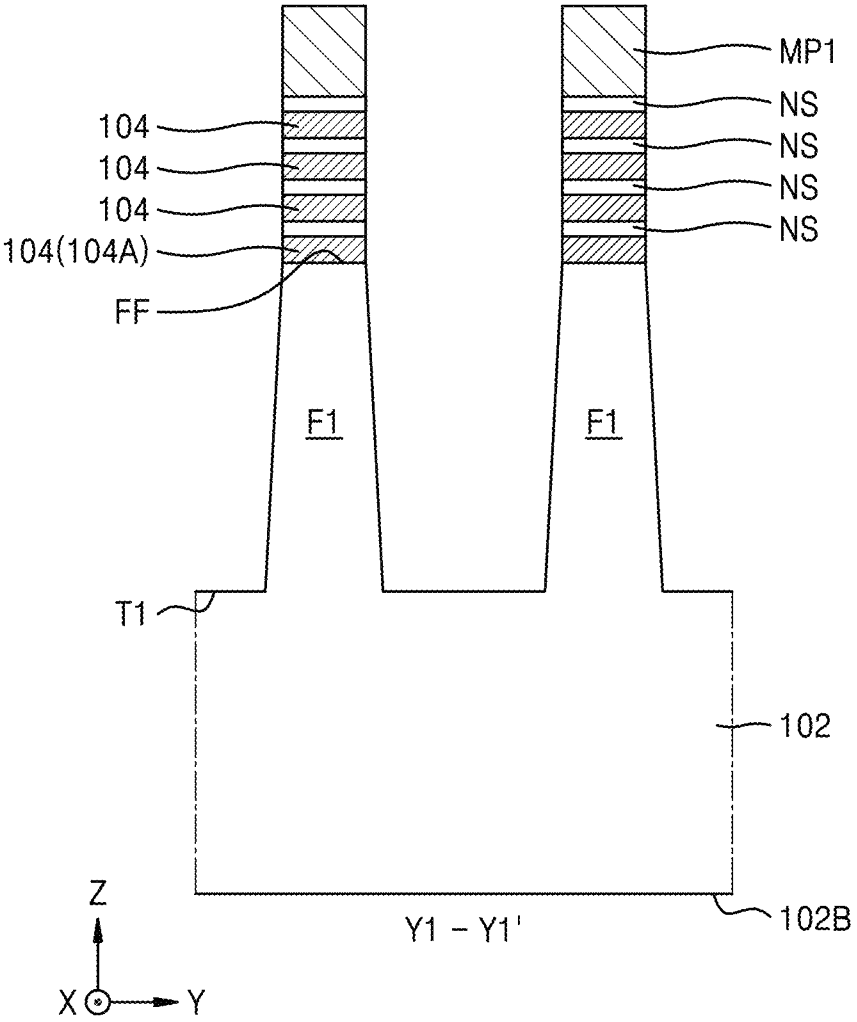

Referring to FIGS. 7A and 7B, a mask pattern MP1 having openings, which expose the upper surface of the stack structure, may be formed on the resulting product of FIGS. 6A and 6B. The mask pattern MP1 may include a stack structure of a silicon oxide film and a silicon nitride film. The mask pattern MP1 may include portions extending parallel to each other in the first horizontal direction (X direction) over the substrate 102.

Each of the plurality of sacrificial semiconductor layers 104, the plurality of nanosheet semiconductor layers NS, and the substrate 102 may be partially etched by using the mask pattern MP1 as an etch mask, thereby forming the plurality of fin-type active regions F1 in the substrate 102. The plurality of trench regions T1 may be defined on the substrate 102 by the plurality of fin-type active regions F1. A portion of each of the plurality of sacrificial semiconductor layers 104 and the plurality of nanosheet semiconductor layers NS may remain on the fin top surface FF of each of the plurality of fin-type active regions F1. The bottom sacrificial semiconductor layer 104A, which is closest to the substrate 102 from among the plurality of sacrificial semiconductor layers 104, may be in contact with the fin top surface FF of the fin-type active region F1.

Figure 8A:
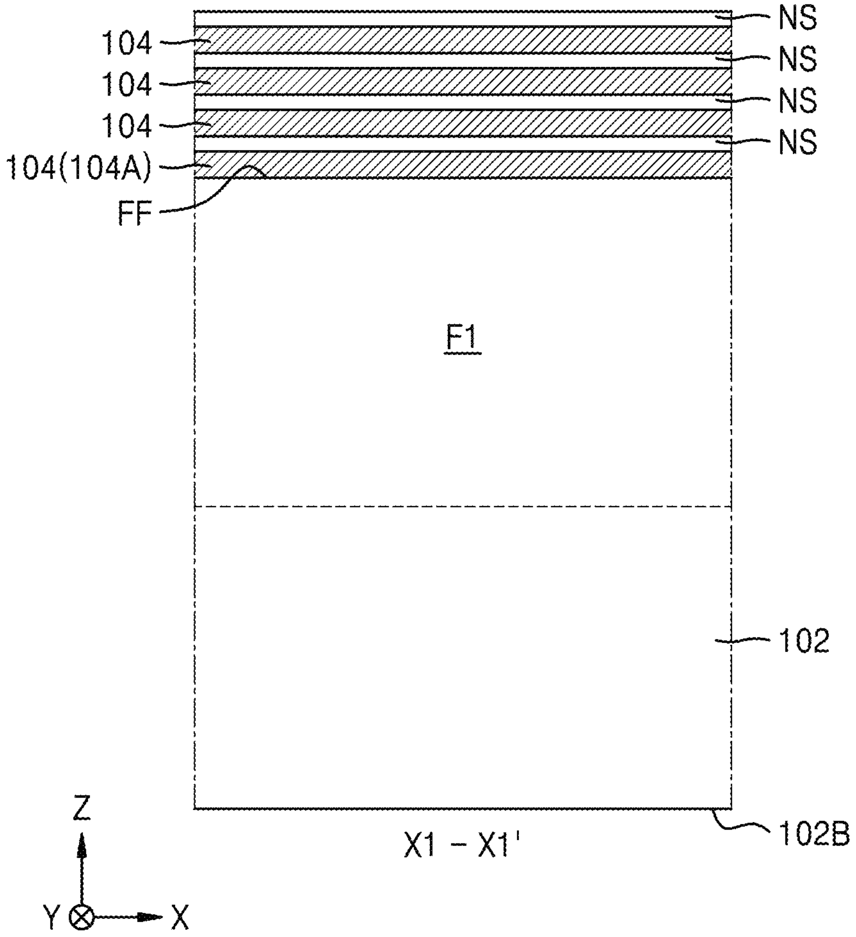
Figure 8B:
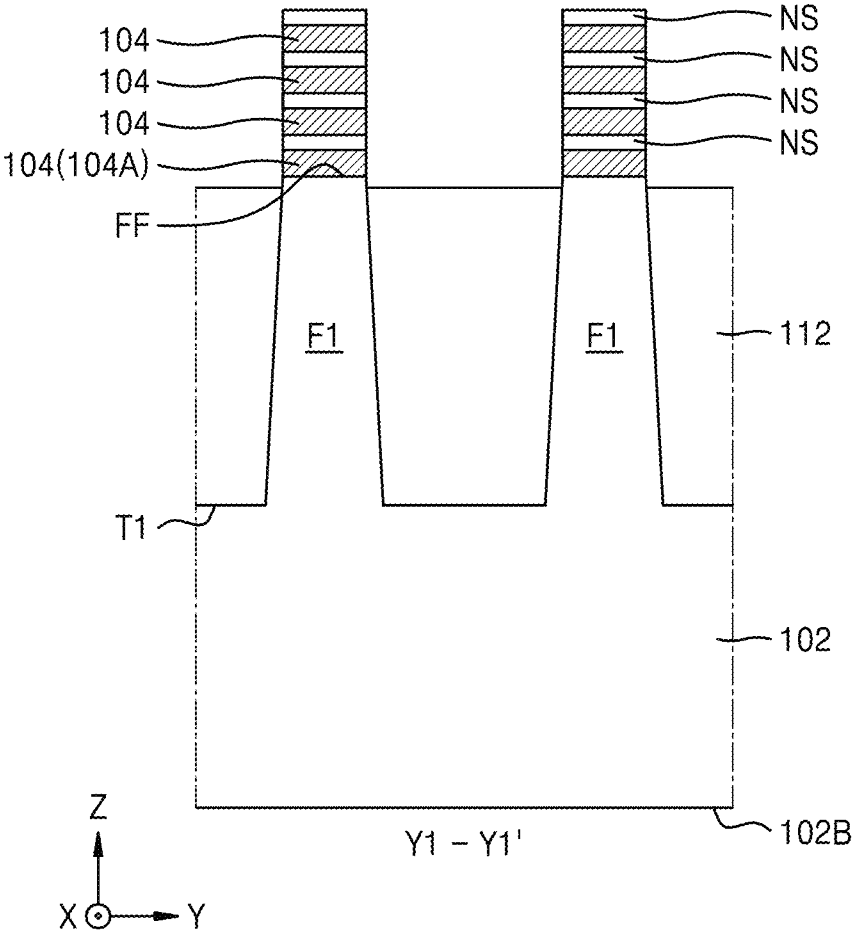

Referring to FIGS. 8A and 8B, the device isolation film 112 may be formed on the resulting product of FIGS. 7A and 7B. The device isolation film 112 may be formed to fill the plurality of trench regions T1 and cover the respective sidewalls of the plurality of fin-type active regions F1.

To form the device isolation film 112, an insulating film may be formed on the resulting product of FIGS. 7A and 7B to have a thickness enough to fill the plurality of trench regions T1, and the upper surface of the mask pattern MP1 may be exposed by planarizing the obtained resulting product. Next, the mask pattern MP1 that is exposed may be removed, followed by performing a recess process for removing a portion of the insulating film, thereby forming the device isolation film 112, which includes the remaining portion of the insulating film. After the device isolation film 112 is formed, the stack structure including the plurality of sacrificial semiconductor layers 104 and the plurality of nanosheet semiconductor layers NS, which remain on the substrate 102, may protrude upward from the upper surface of the device isolation film 112, and the upper surface of the uppermost nanosheet semiconductor layer NS from among the plurality of nanosheet semiconductor layers NS may be exposed.

Figure 9:
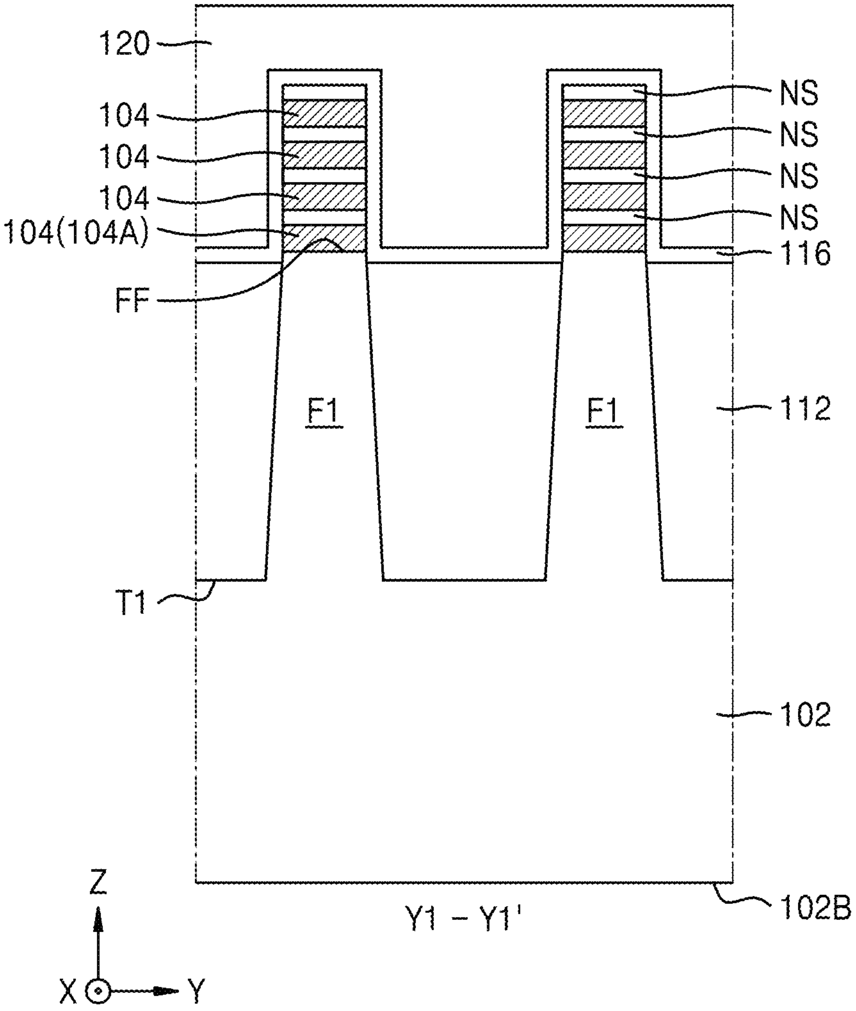

Referring to FIG. 9, in the resulting product of FIGS. 8A and 8B, a first liner layer 116 may be formed to cover respective exposed surfaces of the device isolation film 112 and a plurality of stack structures, which each include the plurality of sacrificial semiconductor layers 104 and the plurality of nanosheet semiconductor layers NS, and then, an insulating film 120 may be formed to cover the first liner layer 116. The insulating film 120 may be formed to a thickness enough to fill respective spaces between the plurality of stack structures. A vertical level of the upper surface of the insulating film 120 may be higher than a vertical level of the upper surface of the uppermost nanosheet semiconductor layer NS from among the plurality of nanosheet semiconductor layers NS.

In some example embodiments, the first liner layer 116 may include an insulating film including nitrogen atoms. For example, the first liner layer 116 may include, but is not limited to, a silicon nitride film or a SiOCN film. The insulating film 120 may include a silicon oxide film.

Figure 10:
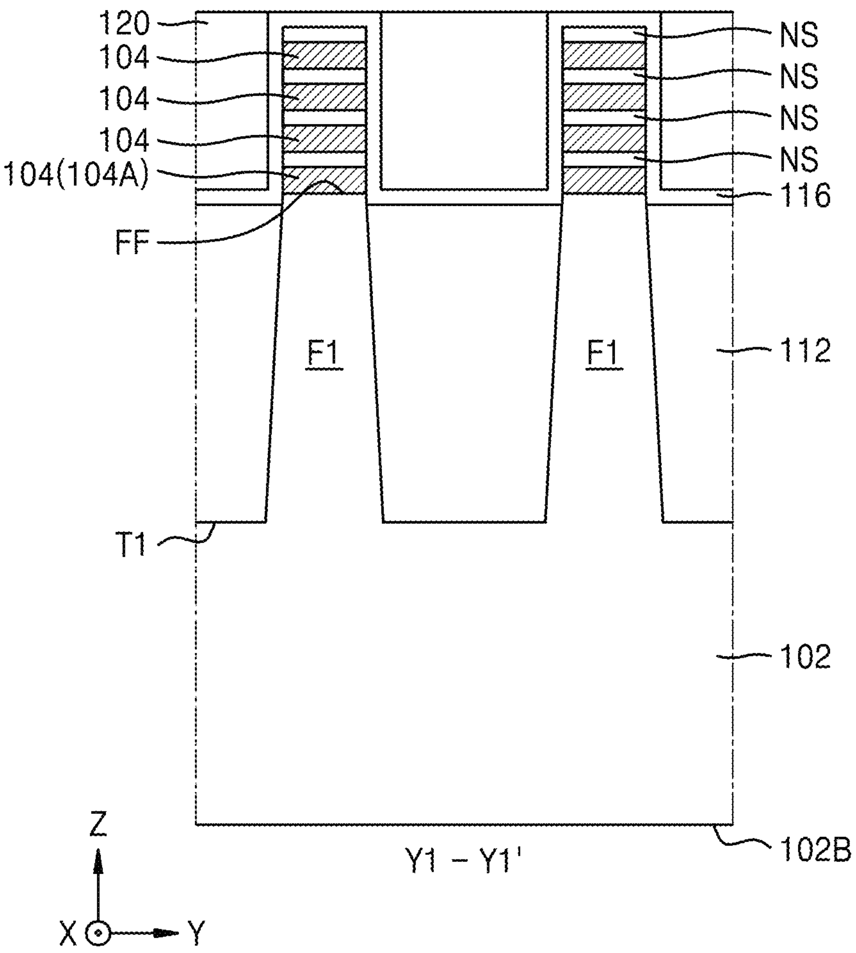

Referring to FIG. 10, in the resulting product of FIG. 9, a chemical mechanical polishing (CMP) process may be performed on the upper surface of the insulating film 120, thereby removing a portion of the insulating film 120 to expose the uppermost surface of the first liner layer 116.

Figure 11:
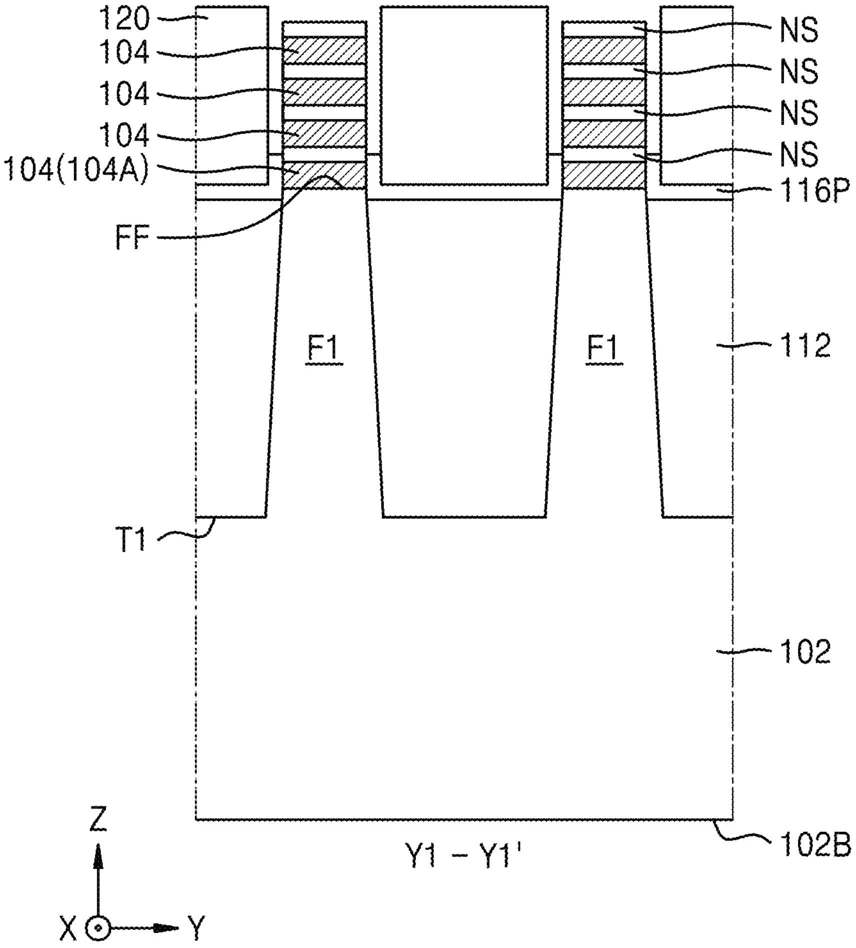

Referring to FIG. 11, a portion of the first liner layer 116, which is exposed, may be removed from the resulting product of FIG. 10, thereby forming a first local liner 116P from the first liner layer 116. To remove the portion of the first liner layer 116, an etching process using a difference in etch selectivity between the first liner layer 116 and the insulating film 120 may be performed. The etching process may include wet etching, dry etching, or a combination thereof.

The first local liner 116P may be arranged on a sidewall of each of the plurality of stack structures to cover the sidewall of the bottom sacrificial semiconductor layer 104A that is closest to the fin-type active region F1 from among the plurality of sacrificial semiconductor layers 104. Each of the plurality of stack structures may includes the plurality of sacrificial semiconductor layers 104 and the plurality of nanosheet semiconductor layers NS. Respective sidewalls of the remaining sacrificial semiconductor layers 104 except for the bottom sacrificial semiconductor layer 104A from among the plurality of sacrificial semiconductor layers 104 may be exposed above the first local liner 116P.

Although FIG. 11 illustrates that the height of the first local liner 116P is controlled by removing a portion of the first liner layer 116 for the first local liner 116P to cover only the sidewall of the bottom sacrificial semiconductor layer 104A from among the plurality of sacrificial semiconductor layers 104, the inventive concepts are not limited thereto. For example, the removal amount of the first liner layer 116 in the process described with reference to FIG. 11 may be adjusted, thereby forming a first local liner having a relatively great height to cover the respective sidewalls of two sacrificial semiconductor layers 104, which are relatively close to the substrate 104 from among the plurality of sacrificial semiconductor layers 104, instead of forming the first local liner 116P. In this case, after processes described below are performed, the resulting product may be obtained in which the space corresponding to the sub-gate portion 160S closest to the substrate 102 from among the plurality of sub-gate portions 160S in the resulting product of FIGS. 3A and 3B is also filled with the same structure as the bottom insulating structure 128 rather than filled with the sub-gate portion 160S.

Figure 12:
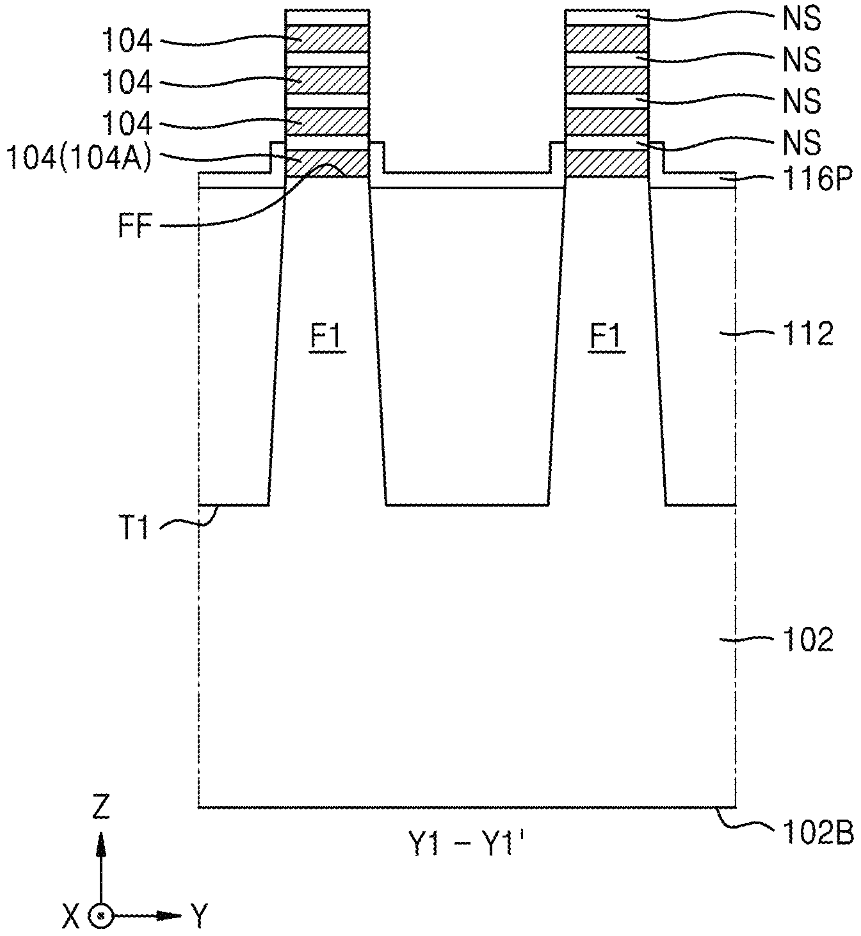

Referring to FIG. 12, the insulating film 120 may be removed from the resulting product of FIG. 11. To remove the insulating film 120, an etching process using a difference in etch selectivity between the insulating film 120 and the first local liner 116P may be performed. To remove the insulating film 120, a wet etching process, a dry etching process, or a combination thereof may be used.

Figure 13:
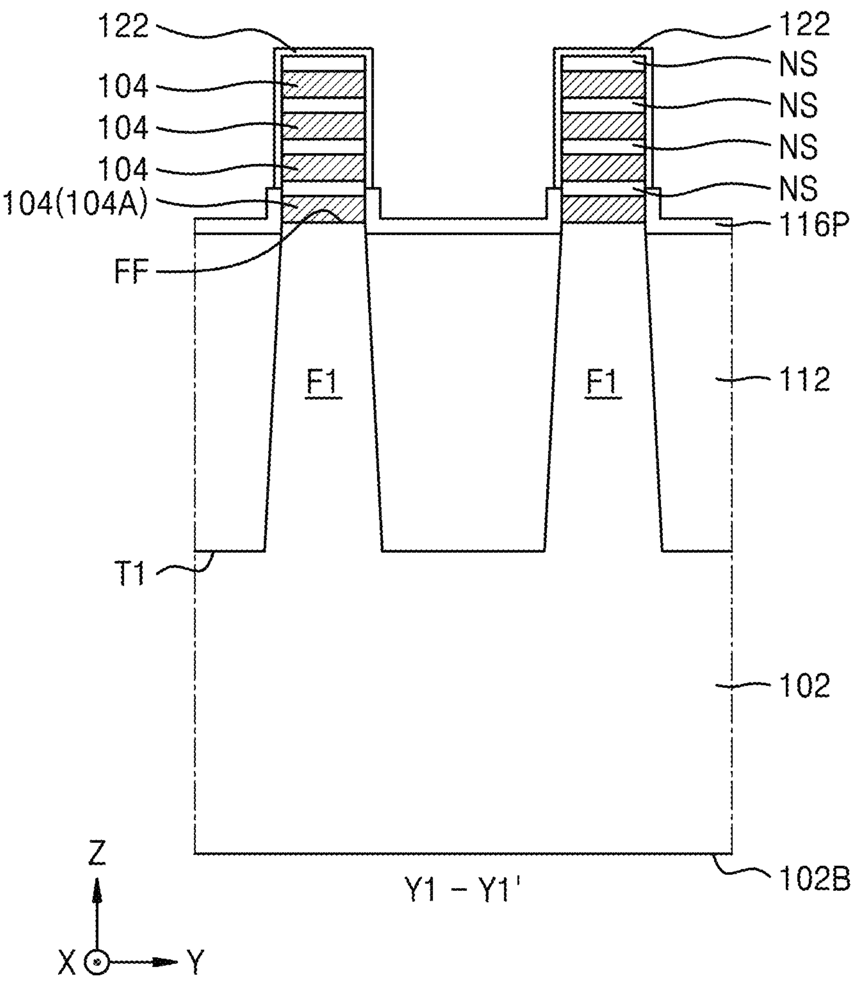

Referring to FIG. 13, a second local liner 122 may be formed on the sidewall of each of the plurality of stack structures to cover the respective sidewalls of the remaining sacrificial semiconductor layers 104 except for the bottom sacrificial semiconductor layer 104A. Each of the plurality of stack structures may include the plurality of sacrificial semiconductor layers 104 and the plurality of nanosheet semiconductor layers NS.

The first local liner 116P and the second local liner 122 may include different materials from each other. In some example embodiments, the first local liner 116P may include an insulating film including nitrogen atoms and the second local liner 122 may include an insulating film including no nitrogen atoms. For example, the first local liner 116P may include a silicon nitride film or a SiOCN film and the second local liner 122 may include an oxide film. In some example embodiments, to form the second local liner 122, a thermal oxidation process may be used. In this case, the second local liner 122 may include silicon oxide, silicon germanium oxide, or a combination thereof. In some example embodiments, as shown in FIG. 13, although the thickness of the second local liner 122 may be less than the thickness of the first local liner 116P, the inventive concepts are not limited thereto.

Figure 14A:
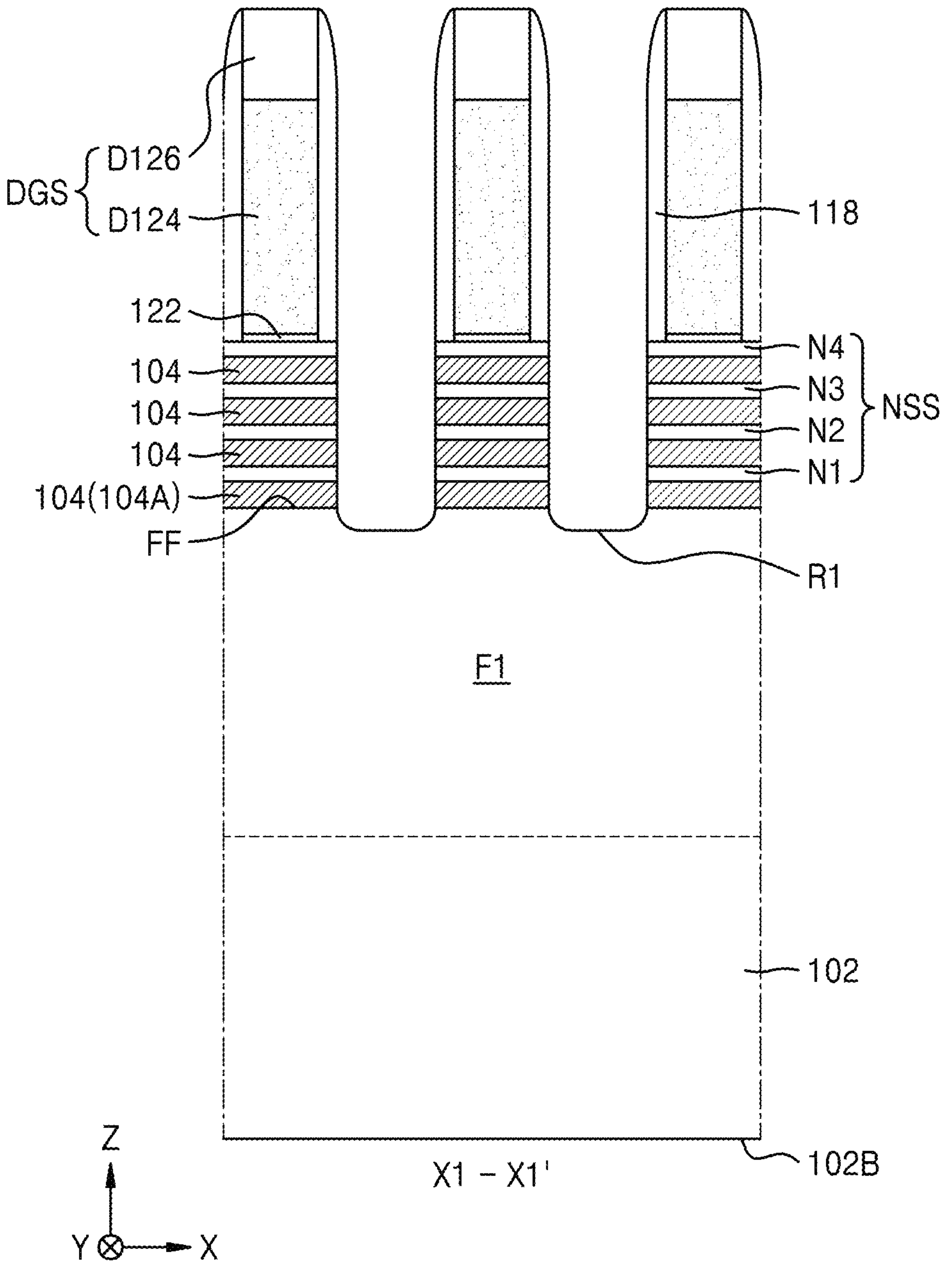
Figure 14B:
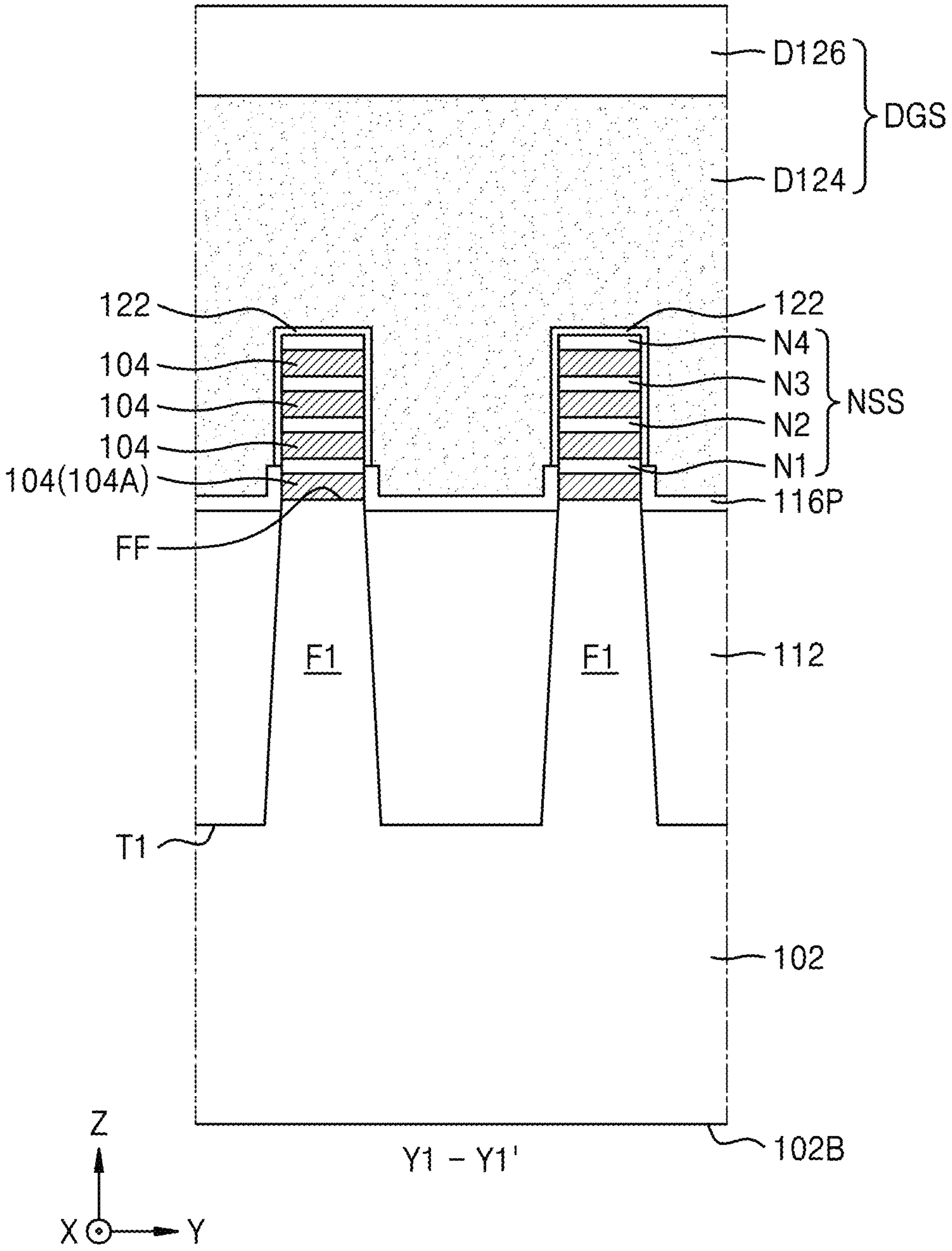
Figure 14C:
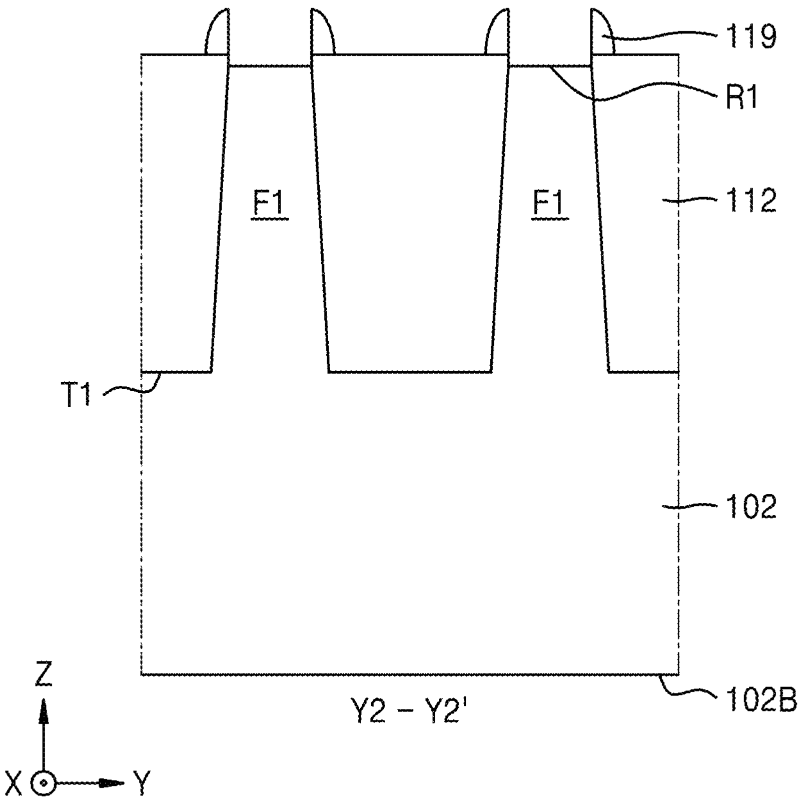
FIGS. 14C and 15C are cross-sectional views each illustrating an example of a cross-sectional structure of a portion of the integrated circuit device, which corresponds to the cross-section taken along the line Y2-Y2' of FIG. 2, according to the sequence of processes.

Referring to FIGS. 14A to 14C, in the resulting product of FIG. 13, a plurality of dummy gate structures DGS may be formed to cover the stack structure of the plurality of sacrificial semiconductor layers 104 and the plurality of nanosheet semiconductor layers NS and cover the device isolation film 112. Each of the plurality of dummy gate structures DGS may be formed to extend lengthwise in the second horizontal direction (Y direction). Each of the plurality of dummy gate structures DGS may include a dummy gate layer D124 and a capping layer D126, which are stacked in the stated order on the first local liner 116P and the second local liner 122. In some example embodiments, the dummy gate layer D124 may include polysilicon and the capping layer D126 may include a silicon nitride film.

As shown in FIG. 14A, the plurality of insulating spacers 118 may be formed to cover both sidewalls of each of the plurality of dummy gate structures DGS, and a portion of each of the first local liner 116P and the second local liner 122, a portion of each of the plurality of sacrificial semiconductor layers 104 and the plurality of nanosheet semiconductor layers NS, and a portion of the fin-type active region F1 may be etched by using the plurality of dummy gate structures DGS and the plurality of insulating spacers 118 as an etch mask, whereby the plurality of nanosheet semiconductor layers NS may be divided into the plurality of nanosheet stacks NSS, which each include the first to fourth nanosheets N1, N2, N3, and N4, and the plurality of recesses R1 may be formed in an upper portion of the fin-type active region F1. The width of each of the first to fourth nanosheets N1, N2, N3, and N4 in the first horizontal direction (X direction) may be defined by the plurality of recesses R1.

To form the plurality of recesses R1, the etching may be performed by dry etching, wet etching, or a combination thereof. During the formation of the plurality of insulating spacers 118 and the plurality of recesses R1, the plurality of recess-side insulating spacers 119 may be formed as shown in FIG. 14C, the plurality of recess-side insulating spacers 119 being arranged on the device isolation film 112 on both sides of each fin-type active region F1 in the second horizontal direction (Y direction) to be adjacent to the plurality of recesses R1, respectively.

Figure 15A:
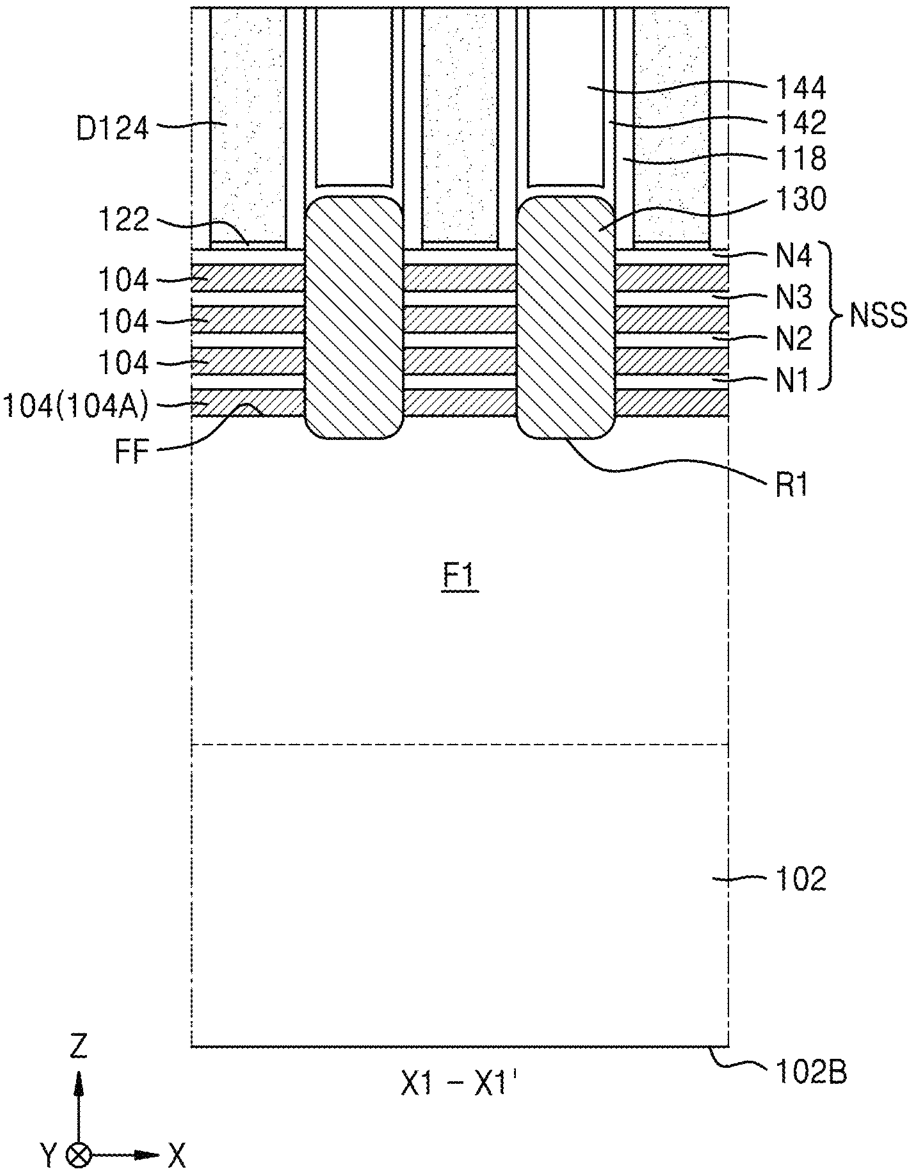
Figure 15B:
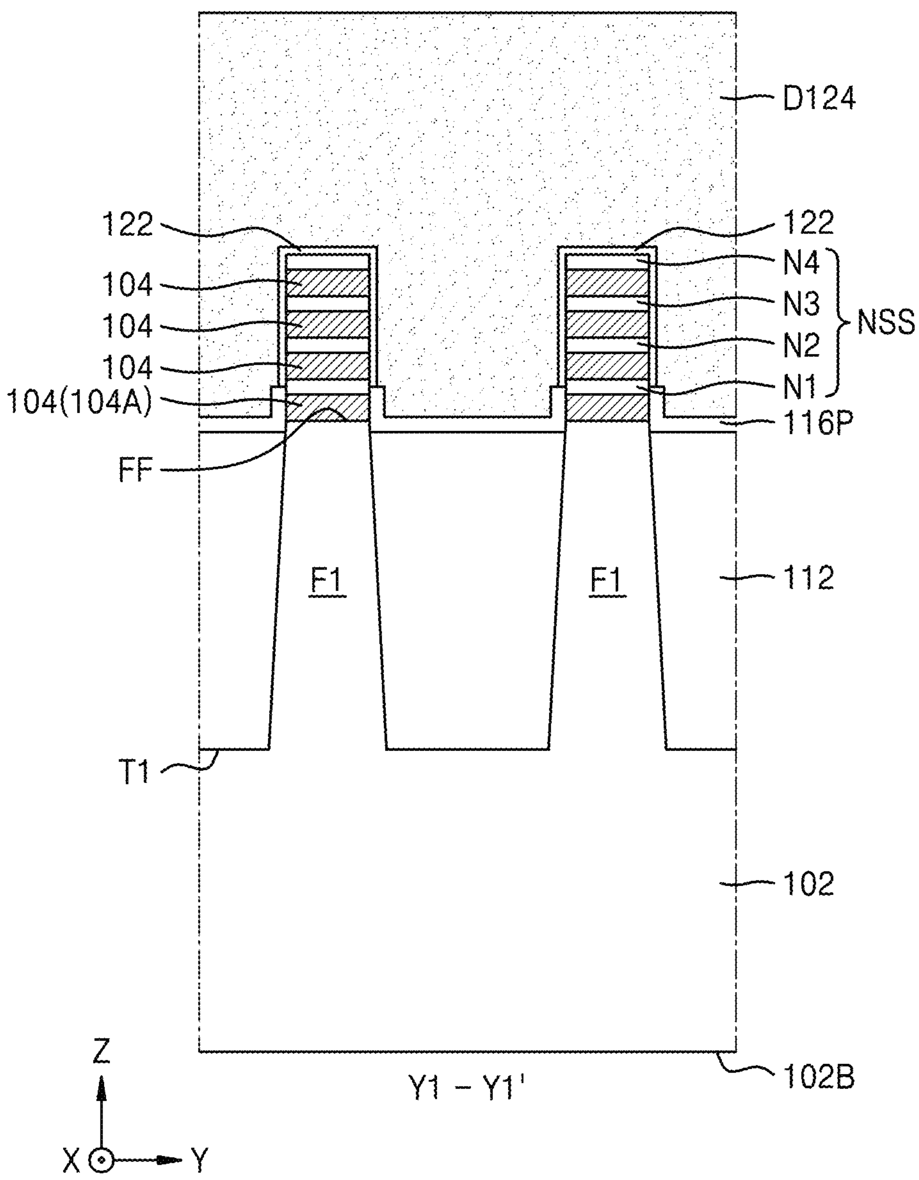
Figure 15C:
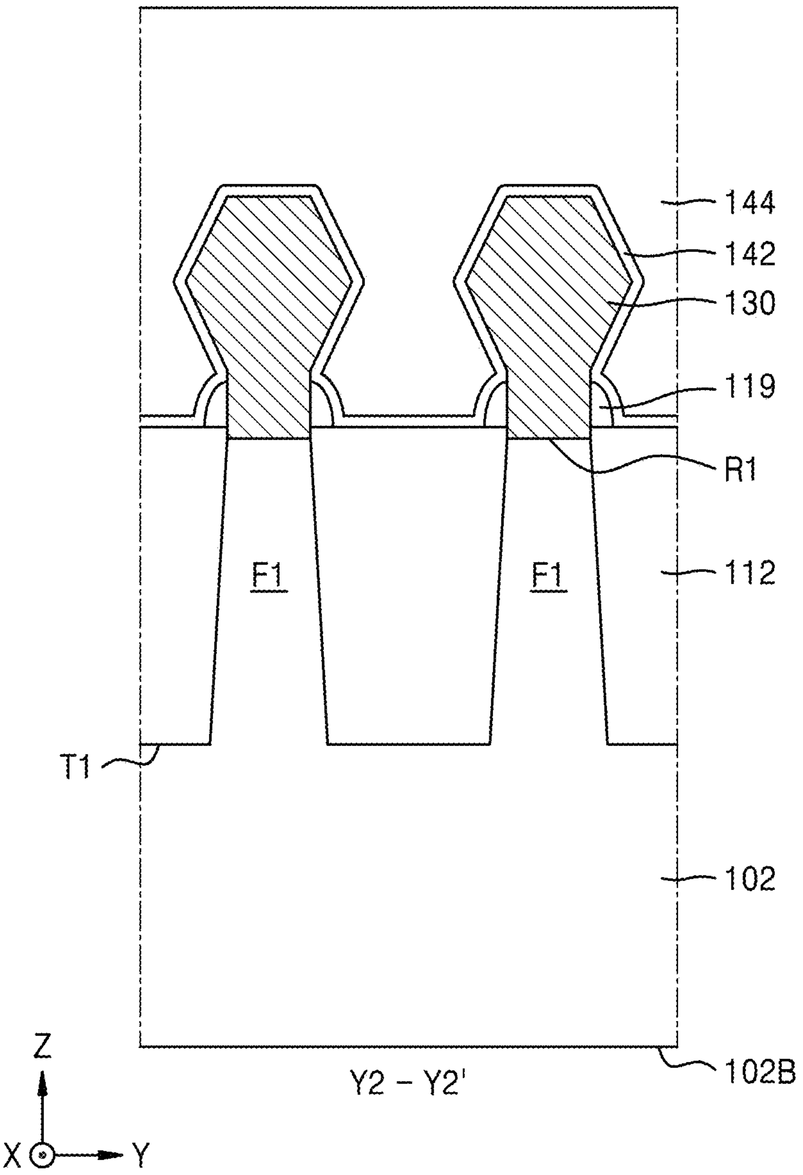

Referring to FIGS. 15A to 15C, in the resulting product of FIGS. 14A to 14C, the plurality of source/drain regions 130 may be formed to fill the plurality of recesses R1, respectively. To form the plurality of source/drain regions 130, a semiconductor material may be epitaxially grown on the surface of the fin-type active region F1 and the sidewall of each of the first to fourth nanosheets N1, N2, N3, and N4 of the nanosheet stack NSS, which are exposed in the plurality of recesses R1.

Next, the insulating liner 142 may be formed to cover the resulting product in which the plurality of source/drain regions 130 are formed, followed by forming the inter-gate dielectric 144 on the insulating liner 142, and then, upper surfaces of a plurality of capping layers D126 (see FIGS. 14A and 14B) may be exposed by partially etching each of the insulating liner 142 and the inter-gate dielectric 144. Next, the dummy gate layer D124 may be exposed by removing the plurality of capping layers D126, and the insulating liner 142 and the inter-gate dielectric 144 may be partially removed such that the upper surface of the inter-gate dielectric 144 and the upper surface of the dummy gate layer D124 are at an approximately equal level.

Figure 16A:
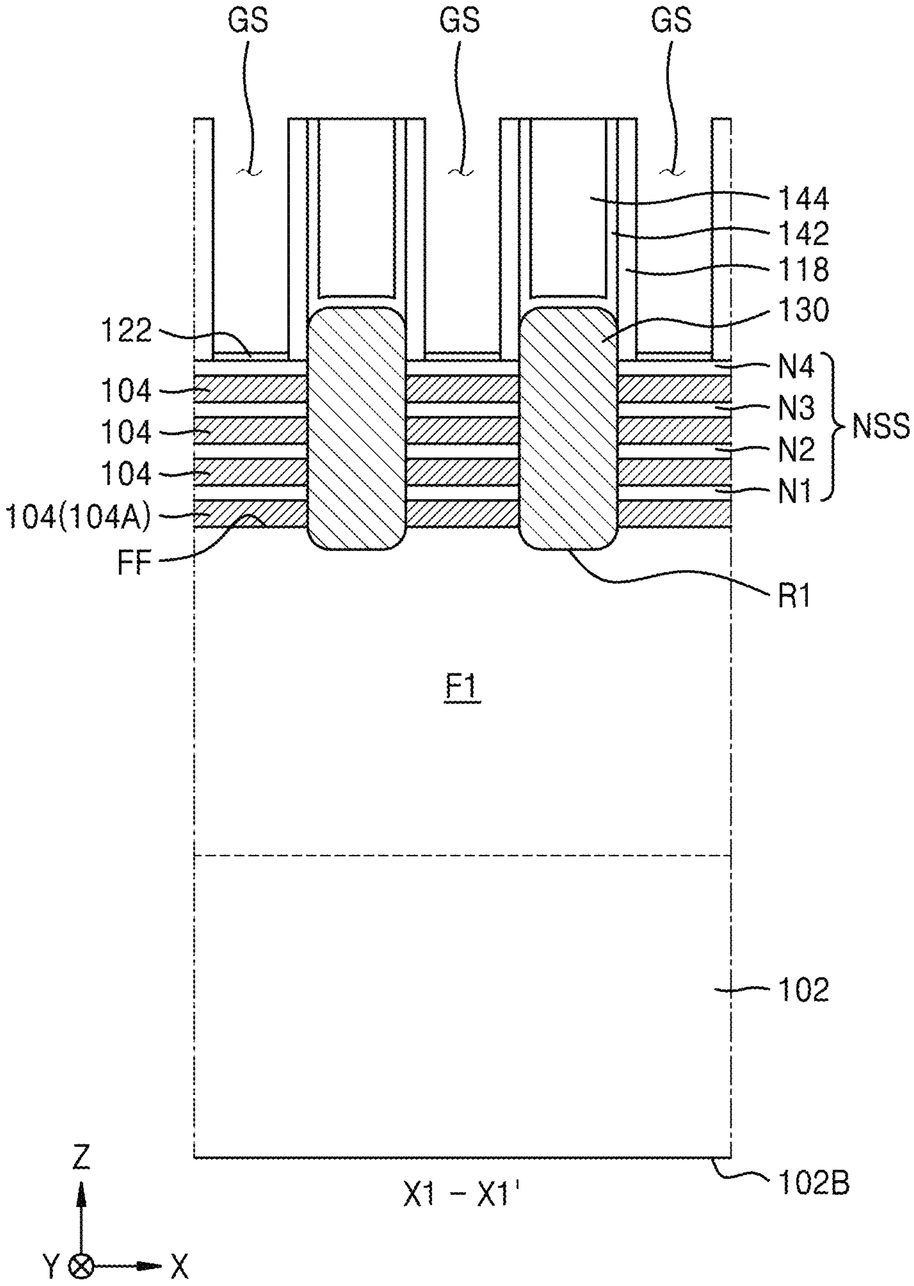
Figure 16B:
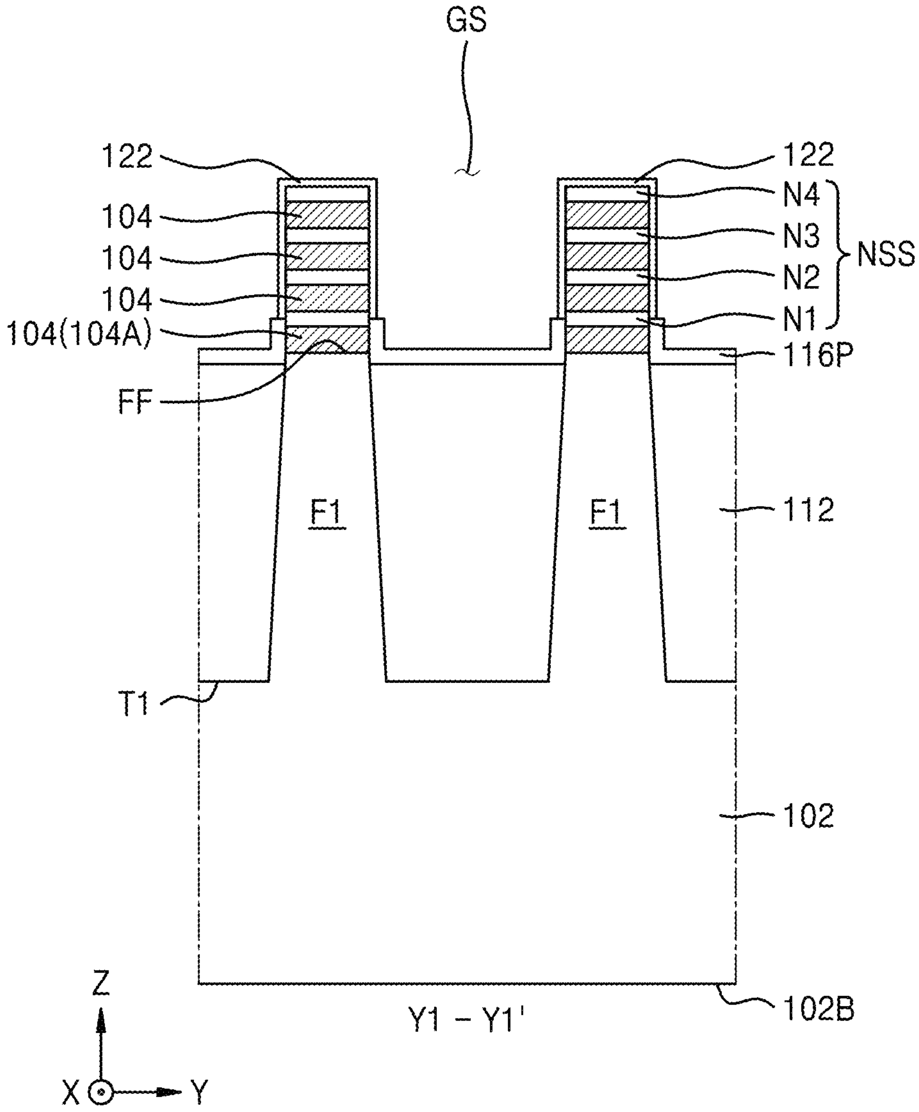

Referring to FIGS. 16A and 16B, a gate space GS may be prepared by removing the dummy gate layer D124 from the resulting product of FIGS. 15A to 15C. The first local liner 116P and the second local liner 122 may be exposed by the gate space GS.

Figure 17:
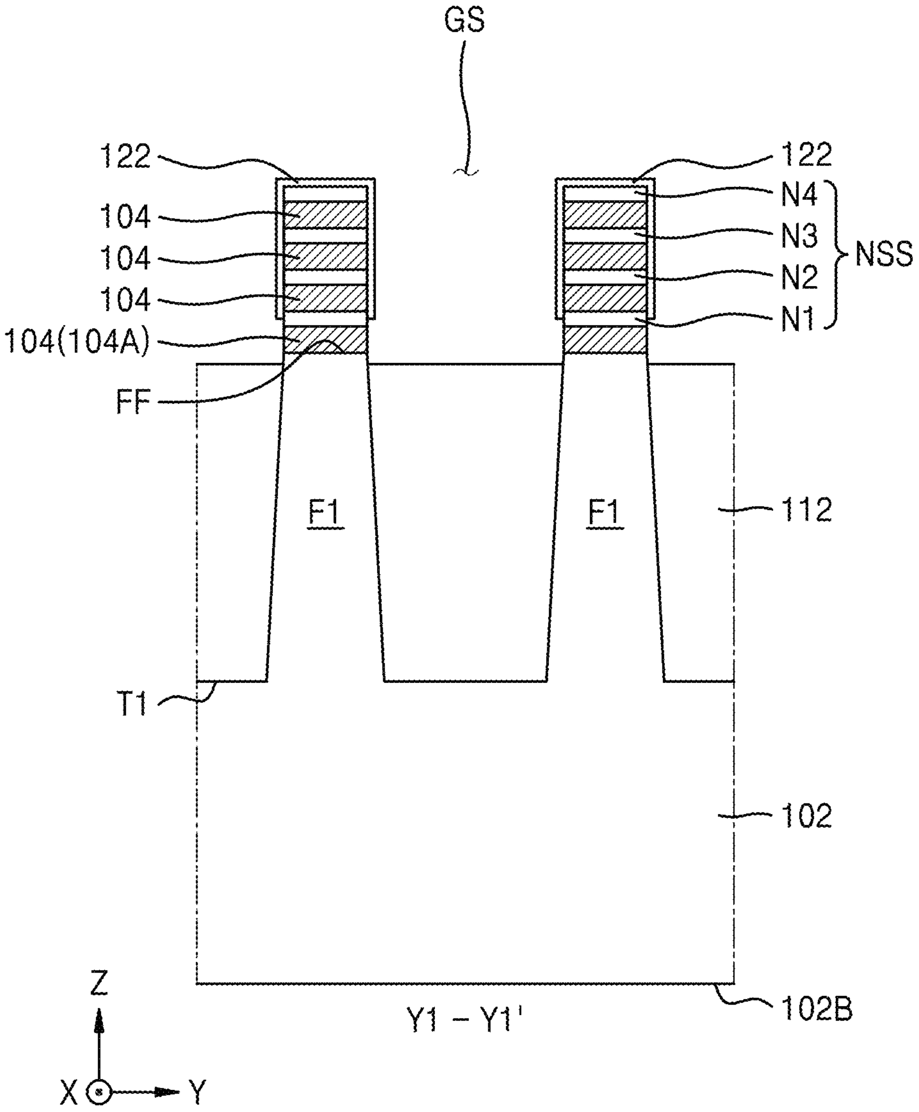

Referring to FIG. 17, the first local liner 116P exposed by the gate space GS may be removed from the resulting product of FIGS. 16A and 16B, thereby exposing the sidewall of the bottom sacrificial semiconductor layer 104A in the gate space GS.

To remove the first local liner 116P exposed by the gate space GS, an etching process using a difference in etch selectivity between the first local liner 116P and the second local liner 122 may be performed. The etching process may include wet etching, dry etching, or a combination thereof.

Figure 18:
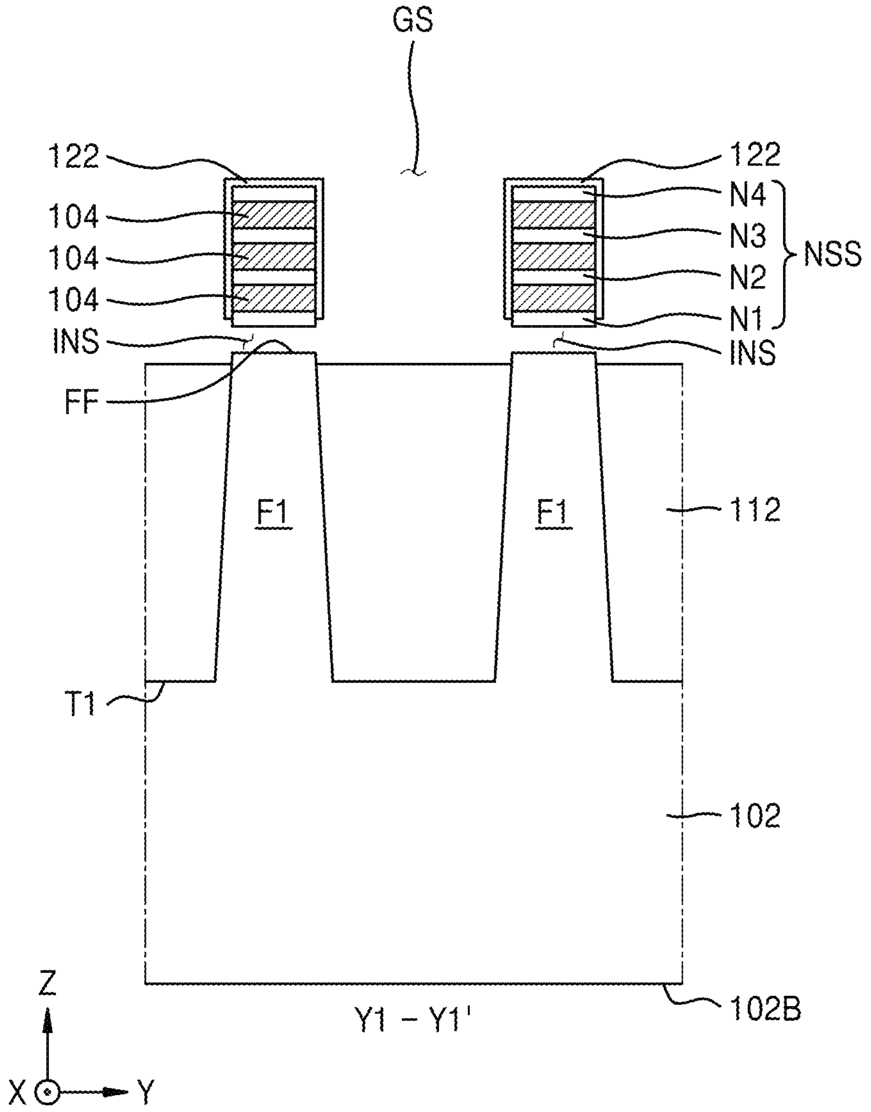

Referring to FIG. 18, the bottom sacrificial semiconductor layer 104A may be removed from the resulting product of FIG. 17 through the gate space GS. As a result, a bottom insulating space INS may be formed to expose the fin top surface FF of the fin-type active region F1 and the lower surface of the first nanosheet N1. The bottom insulating space INS and the gate space GS may be connected to each other.

Figure 19:
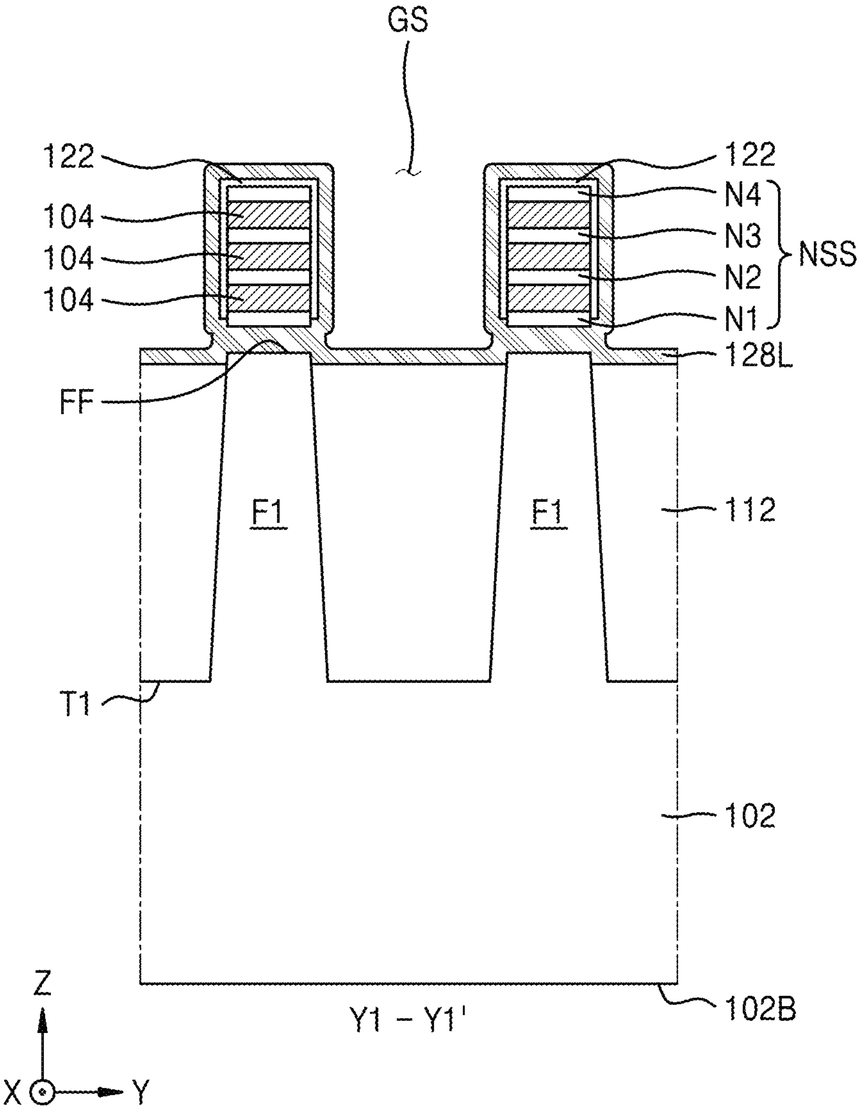

Referring to FIG. 19, in the resulting product of FIG. 18, a buried liner 128L may be formed to a thickness enough to fill the bottom insulating space INS in the gate space GS.

To form the buried liner 128L, an atomic layer deposition (ALD) process may be used. A constituent material of the buried liner 128L is the same as the constituent material of the bottom insulating structure 128 described with reference to FIGS. 3A and 3B. In some example embodiments, the second local liner 122 and the buried liner 128L may include the same material. In some example embodiments, the second local liner 122 and the buried liner 128L may respectively include materials including different components from each other although having equal or similar etch selectivities to each other under a particular etching condition.

Figure 20A:
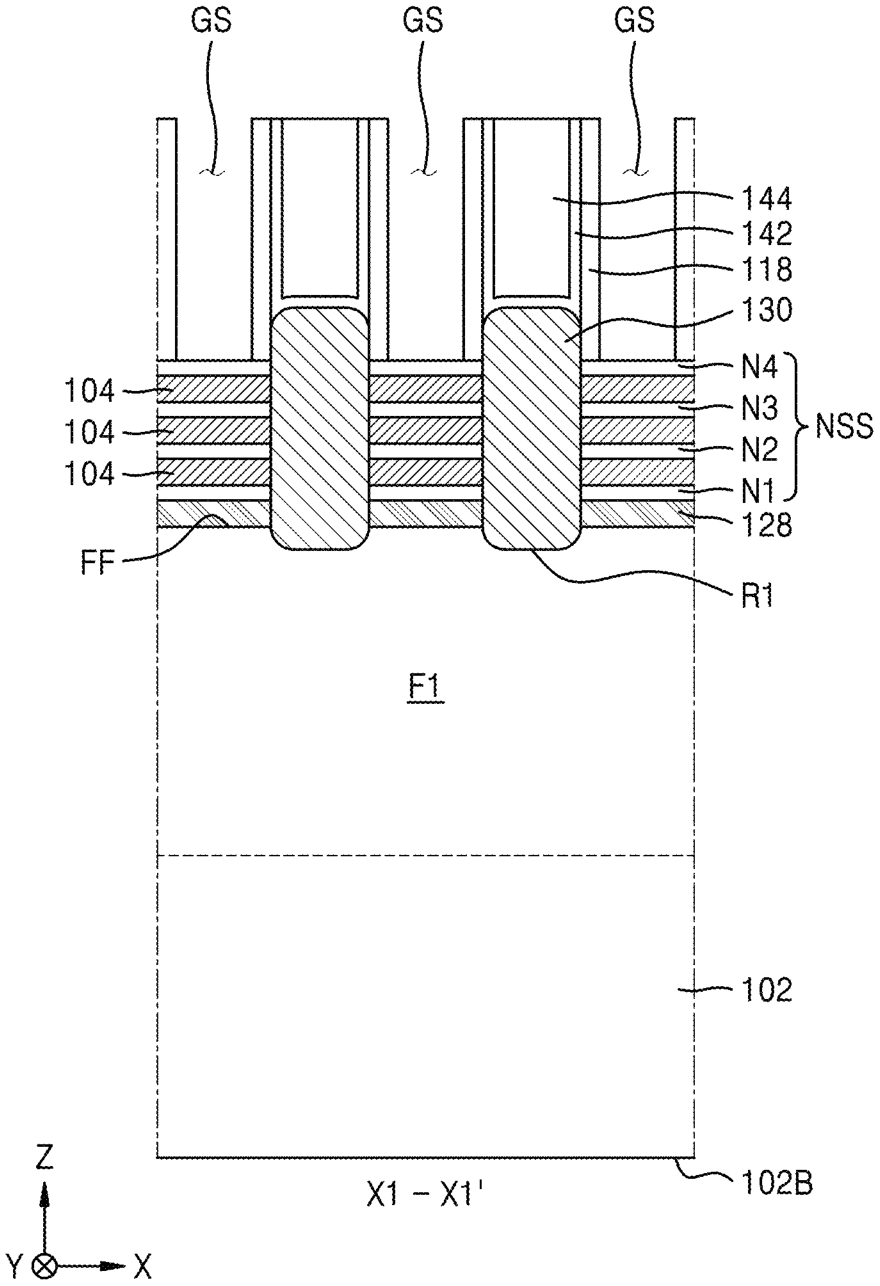
Figure 20B:
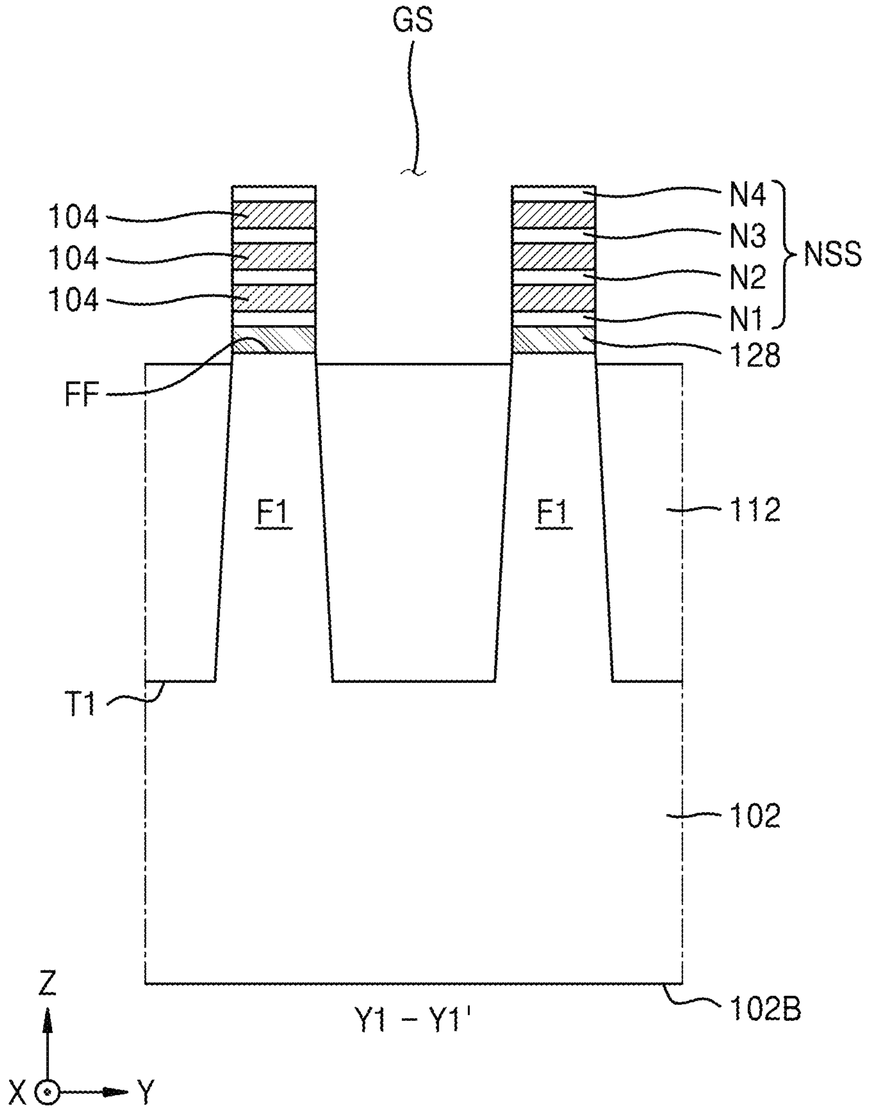

Referring to FIGS. 20A and 20B, portions of the buried liner 128L, which are outside of the bottom insulating space INS, may be removed from the resulting product of FIG. 19, thereby forming the bottom insulating structure 128 including a portion of the buried liner 128L, which fills the bottom insulating space INS. The second local liner 122 exposed during the removal of the portion of the buried liner 128L may also be removed, thereby exposing the stack structure, which includes the plurality of sacrificial semiconductor layers 104 and the plurality of nanosheet semiconductor layers NS, by the gate space GS.

As shown in FIG. 20A, after the bottom insulating structure 128 is formed, the bottom insulating structure 128 may be in contact with at least one source/drain region 130, which is adjacent thereto in the first horizontal direction (X direction), from among the plurality of source/drain regions 130.

Figure 21A:
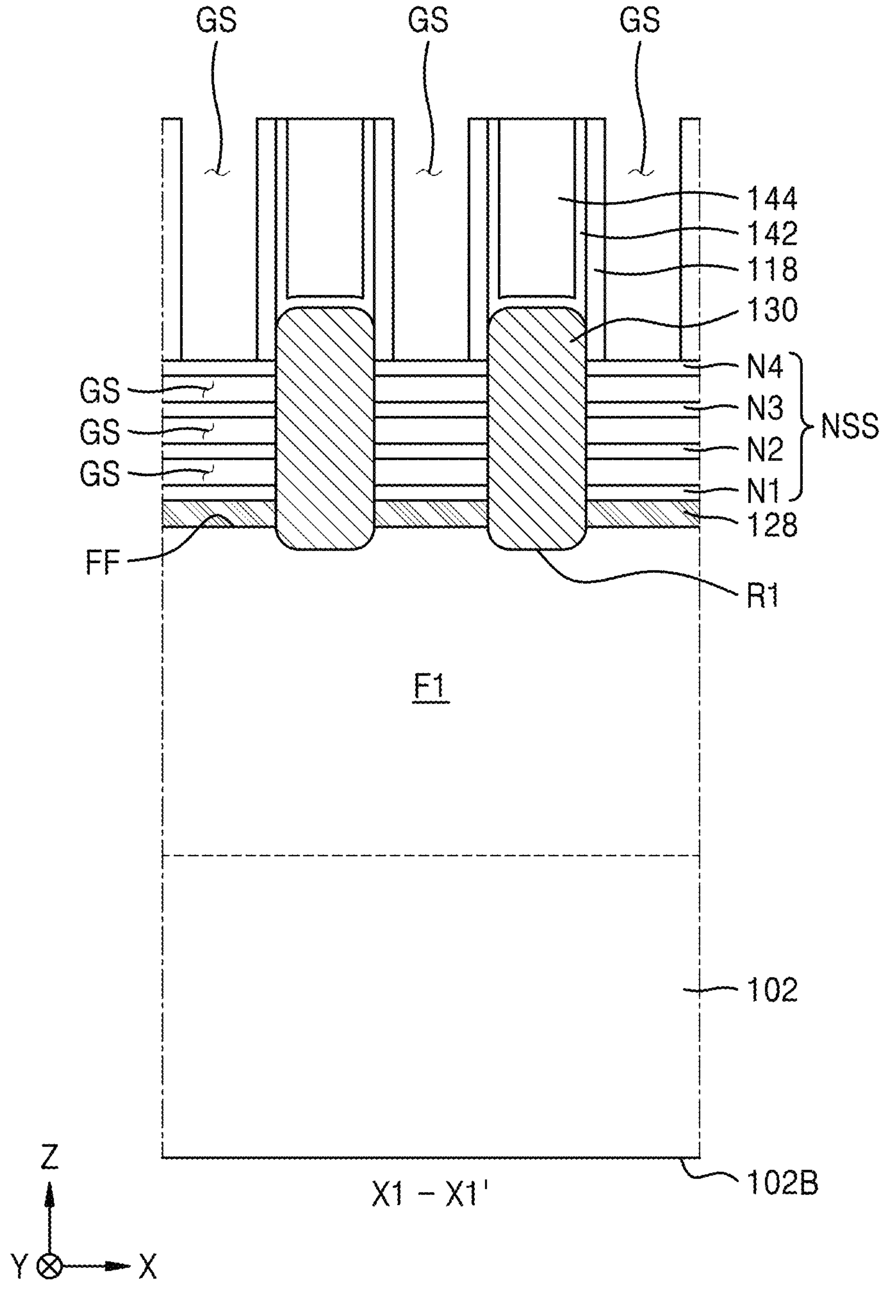
Figure 21B:
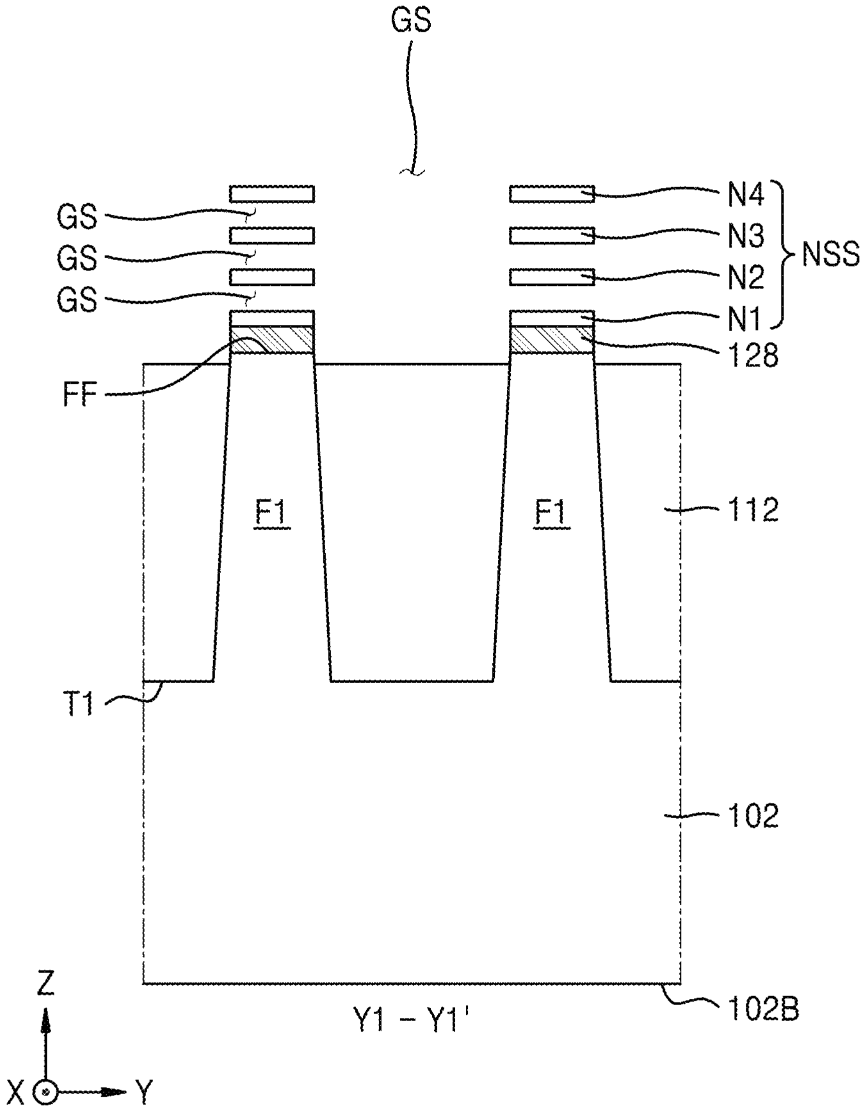

Referring to FIGS. 21A and 21B, the remaining portions of the plurality of sacrificial semiconductor layers 104 over the substrate 102 may be selectively removed from the resulting product of FIGS. 20A and 20B, thereby expanding the gate space GS up to each space between the first to fourth nanosheets N1, N2, N3, and N4 and a space between the first nanosheet N1 and the fin top surface FF of the fin-type active region F1.

In some example embodiments, to selectively remove the remaining portions of the plurality of sacrificial semiconductor layers 104, a difference in etch selectivity between each of the plurality of sacrificial semiconductor layers 104 and each of the first to fourth nanosheets N1, N2, N3, and N4, the bottom insulating structure 128, and the fin-type active region F1 may be used. To selectively remove the plurality of sacrificial semiconductor layers 104, a liquid-phase or gas-phase etchant may be used. In some example embodiments, to selectively remove the plurality of sacrificial semiconductor layers 104, a $CH_3COOH$-based etching solution, for example, an etching solution including a mixture of $CH_3COOH$, $HNO_3$, and HF, or an etching solution including a mixture of $CH_3COOH$, $H_2O_2$, and HF, may be used, but the inventive concepts are not limited thereto.

Figure 22A:
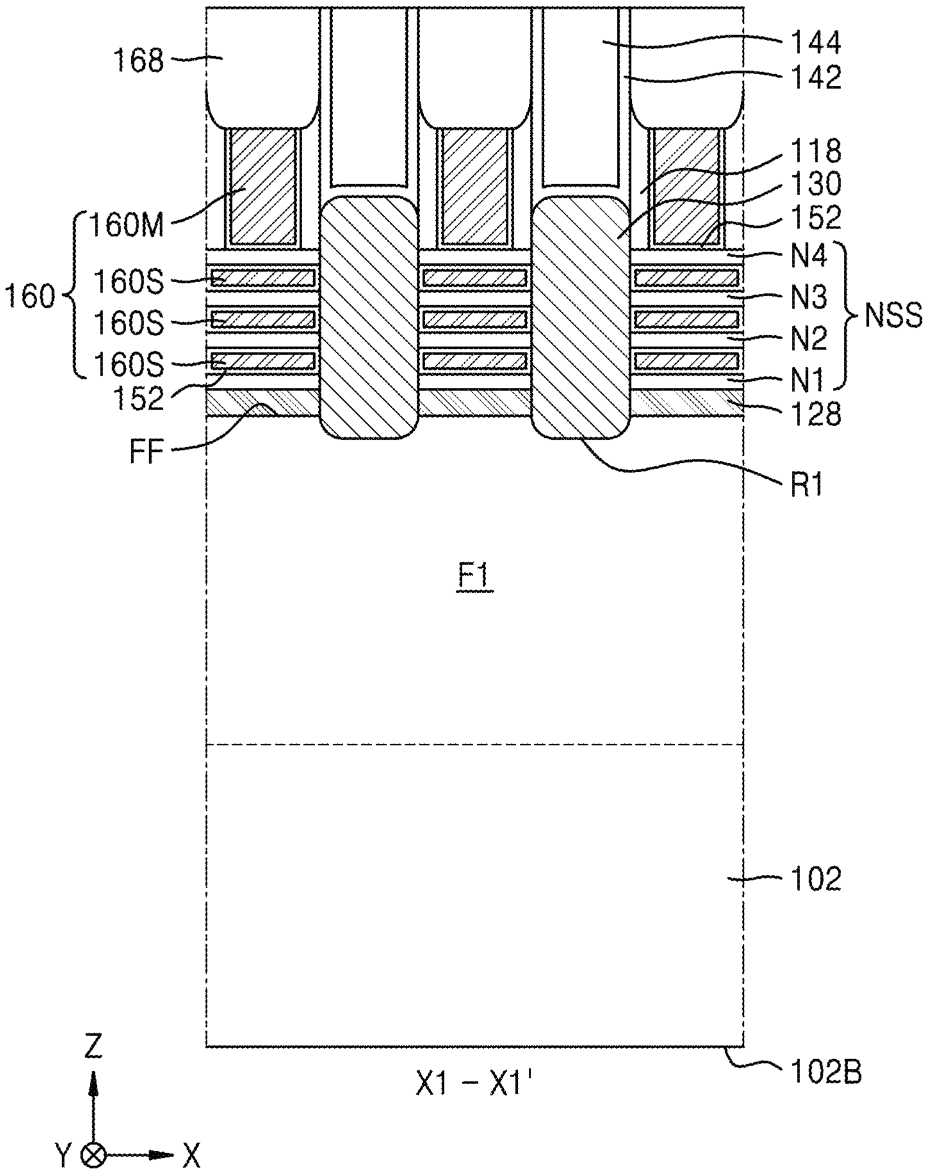
Figure 22B:
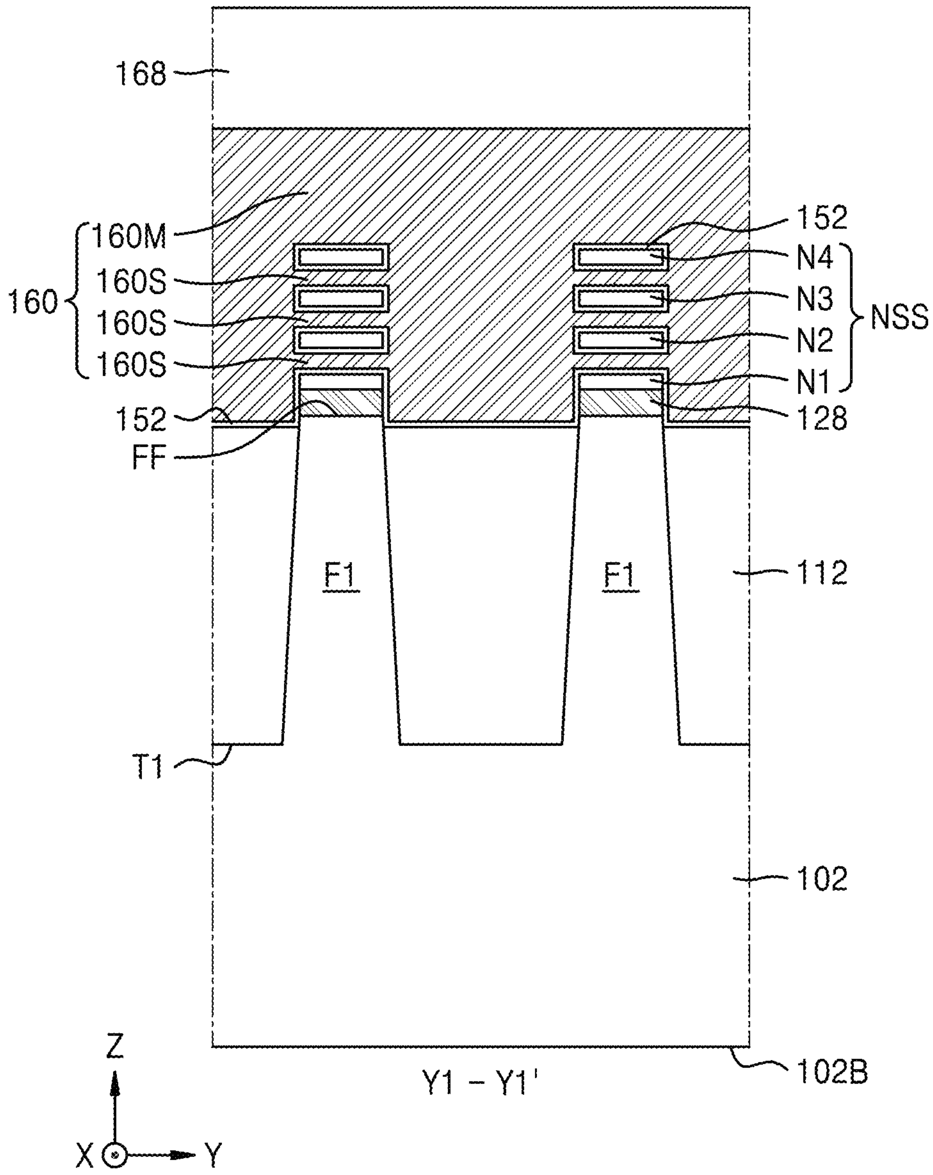

Referring to FIGS. 22A and 22B, in the resulting product of FIGS. 21A and 21B, the gate dielectric film 152 may be formed to cover respective exposed surfaces of the fin-type active region F1 and the first to fourth nanosheets N1, N2, N3, and N4. To form the gate dielectric film 152, an ALD process may be used.

Next, the gate line 160 may be formed on the gate dielectric film 152 to fill the gate space GS (see FIGS. 21A and 21B). The gate line 160 may be formed to be apart from the bottom insulating structure 128. Next, each of the gate line 160, the gate dielectric film 152, and the insulating spacer 118 may be partially removed from the upper surface thereof to reduce the height thereof, and the plurality of capping insulating patterns 168 may each be formed to cover the upper surface of each of the gate line 160, the gate dielectric film 152, and the insulating spacer 118.

Next, as shown in FIG. 3A, in the resulting product of FIGS. 22A and 22B, a plurality of source/drain contact holes may be formed between the plurality of gate lines 160 to expose the plurality of source/drain regions 130, respectively, followed by forming the metal silicide film 172 on the surface of each of the plurality of source/drain regions 130 through the plurality of source/drain contact holes, and then, the plurality of source/drain contacts CA may be formed on the metal silicide film 172 to fill the plurality of source/drain contact holes, respectively.

Next, upper insulating structures and upper wiring structures at least partially surrounded by the upper insulating structures may be formed on the respective upper surfaces of the source/drain contacts CA, the plurality of capping insulating patterns 168, and the inter-gate dielectric 144.

According to the method of manufacturing the integrated circuit device 100, which is described with reference to FIGS. 6A to 22B, a structure may be easily formed in which the lower surface of the first nanosheet N1 facing the backside of the integrated circuit device 100 is in contact with the bottom insulating structure 128, the first nanosheet N1 being closest to the backside of the integrated circuit device 100 from among the first to fourth nanosheets N1, N2, N3, and N4 constituting a horizontal nanosheet field-effect transistor. In the integrated circuit device 100 manufactured by such a method, a sub-gate portion is not formed on the lower surface of the first nanosheet N1, which faces the backside of the integrated circuit device 100, and thus, leakage current through the lower surface of the first nanosheet N1 and a structure therearound may be suppressed.

FIGS. 23 to 31 are diagrams respectively illustrating a sequence of processes of a method of manufacturing an integrated circuit device, according to an example embodiment. More specifically, FIGS. 23 to 25, 26A, 27, 28A, 29A, 30, and 31 are cross-sectional views each illustrating an example of a cross-sectional structure of a portion of the integrated circuit device, which corresponds to the cross-section taken along the line X1-X1' of FIG. 4, according to the sequence of processes. FIGS. 26B, 28B, and 29B are cross-sectional views each illustrating an example of a cross-sectional structure of a portion of the integrated circuit device, which corresponds to the cross-section taken along the line Y1-Y1' of FIG. 4, according to the sequence of processes. An example of a method of fabricating the integrated circuit device 200 described with reference to FIGS. 4, 5A, and 5B is described with reference to FIGS. 23 to 31. In FIGS. 23 to 31, the same reference numerals as in FIGS. 2 to 5B respectively denote the same members, and here, repeated descriptions thereof are omitted.

Figure 23:
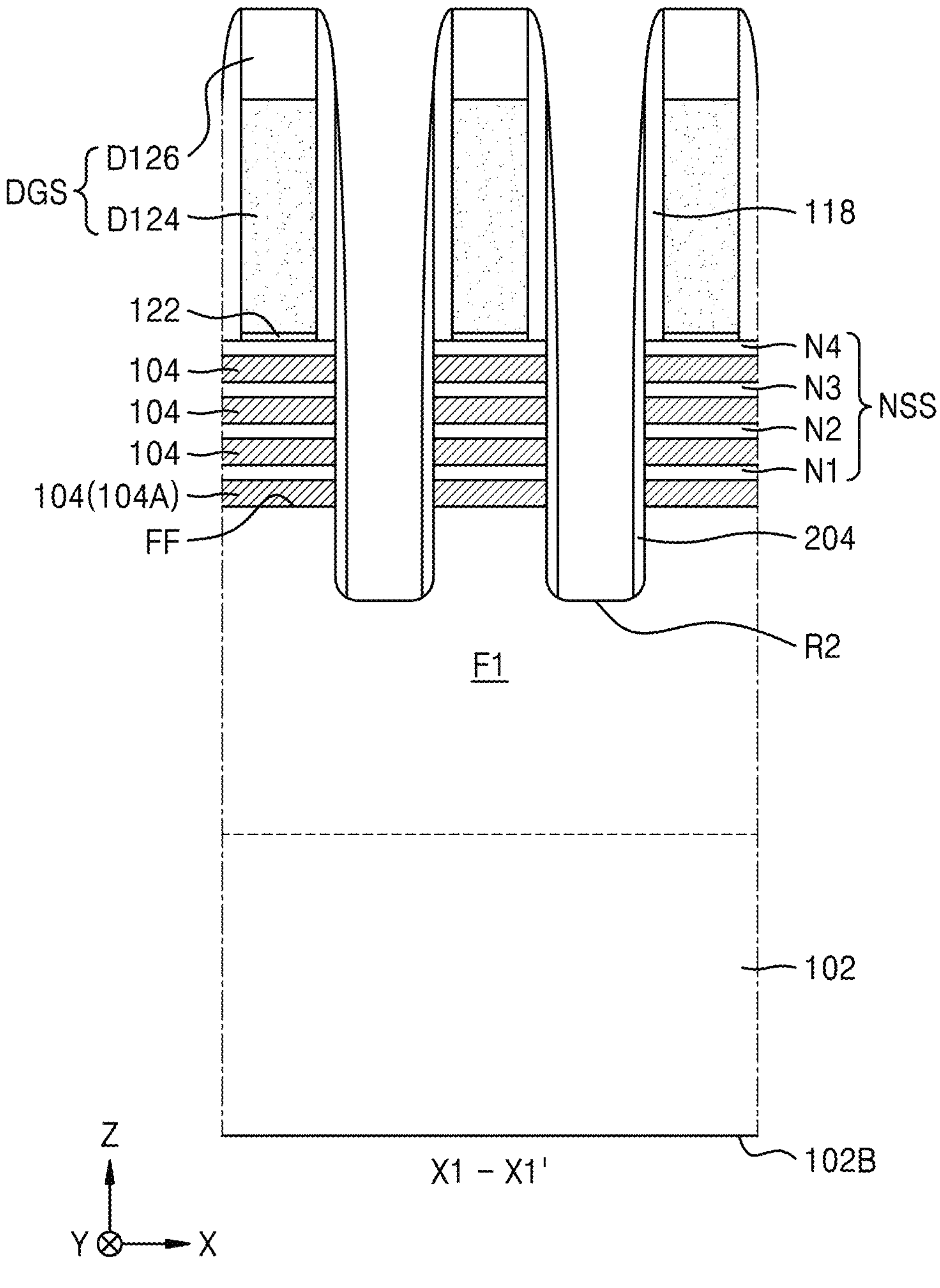

Referring to FIG. 23, the processes described with reference to FIGS. 6A to 14C may be performed. However, in the present example, a plurality of recesses R2 may be formed instead of the plurality of recesses R1. A vertical level of the lowermost surface of each of the plurality of recesses R2 may be closer to the backside surface 102B of the substrate 102 than the vertical level of the lowermost surface of each of the plurality of recesses R1 shown in FIG. 14A.

Next, in the resulting product of FIGS. 14A to 14C, a blocking insulating spacer 204 may be formed to cover the respective sidewalls of the plurality of sacrificial semiconductor layers 104 and the first to fourth nanosheets N1, N2, N3, and N4, which are exposed by the plurality of recesses R2. The blocking insulating spacer 204 may include a silicon oxide film, a silicon nitride film, or a combination thereof. In each of the plurality of recesses R2, the fin-type active region F1 may be exposed by the blocking insulating spacer 204.

Figure 24:
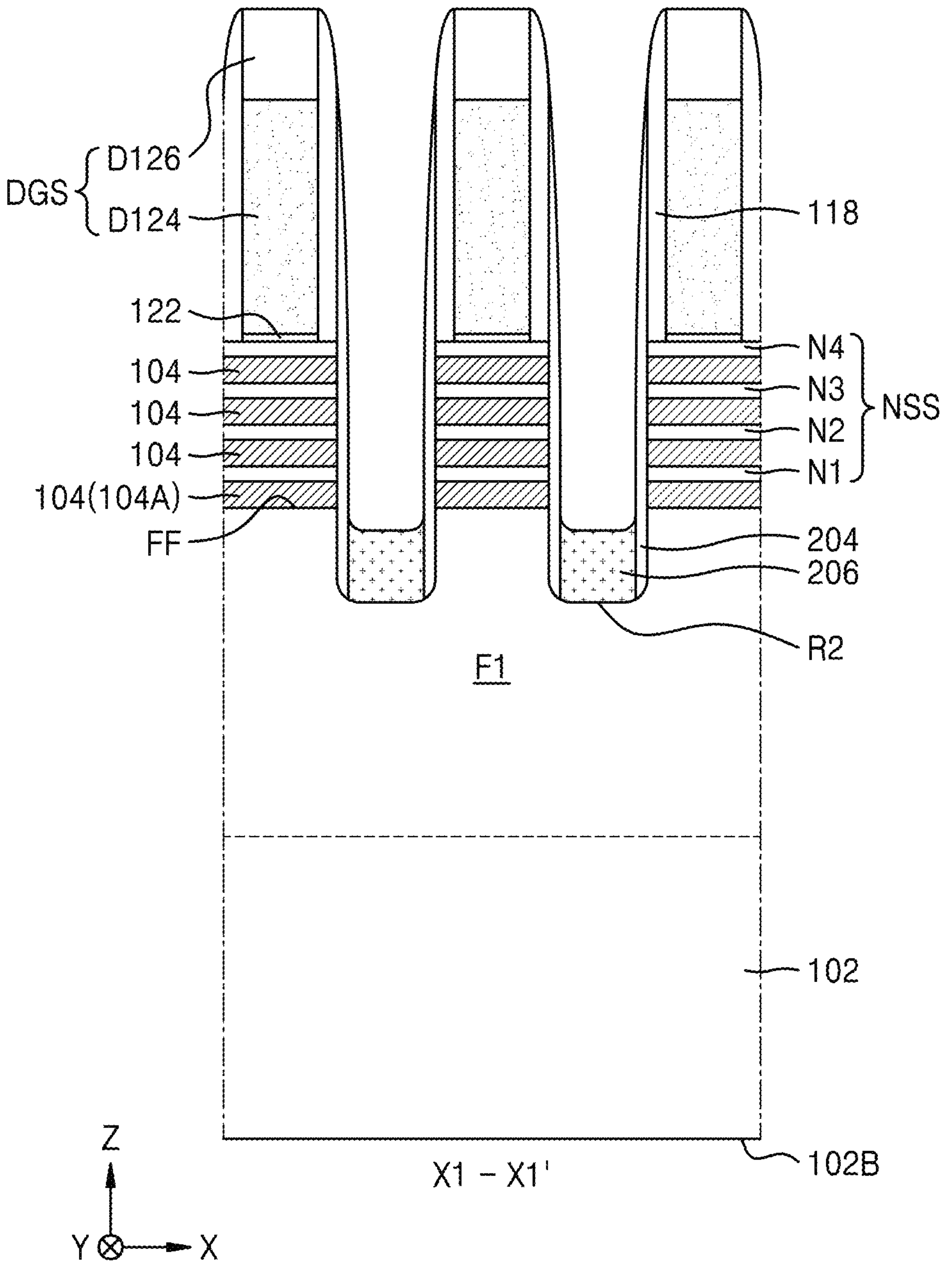

Referring to FIG. 24, a semiconductor material may be epitaxially grown on the surface of the fin-type active region F1, which is exposed in each of the plurality of recesses R2, thereby forming a stopper semiconductor layer 206 to cover the fin-type active region F1 and fill a lower portion of each of the plurality of recesses R2.

In some example embodiments, the stopper semiconductor layer 206 may include a SiGe layer. In some example embodiments, the stopper semiconductor layer 206 may include a SiGe layer having Ge content that is higher than the Ge content of the source/drain region 130 to be formed in each of the plurality of recesses R2 in a subsequent process. For example, the SiGe layer constituting the stopper semiconductor layer 206 may have a Ge content selected from a range of about 5 at % to about 50 at %, for example, about 10 at % to about 40 at %, but the inventive concepts are not limited thereto.

Figure 25:
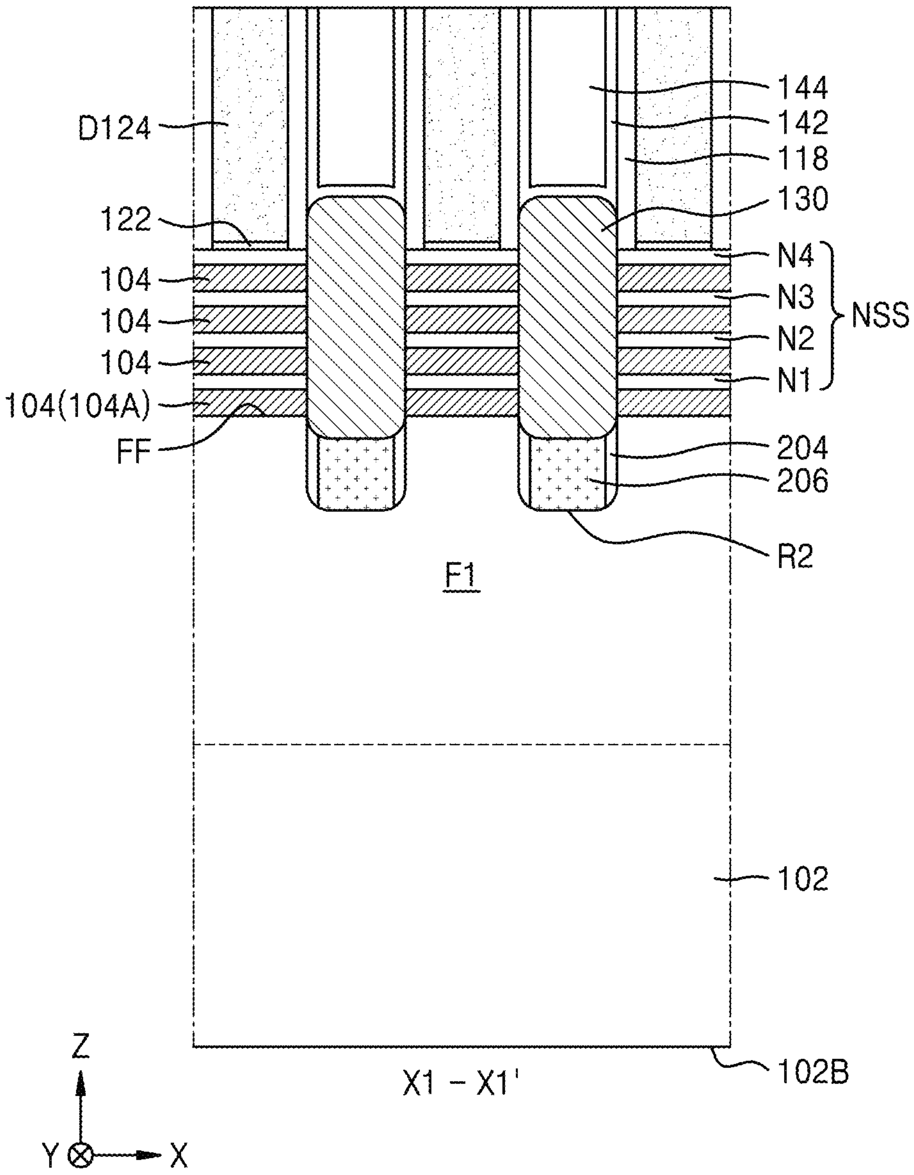

Referring to FIG. 25, the blocking insulating spacer 204 over the stopper semiconductor layer 206 may be removed from the resulting product of FIG. 24, thereby exposing the sidewall of each of the first to fourth nanosheets N1, N2, N3, and N4 and the sidewall of each of the plurality of sacrificial semiconductor layers 104 above the stopper semiconductor layer 206 by the plurality of recesses R2.

Next, similar to the description made with reference to FIGS. 15A to 15C, processes of forming the plurality of source/drain regions 130, the insulating liner 142, and the inter-gate dielectric 144 on or over the stopper semiconductor layer 206 to fill the plurality of recesses R2 and exposing the dummy gate layer D124 by removing the plurality of capping layers D126 may be performed.

Figure 26A:
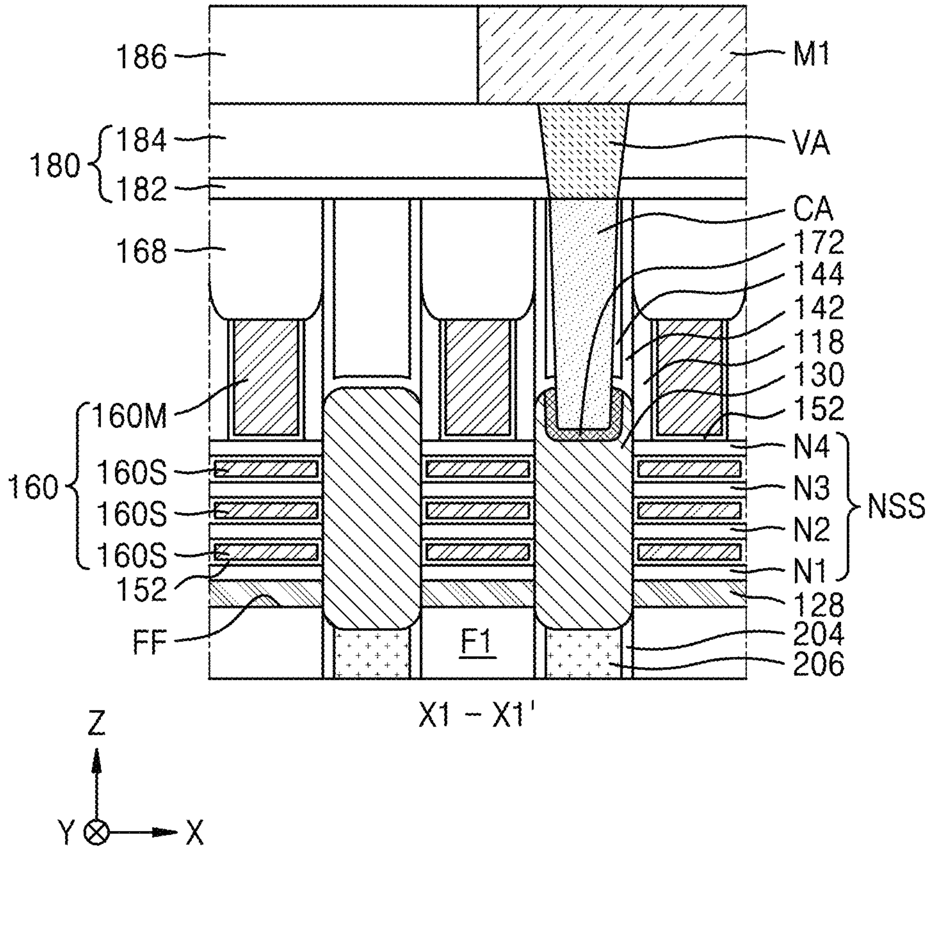
Figure 26B:
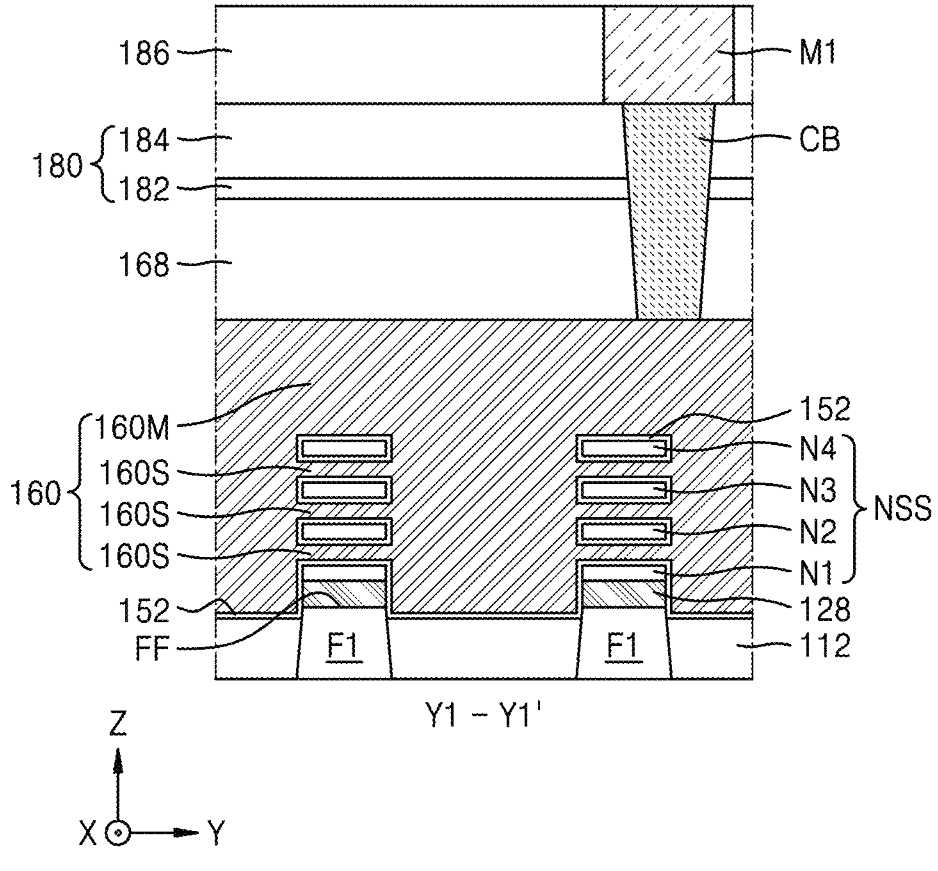
FIGS. 26B, 28B, and 29B are cross-sectional views each illustrating an example of a cross-sectional structure of a portion of the integrated circuit device, which corresponds to the cross-section taken along the line Y1-Y1' of FIG. 4, according to the sequence of processes.

Referring to FIGS. 26A and 26B, the processes described with reference to FIGS. 16A to 22B may be performed on the resulting product of FIG. 25, and a source/drain contact hole may be formed between the plurality of gate lines 160 to expose the source/drain region 130, as shown in FIGS. 5A and 5B. Next, the metal silicide film 172 may be formed on the surface of each source/drain region 130 through the source/drain contact hole, and the source/drain contact CA may be formed on the metal silicide film 172 to fill the source/drain contact hole.

Next, as shown in FIGS. 5A and 5B, the etch stop film 182 and the upper insulating film 184 may be formed in the stated order to cover the upper surface of each of the source/drain contact CA, the capping insulating pattern 168, and the inter-gate dielectric 144, thereby forming the upper insulating structure 180. Next, the source/drain via contact VA, which passes through the upper insulating structure 180 in the vertical direction (Z direction) to be connected to the source/drain contact CA, and the source/drain via contact CB, which passes through the upper insulating structure 180 and the capping insulating pattern 168 in the vertical direction (Z direction) to be connected to the gate line 160, may be formed. The source/drain via contact VA and the gate contact CB may be simultaneously formed or may be separately formed by separate processes from each other. Next, the interlayer dielectric 186, which covers the upper insulating structure 180, and the plurality of upper wiring layers M1, which pass through the interlayer dielectric 186, may be formed. The plurality of upper wiring layers M1 may include an upper wiring layer M1 connected to the source/drain via contact VA and an upper wiring layer M1 connected to the gate contact CB. Next, a frontside wiring structure (not shown) may be formed on the interlayer dielectric 186 and the plurality of upper wiring layers M1.

Next, the substrate 102 may be removed from the backside surface 102B of the substrate 102, followed by partially removing each of the device isolation film 112 and the plurality of fin-type active regions F1, which are exposed as a result, thereby exposing the stopper semiconductor layer 206. In the resulting product in which the stopper semiconductor layer 206 is exposed, the blocking insulating spacer 204 may be exposed and a portion of each of the device isolation film 112 and the plurality of fin-type active regions F1 may remain around the stopper semiconductor layer 206.

In some example embodiments, as described above, to remove the substrate 102 and partially remove each of the device isolation film 112 and the plurality of fin-type active regions F1, at least one process selected from a mechanical grinding process, a chemical mechanical polishing (CMP) process, a wet etching process, and a combination thereof may be used.

Figure 27:
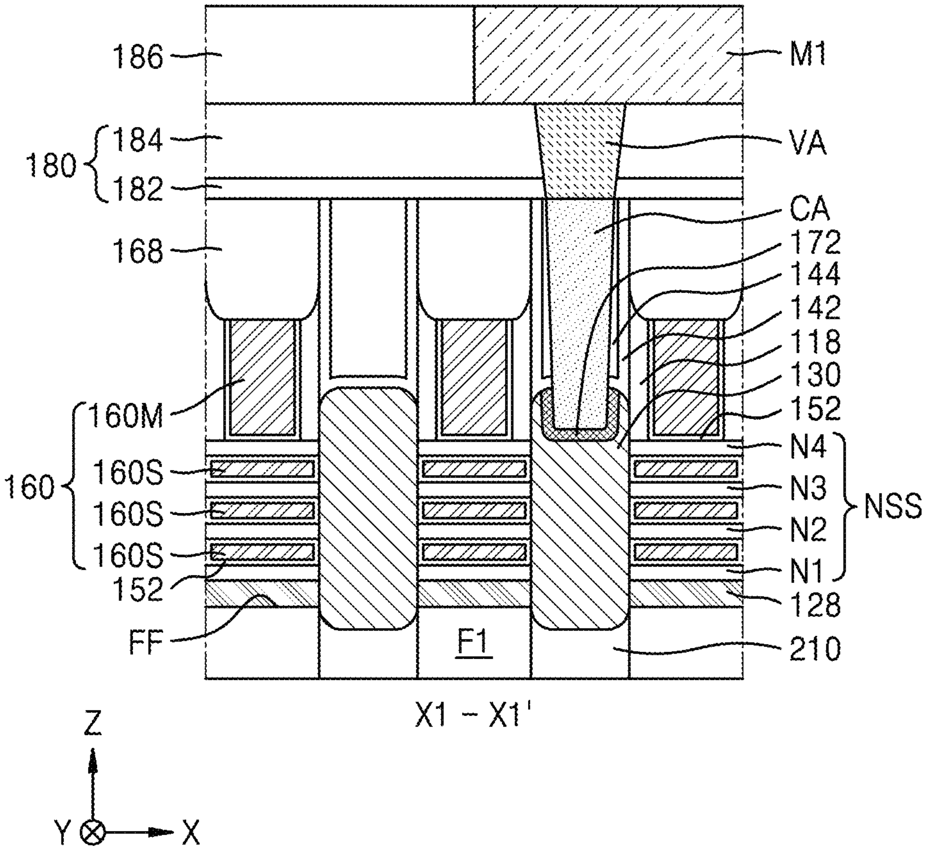

Referring to FIG. 27, a plurality of stopper semiconductor layers 206 and blocking insulating spacers 204 remaining in the resulting product of FIGS. 26A and 26B may be replaced with a plurality of stopper insulating layers 210, respectively. To this end, the plurality of stopper semiconductor layers 206 and blocking insulating spacers 204 may be removed, and spaces obtained as a result may be filled with the stopper insulating layer 210. The stopper insulating layer 210 may include, but is not limited to, an aluminum oxide film.

Figure 28A:
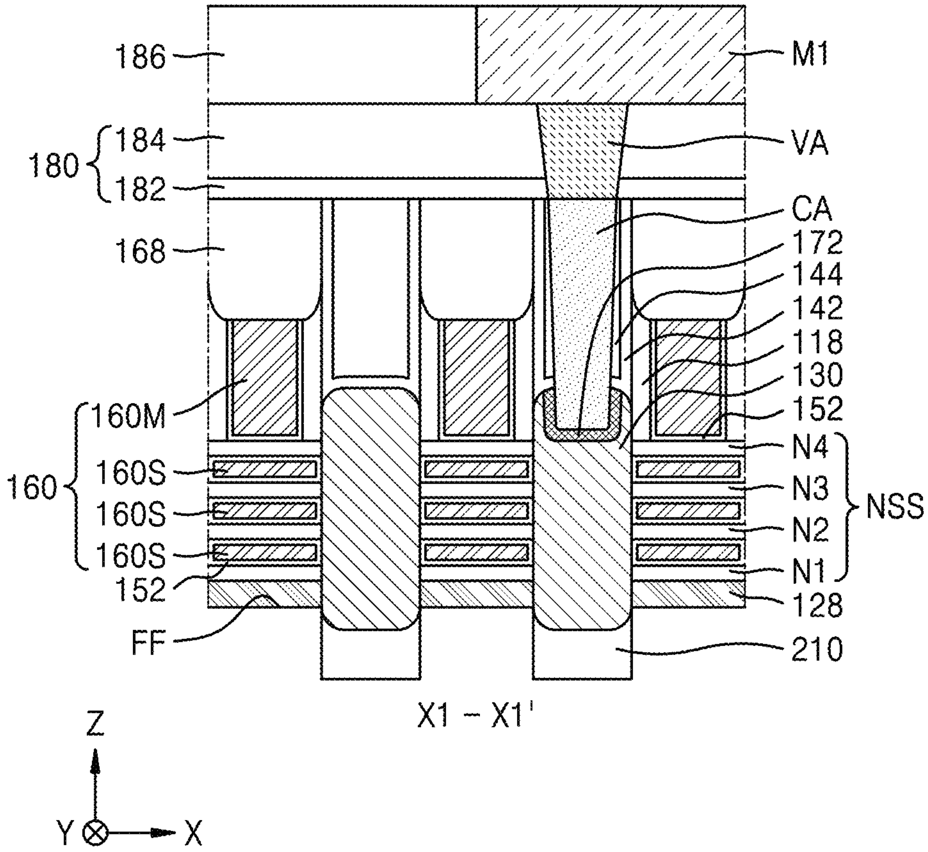
Figure 28B:
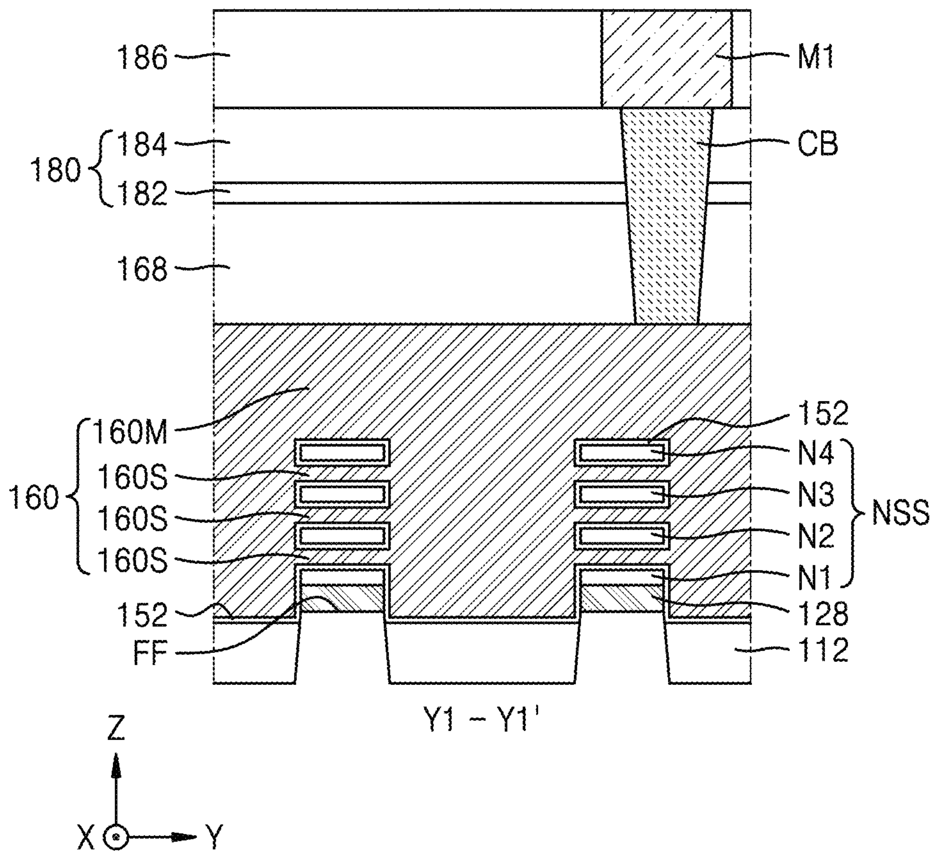

Referring to FIGS. 28A and 28B, the fin-type active region F1 may be removed from the resulting product of FIG. 27 by using the bottom insulating structure 128 as an etch stop film, thereby exposing the bottom insulating structure 128. Here, to remove the fin-type active region F1, an etching process using a difference in etch selectivity between the fin-type active region F1 and each of the bottom insulating structure 128, the stopper insulating layer 210, and the device isolation film 112 may be performed.

Figure 29A:
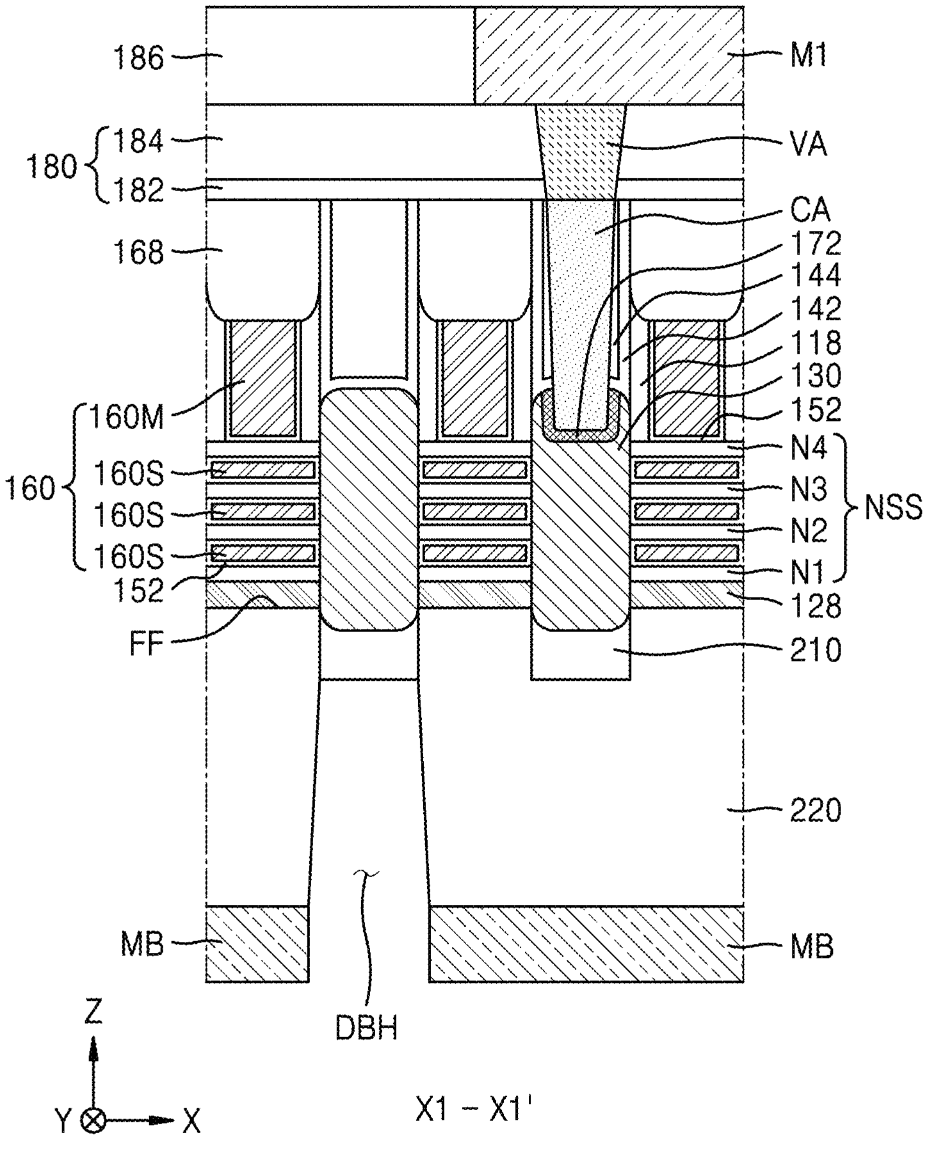
Figure 29B:
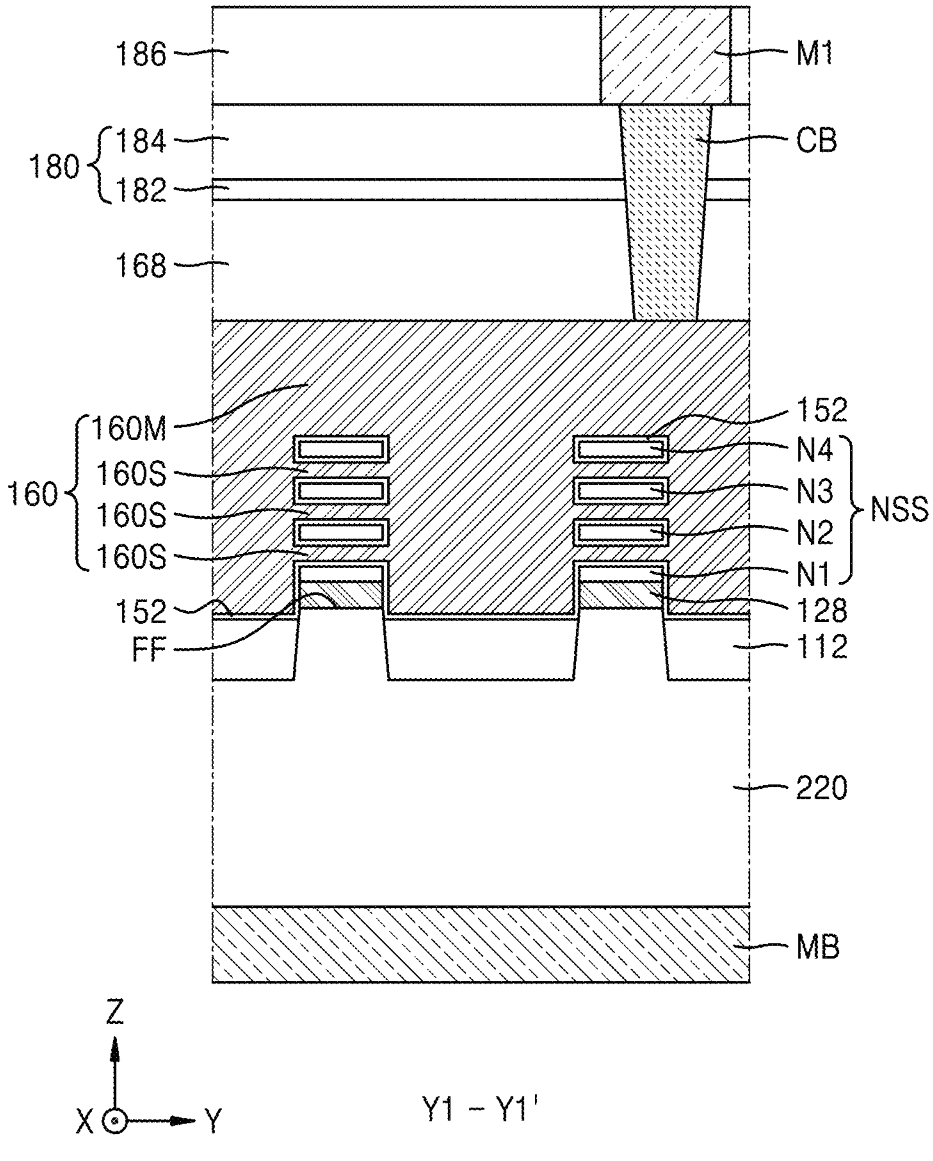

Referring to FIGS. 29A and 29B, in the resulting product of FIGS. 28A and 28B, the backside interlayer dielectric 220 may be formed to cover the respective exposed lower surfaces of the bottom insulating structure 128, the stopper insulating layer 210, and the device isolation film 112. Next, a mask pattern MB may be formed on the backside interlayer dielectric 220 to expose a portion of the backside interlayer dielectric 220, followed by etching the portion of the backside interlayer dielectric 220 by using the mask pattern MB as an etch mask, thereby forming a contact hole DBH to expose some stopper insulating layers 210 selected from the plurality of stopper insulating layers 210. The contact hole DBH may be arranged to vertically overlap one source/drain region 130 selected from the plurality of source/drain regions 130.

Figure 30:
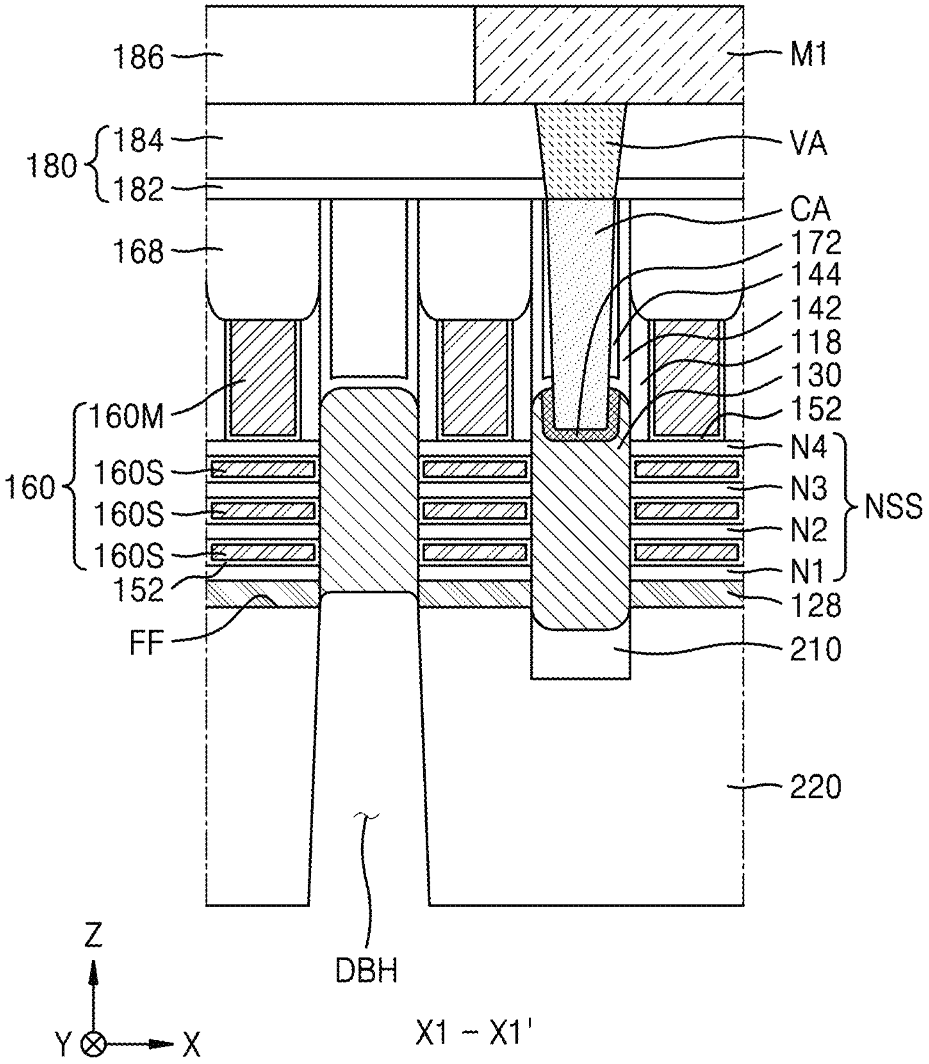

Referring to FIG. 30, the source/drain region 130 may be exposed by removing the stopper insulating layer 210, which is exposed by the contact hole DBH, from the resulting product of FIGS. 29A and 29B, and then, the mask pattern MB may be removed. The source/drain region 130 may be partially etched while the source/drain region 130 is exposed by removing the stopper insulating layer 210, and thus, the portion of the source/drain region 130, which is exposed by the contact hole DBH, may be reduced in length in the vertical direction (Z direction).

Figure 31:
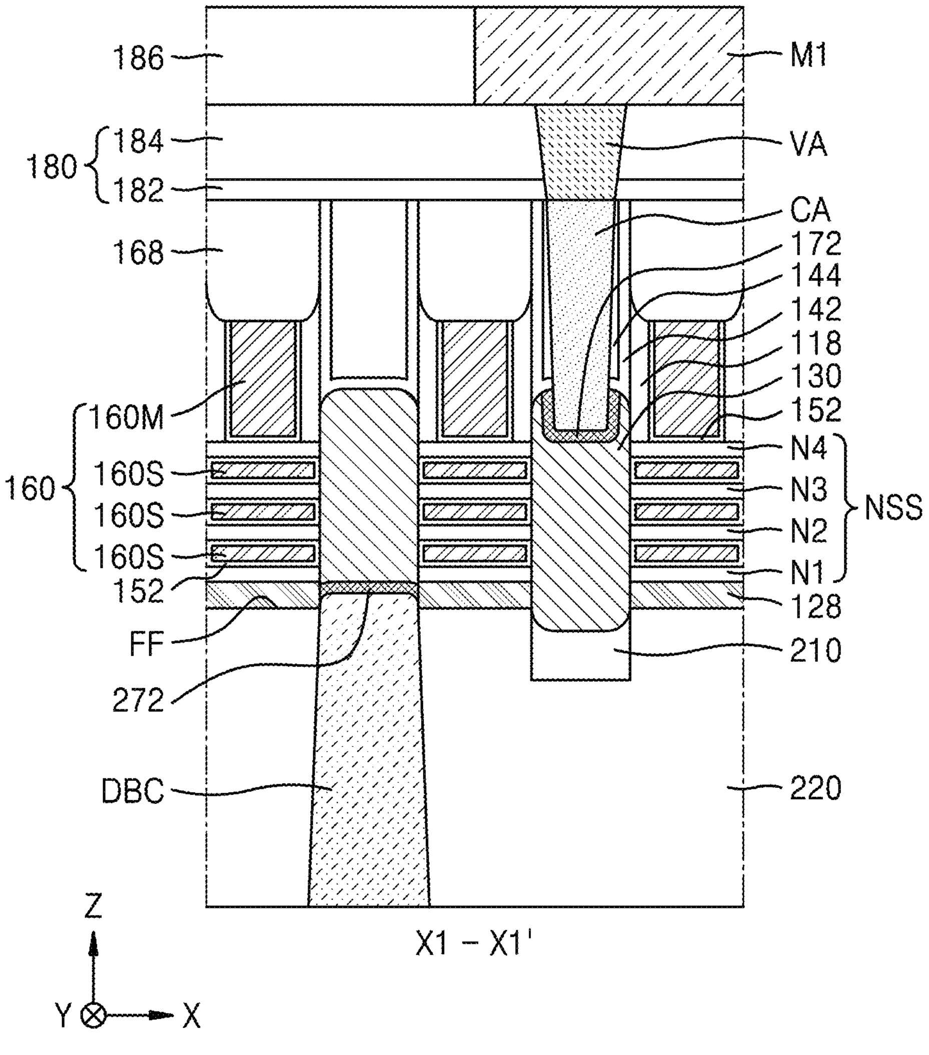

Referring to FIG. 31, the metal silicide film 272 may be formed on the surface of the source/drain region 130, which is exposed in the contact hole DBH of the resulting product of FIG. 30, and then, the backside source/drain contact DBC may be formed on the metal silicide film 272 to fill the contact hole DBH. Next, in the resulting product of FIG. 31, a backside wiring structure (not shown) may be formed to cover the backside source/drain contact DBC and the backside interlayer dielectric 220.

According to the method of manufacturing the integrated circuit device 200, which is described with reference to FIGS. 23 to 31, to secure a sufficient insulating distance between a plurality of wiring structures, when some wiring lines, for example, the plurality of backside source/drain contacts DBC, are arranged on the backside of the integrated circuit device 200, the manufacturing process of the integrated circuit device 200 includes a process of etching the fin-type active region F1 by using the bottom insulating structure 128 as an etch stop film while processes of forming the plurality of backside source/drain contacts DBC are performed, and thus, the backside source/drain contact DBC may be allowed to be easily aligned at an intended position even without applying a strict design rule. Therefore, according to the method of manufacturing the integrated circuit device 200, a stable and optimized wiring structure even in a reduced area due to down-scaling may be provided, and thus, the degree of integration and reliability of the integrated circuit device 200 may improve.

While the inventive concepts have been particularly shown and described with reference to some example embodiments thereof, it will be understood that various changes in form and details may be made therein without departing from the spirit and scope of the following claims.

What is claimed is:

1. A method of manufacturing an integrated circuit device, the method comprising:

forming a fin-type active region on a substrate;

forming, on the fin-type active region, a stack structure in which a plurality of sacrificial semiconductor layers and a plurality of nanosheet semiconductor layers are alternately stacked one-by-one;

forming a first local liner on a sidewall of the stack structure to cover a sidewall of a bottom sacrificial semiconductor layer, the bottom sacrificial semiconductor layer being a sacrificial semiconductor layer closest to the fin-type active region from among the plurality of sacrificial semiconductor layers, and expose sidewalls of other sacrificial semiconductor layers, the other sacrificial semiconductor layers being sacrificial semiconductor layers except for the bottom sacrificial semiconductor layer from among the plurality of sacrificial semiconductor layers;

forming a second local liner on the sidewall of the stack structure to cover sidewalls of the other sacrificial semiconductor layers;

exposing the bottom sacrificial semiconductor layer by removing the first local liner;

forming a bottom insulating space to expose a fin top surface of the fin-type active region by removing the bottom sacrificial semiconductor layer; and forming a bottom insulating structure to fill the bottom insulating space such that an outer sidewall of the bottom insulating structure is coplanar with a sidewall of the stack structure.

2. The method of claim 1, wherein the first local liner and the second local liner comprise different materials from each other.

3. The method of claim 1, wherein each of the plurality of sacrificial semiconductor layers comprises a SiGe layer, and respective Ge contents of the plurality of sacrificial semiconductor layers are equal to each other.

4. The method of claim 1, wherein a thickness of the second local liner is less than a thickness of the first local liner.

5. The method of claim 1, further comprising:

after the forming the second local liner and before the exposing the bottom sacrificial semiconductor layer, forming a plurality of recesses to expose the fin-type active region and forming a plurality of nanosheets from the plurality of nanosheet semiconductor layers, by removing a portion of each of the first local liner, the second local liner, and the stack structure, the plurality of nanosheets having widths defined by the plurality of recesses, respectively; and forming a plurality of source/drain regions in the plurality of recesses, respectively, wherein, in the exposing the bottom sacrificial semiconductor layer, a portion of the first local liner, which remains over the substrate after the plurality of source/drain regions are formed, is removed.

6. The method of claim 5, wherein, in the forming the bottom insulating structure, the bottom insulating structure is formed to contact at least one source/drain region selected from the plurality of source/drain regions.

7. The method of claim 1, further comprising:

after the forming the second local liner and before the exposing the bottom sacrificial semiconductor layer, forming a plurality of dummy gate structures on the second local liner to cover the stack structure;

forming a plurality of insulating spacers to cover both sidewalls of each of the plurality of dummy gate structures;

forming a plurality of recesses to expose the fin-type active region and forming a plurality of nanosheets from the plurality of nanosheet semiconductor layers, by removing a portion of each of the first local liner, the second local liner, and the stack structure by using the plurality of dummy gate structures and the plurality of insulating spacers as an etch mask, the plurality of nanosheets having widths defined by the plurality of recesses, respectively;

forming a plurality of source/drain regions in the plurality of recesses, respectively; and forming a plurality of gate spaces by removing the plurality of dummy gate structures from a structure in which the plurality of source/drain regions are formed, wherein, in the exposing the bottom sacrificial semiconductor layer, the bottom sacrificial semiconductor layer is exposed by the plurality of gate spaces.

8. The method of claim 7, further comprising:

after the forming the bottom insulating structure, expanding each of the plurality of gate spaces up to each space between the plurality of nanosheets by removing remaining portions of the plurality of sacrificial semiconductor layers over the substrate;

forming a gate dielectric film to cover an exposed surface of each of the plurality of nanosheets and an exposed surface of the bottom insulating structure; and forming a plurality of gate lines on the gate dielectric film to fill the plurality of gate spaces.

9. The method of claim 1, further comprising, after the forming the second local liner and before the exposing the bottom sacrificial semiconductor layer, forming a source/drain region on the fin-type active region, wherein, in the forming the bottom insulating structure, the bottom insulating structure is formed to contact the source/drain region.

10. The method of claim 1, further comprising:

after the forming the second local liner and before the exposing the bottom sacrificial semiconductor layer, forming a plurality of nanosheet stacks by removing a portion of each of the plurality of nanosheet semiconductor layers, each of the plurality of nanosheet stacks comprising a plurality of nanosheets; and, after the forming the bottom insulating structure, forming a gate dielectric film and a gate line to surround the plurality of nanosheet stacks, wherein the gate line is formed to be apart from the bottom insulating structure.

11. The method of claim 1, further comprising:

after the forming the second local liner and before the exposing the bottom sacrificial semiconductor layer, forming a plurality of recesses to expose the fin-type active region and forming a plurality of nanosheets from the plurality of nanosheet semiconductor layers, by removing a portion of each of the first local liner, the second local liner, and the stack structure, the plurality of nanosheets having widths defined by the plurality of recesses, respectively;

forming a plurality of source/drain regions by filling the plurality of recesses; and after the forming the bottom insulating structure, exposing the bottom insulating structure by removing the substrate from a backside surface of the substrate and by removing the fin-type active region by using the bottom insulating structure as an etch stop film;

forming a backside interlayer dielectric to cover a lower surface of each of the bottom insulating structure and the plurality of source/drain regions;

forming a contact hole to overlap one source/drain region selected from the plurality of source/drain regions in a vertical direction by removing a portion of the backside interlayer dielectric; and forming a backside source/drain contact in the contact hole.

12. A method of manufacturing an integrated circuit device, the method comprising:

forming a frontside structure comprising a substrate, a fin-type active region protruding from the substrate, a nanosheet stack comprising a plurality of nanosheets that are arranged over a fin top surface of the fin-type active region and apart from each other in a vertical direction, a bottom insulating structure between the fin top surface of the fin-type active region and the nanosheet stack, a source/drain region arranged on the fin-type active region and contacting the plurality of nanosheets and the bottom insulating structure, and a gate line surrounding the plurality of nanosheets;

removing the substrate from a backside surface of the substrate;

exposing the bottom insulating structure by removing the fin-type active region by using the bottom insulating structure as an etch stop film; and forming a backside structure on the bottom insulating structure, wherein the forming the frontside structure comprises forming, on the fin-type active region, a stack structure in which a plurality of sacrificial semiconductor layers and a plurality of nanosheet semiconductor layers are alternately stacked one-by-one, forming a first local liner on a sidewall of the stack structure to cover a sidewall of a bottom sacrificial semiconductor layer, the bottom sacrificial semiconductor layer being a sacrificial semiconductor layer closest to the fin-type active region, from among the plurality of sacrificial semiconductor layers, forming a second local liner on the sidewall of the stack structure to cover sidewalls of other sacrificial semiconductor layers, the other sacrificial semiconductor layers being sacrificial semiconductor layers except for the bottom sacrificial semiconductor layer from among the plurality of sacrificial semiconductor layers, exposing the bottom sacrificial semiconductor layer by removing the first local liner, and replacing the bottom sacrificial semiconductor layer with the bottom insulating structure.

13. The method of claim 12, wherein the replacing the bottom sacrificial semiconductor layer with the bottom insulating structure comprises:

forming a bottom insulating space to expose the fin top surface of the fin-type active region by removing the bottom sacrificial semiconductor layer;

forming a buried liner to fill the bottom insulating space and cover the second local liner; and exposing the sidewalls of the other sacrificial semiconductor layers and forming the bottom insulating structure from the buried liner to fill the bottom insulating space, by removing the second local liner and a portion of the buried liner.

14. The method of claim 13, wherein the first local liner and the second local liner comprise different materials from each other, and the second local liner and the buried liner comprise a same material.

15. The method of claim 12, wherein each of the plurality of sacrificial semiconductor layers comprises a SiGe layer, and respective Ge contents of the plurality of sacrificial semiconductor layers are equal to each other.

16. The method of claim 12, wherein the forming the frontside structure further comprises, after the forming the second local liner and before the exposing the bottom sacrificial semiconductor layer, forming the nanosheet stack, and forming the source/drain region, the forming the nanosheet stack comprises forming a plurality of recesses to expose the fin-type active region and forming the plurality of nanosheets from the plurality of nanosheet semiconductor layers, by removing a portion of each of the first local liner, the second local liner, and the stack structure, the plurality of nanosheets having widths defined by the plurality of recesses, respectively, in the forming the source/drain region, the source/drain region is formed in one recess selected from the plurality of recesses, and the exposing the bottom sacrificial semiconductor layer comprises removing a portion of the first local liner, which remains over the substrate after the source/drain region is formed.

17. The method of claim 12, wherein the forming the frontside structure further comprises:

after the forming the second local liner and before the exposing the bottom sacrificial semiconductor layer, forming a plurality of dummy gate structures on the second local liner to cover the stack structure;

forming a plurality of insulating spacers to cover both sidewalls of each of the plurality of dummy gate structures;

forming a plurality of recesses to expose the fin-type active region and forming the plurality of nanosheets from the plurality of nanosheet semiconductor layers, by removing a portion of each of the first local liner, the second local liner, and the stack structure by using the plurality of dummy gate structures and the plurality of insulating spacers as an etch mask, the plurality of nanosheets having widths defined by the plurality of recesses, respectively;

forming the source/drain region in one recess selected from the plurality of recesses; and forming a plurality of gate spaces by removing the plurality of dummy gate structures from a resulting product of the forming the source/drain region, and wherein, in the exposing the bottom sacrificial semiconductor layer, the bottom sacrificial semiconductor layer is exposed by the plurality of gate spaces.

18. The method of claim 12, wherein the forming the backside structure comprises:

forming a backside interlayer dielectric to cover a lower surface of each of the bottom insulating structure and the source/drain region;

forming a contact hole to overlap the source/drain region in the vertical direction by removing a portion of the backside interlayer dielectric; and forming a backside source/drain contact in the contact hole.

19. A method of manufacturing an integrated circuit device, the method comprising:

alternately stacking a plurality of sacrificial semiconductor layers and a plurality of nanosheet semiconductor layers one-by-one on a substrate, each of the plurality of sacrificial semiconductor layers comprising a SiGe layer having a same Ge content, and each of the plurality of nanosheet semiconductor layers comprising a Si layer;

forming a stack structure and a fin-type active region, which has a fin top surface covered by the stack structure, by partially etching each of the plurality of sacrificial semiconductor layers, the plurality of nanosheet semiconductor layers, and the substrate, the stack structure comprising a portion of each of the plurality of sacrificial semiconductor layers and the plurality of nanosheet semiconductor layers;

forming a device isolation film to cover sidewalls of the fin-type active region;

forming a first local liner on a sidewall of the stack structure to cover a sidewall of a bottom sacrificial semiconductor layer, the bottom sacrificial semiconductor layer being a sacrificial semiconductor layer closest to the fin-type active region, from among the plurality of sacrificial semiconductor layers, and expose sidewalls of other sacrificial semiconductor layers, the other sacrificial semiconductor layers being sacrificial semiconductor layers except for the bottom sacrificial semiconductor layer, from among the plurality of sacrificial semiconductor layers;

forming a second local liner on the sidewall of the stack structure to cover the sidewalls of the other sacrificial semiconductor layers;

exposing the bottom sacrificial semiconductor layer by removing the first local liner;

forming a bottom insulating space to expose the fin top surface of the fin-type active region by removing the bottom sacrificial semiconductor layer; and forming a bottom insulating structure to fill the bottom insulating space such that an outer sidewall of the bottom insulating structure is coplanar with a sidewall of the stack structure.

20. The method of claim 19, wherein the first local liner comprises a first insulating film comprising nitrogen atoms, and the second local liner comprises a second insulating film comprising no nitrogen atoms.

* * * * *